United States Patent
Liaw

(10) Patent No.: US 11,723,193 B2
(45) Date of Patent: Aug. 8, 2023

(54) MEMORY DEVICES AND METHODS OF MANUFACTURING THEREOF

(71) Applicant: Taiwan Semiconductor Manufacturing Company Limited, Hsinchu (TW)

(72) Inventor: Jhon-Jhy Liaw, Zhudong Township (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 272 days.

(21) Appl. No.: 16/916,905

(22) Filed: Jun. 30, 2020

(65) Prior Publication Data

US 2021/0408014 A1     Dec. 30, 2021

(51) Int. Cl.
| | |
|---|---|
| *H01L 27/11* | (2006.01) |
| *H10B 20/20* | (2023.01) |
| *H01L 29/78* | (2006.01) |
| *H01L 29/06* | (2006.01) |
| *H01L 29/66* | (2006.01) |
| *H01L 29/08* | (2006.01) |

(52) U.S. Cl.
CPC ......... *H10B 20/20* (2023.02); *H01L 29/0673* (2013.01); *H01L 29/0847* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 10,950,609 B2* | 3/2021 | Yang | H01L 29/7851 |
| 2016/0247876 A1* | 8/2016 | Chung | H01L 21/823412 |
| 2019/0067284 A1* | 2/2019 | Ching | H01L 29/66545 |
| 2021/0098302 A1* | 4/2021 | Ju | H01L 21/823431 |
| 2021/0234018 A1* | 7/2021 | Xie | H01L 29/66553 |
| 2021/0249307 A1* | 8/2021 | Gu | H01L 21/823431 |
| 2021/0375686 A1* | 12/2021 | Kao | H01L 27/0924 |

* cited by examiner

*Primary Examiner* — Ali Naraghi
(74) *Attorney, Agent, or Firm* — Foley & Lardner LLP

(57) ABSTRACT

A memory device includes a first transistor formed in a first region of a substrate. The first transistor includes a structure protruding from the substrate, and a first source/drain (S/D) structure coupled to a first end of the protruding structure. The memory device includes a second transistor formed in a second region of the substrate. The second transistor includes a number of first semiconductor layers that are vertically spaced apart from one another, a second S/D structure coupled to a first end of the first semiconductor layers; and a third S/D structure coupled to a second end of the first semiconductor layers. The first region and the second region are laterally separated from each other by an isolation structure.

20 Claims, 36 Drawing Sheets

MEMORY DEVICES AND METHODS OF MANUFACTURING THEREOF

BACKGROUND

This disclosure relates generally to a semiconductor device, and in some embodiments, to a memory device including one non-gate-all-around (GAA) transistor and one or more GAA transistors.

Integrated circuits (ICs) sometimes include one-time-programmable (OTP) memories to provide non-volatile memory (NVM) in which data are not lost when the IC is powered off. One type of the OTP devices includes anti-fuse memories. The anti-fuse memories include a number of anti-fuse memory cells (or bit cells), whose terminals are disconnected before programming, and are shorted (e.g., connected) after the programming. The anti-fuse memories may be based on metal-oxide-semiconductor (MOS) technology. For example, an anti-fuse memory cell may include a programming MOS transistor (or MOS capacitor) and at least one reading MOS transistor. A gate dielectric of the programming MOS transistor may be broken down to cause the gate and the source or drain region of the programming MOS transistor to be interconnected. Depending on whether the gate dielectric of the programming MOS transistor is broken down, different data bits can be presented by the anti-fuse memory cell through reading a resultant current flowing through the programming MOS transistor and reading MOS transistor. The anti-fuse memories have the advantageous features of reverse-engineering proofing, since the programming states of the anti-fuse cells cannot be determined through reverse engineering.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
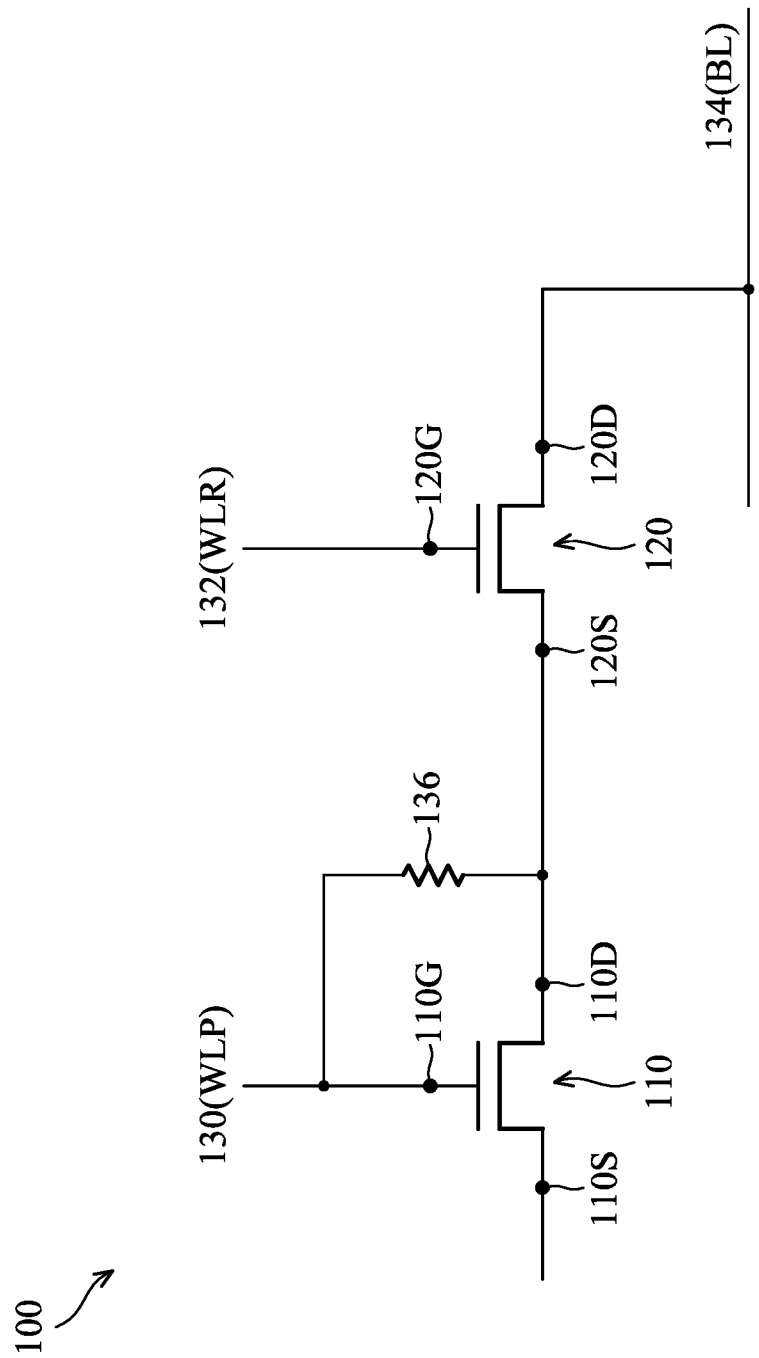
FIG. 1 illustrates an example circuit diagram of a memory cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as fin-based transistors (typically referred to as "FinFETs"), can provide increased device density and increased performance over planar transistors. Some advanced non-planar transistor device architectures, such as nanosheet (or nanowire) transistors, can further increase the performance over the FinFETs. When compared to the FinFET where the channel is partially wrapped (e.g., straddled) by a gate structure, the nanosheet transistor, in general, includes a gate structure that wraps around the full perimeter of one or more nanosheets for improved control of channel current flow. For example, in a FinFET and a nanosheet transistor with similar dimensions, the nanosheet transistor can present larger driving current ($I_{on}$), smaller subthreshold leakage current ($I_{off}$), etc. The transistor that has a gate structure fully wrapping around its channel is typically referred to as a gate-all-around (GAA) transistor; and the transistor that has a gate structure partially wrapping around or overlaying its channel, which includes the FinFET and planar transistor, is typically referred to as a non-gate-all-around (non-GAA) transistor.

Given the relative performance of nanosheet transistors as compared to FinFETs, some existing memory devices have configured the corresponding memory cells in the nanosheet transistor configuration. For example, an anti-fuse memory cell may include a programming transistor and a reading transistor, each of which is configured as a GAA transistor. However, as the GAA transistor generally has multiple distinct nanostructures (e.g., nanosheets, nanowires), when programming the anti-fuse memory cell, there may be only a portion of the gate dielectric (e.g., coupling to one of the nanosheets) is broken down, which can disadvantageously cause the anti-fuse memory cell to have a high resistance and/or a wide variation of the breakdown voltage (VBD). Thus, existing memory cells that have adopted the GAA configuration have not been entirely satisfactory.

The present disclosure provides various embodiments of a memory cell. In some embodiments, the disclosed memory cell includes an anti-fuse memory cell that includes a programming transistor and one or more reading transistors. The programming transistor is configured as a non-GAA transistor (e.g., a FinFET, a planar transistor), and the one or more reading transistors are each configured as a GAA transistor. The non-GAA transistor and the one or more GAA transistors are separated from each other over a substrate by at least one isolation structure (e.g., a shallow trench isolation (STI)). In other words, the non-GAA transistor may be formed in a first active region of the substrate, and the GAA transistor(s) may be formed in a second active region, wherein the first and second active regions are separated (e.g., electrically isolated) from each other by an STI. By configuring the programming transistor as a non-GAA transistor and each of the reading transistor(s) as a GAA transistor, the memory cell, as disclosed herein, can have a more controllable breakdown voltage (e.g., a narrower variation of the breakdown voltage), while maintaining the performance of the GAA transistor after the memory cell is programmed.

FIG. 1 illustrates an example circuit diagram of a memory cell 100, in accordance with some embodiments. As shown, the memory cell (or sometimes referred to as a memory bit cell, a memory bit, or a bit) 100 includes a first transistor 110 and a second transistor 120. Each of the first and second transistors, 110 and 120, may include an n-type metal-oxide-semiconductor field-effect-transistor (MOSFET). The transistors 110 and 120 may each include another type of the MOSFET, e.g., a p-type MOSFET. In some other embodiments, at least one of the transistor 110 or 120 may be replaced by another type of electronic devices, e.g., a MOS capacitor, while remaining within the scope of the present disclosure. The first transistor 110 and the second transistor 120 are electrically coupled to each other in series. For example, drain of the first transistor, 110D, is connected to source of the second transistor, 120S.

The memory cell 100 may be configured as an one-time-programmable (OTP) memory cell such as, for example, an anti-fuse cell. It is understood that the memory cell 100 may be configured as any type of the memory cell that includes two transistors electrically coupled to each other in series (e.g., a NOR-type non-volatile memory cell, a dynamic random-access memory (DRAM) cell, a two-transistor static random-access memory (SRAM) cell, etc.).

When the memory cell 100 is configured as an anti-fuse cell, the first transistor 110 can function as a programming transistor and the second transistor 120 can function as a reading transistor. As such, source of the first transistor 110S is floating (e.g., coupled to nothing), and gate of the first transistor 110G is coupled to a programming word line (WLP) 130; and gate of the second transistor 120G is coupled to a reading word line (WLR) 132, and drain of the second transistor 120D is coupled to a bit line (BL) 134.

To program the memory cell 100, the reading transistor 120 is turned on by supplying a voltage (e.g., a positive voltage corresponding to a logic high state) to the gate 120G via the WLR 132. Prior to, concurrently with or subsequently to the reading transistor 120 being turned on, a sufficiently high voltage (e.g., a breakdown voltage (VBD)) is applied to the WLP 130, and a low voltage (e.g., a positive voltage corresponding to a logic low state) is applied to the BL 134. The low voltage (applied on the BL 134) can be passed to the source 110D such that VBD will be created across the drain 110D and the gate 110G to cause a breakdown of a portion of a gate dielectric (e.g., the portion between the drain 110D and the gate 110G) of the programming transistor 110. After the gate dielectric of the programming transistor 110 is broken down, a behavior of the portion interconnecting the gate 110G and drain 110D is equivalently resistive. For example, such a portion may function as a resistor 136, as symbolically shown in FIG. 1. Before the programming (before the gate dielectric of the programming transistor 110 is broken down), when the reading transistor 120 is turned on, no conduction path exists between the BL 134 and the WLP 130; and after the programming, when the reading transistor 120 is turned on, a conduction path exists between the BL 134 and the WLP 130 (e.g., via the resistor 136).

To read the memory cell 100, similarly to the programming operation, the reading transistor 120 is turned on and the BL 134 is coupled to a voltage corresponding to the logic low state. In response, a positive voltage is applied to the gate of the programming transistor 110G. As discussed above, if the gate dielectric of the programming transistor 110 is not broken down, no conduction path exists between the BL 134 and the WLP 130. Thus, a relatively low current conducts from the WLP 130, through the transistors 110 and 120, and to the BL 134. If the gate dielectric of the programming transistor 110 is broken down, a conduction path exists between the BL 134 and the WLP 130. Thus, a relatively high current conducts from the WLP 130, through the transistor 110 (now equivalent to the resistor 136) and transistor 120, and to the BL 134. Such a low current and high current may sometimes be referred to as $I_{off}$ and $I_{on}$ of the memory cell 110, respectively. A circuit component (e.g., a sensing amplifier), coupled to the BL 134 can differentiate $I_{off}$ from $I_{on}$ (or vice versa), and thus determine whether the memory cell 100 presents a logic high ("1") or a logic low ("0"). For example, when $I_{on}$ is read, the memory cell 100 may present 1; and when $I_{off}$ is read, the memory cell 100 may present 0.

Figure 2:
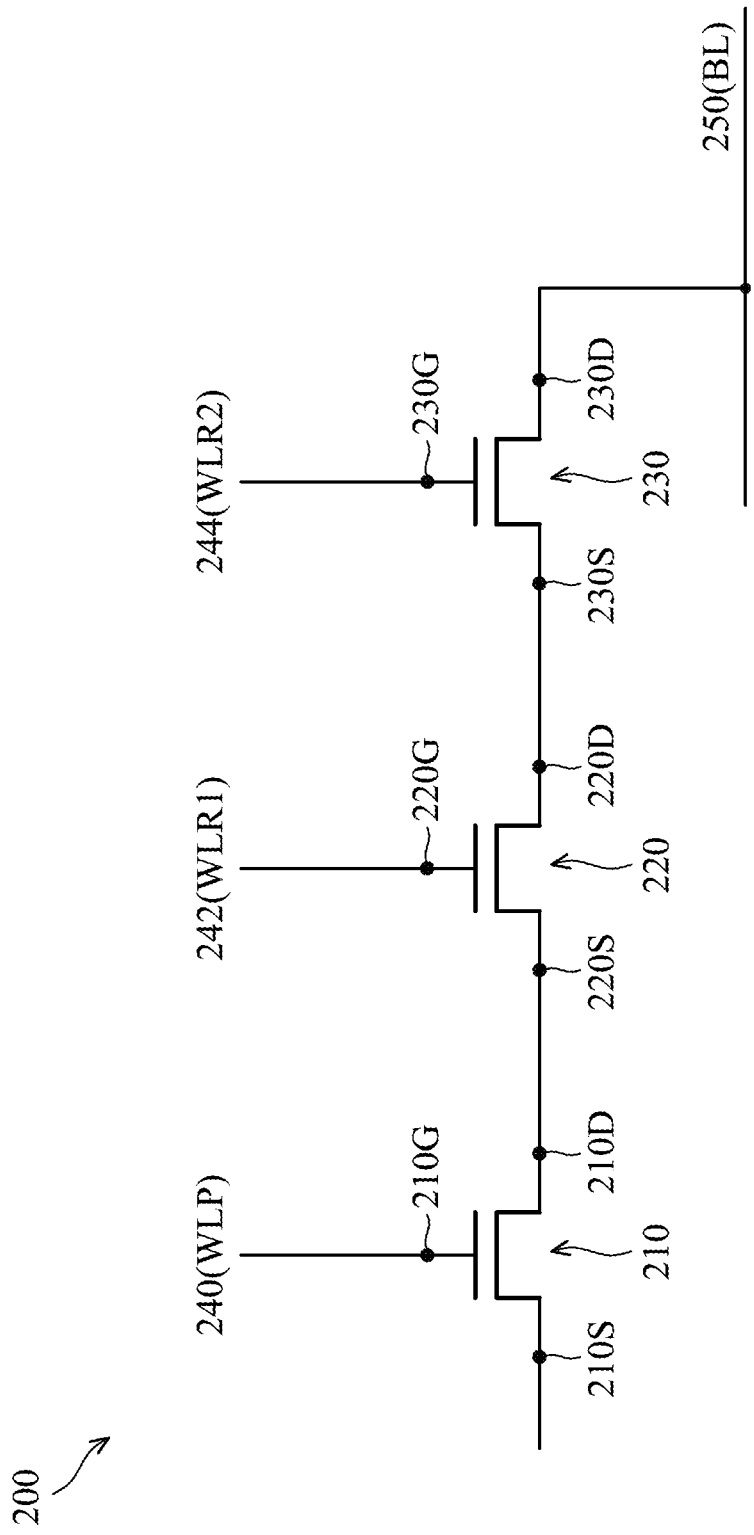
FIG. 2 illustrates an example circuit diagram of another memory cell, in accordance with some embodiments.

FIG. 2 illustrates an example circuit diagram of another memory cell 200, in accordance with some embodiments. The memory cell 200 is similar as the memory cell 100 of FIG. 1, except that the memory cell 200 includes an additional reading transistor. As shown, the memory cell 200 includes a first transistor 210, a second transistor 220, and a third transistor 230. Each of the first, second, and third transistors, 210-230, may include an n-type MOSFET. In some other embodiments, each of the transistors 210-230 may include a p-type MOSFET while remaining within the scope of the present disclosure. The first transistor 210, the second transistor 220, and the third transistor 230 are electrically coupled to each other in series. For example, drain of the first transistor, 210D, is connected to source of the second transistor, 220S, and drain of the second transistor, 220D, is connected to source of the third transistor, 230S. The memory cell 200 may function as an anti-fuse cell (as discussed above), where the first transistor 210 functions as a programming transistor of the anti-fuse cell and the second and third transistors, 220 and 230, collectively function as reading transistors of the anti-fuse cell. Similarly to the memory cell 100, gate of the programming transistor 210G is coupled to a WLP 240, the gates of the reading transistors, 220G and 230G, are respectively coupled to a WLR1 242 and WLR2 244, and drain of the reading transistor 230D is coupled to a BL 250. Operations of the memory cell 200 is substantially similar to the operations of the memory cell 100, and thus, the discussion will not be repeated.

Figure 3:
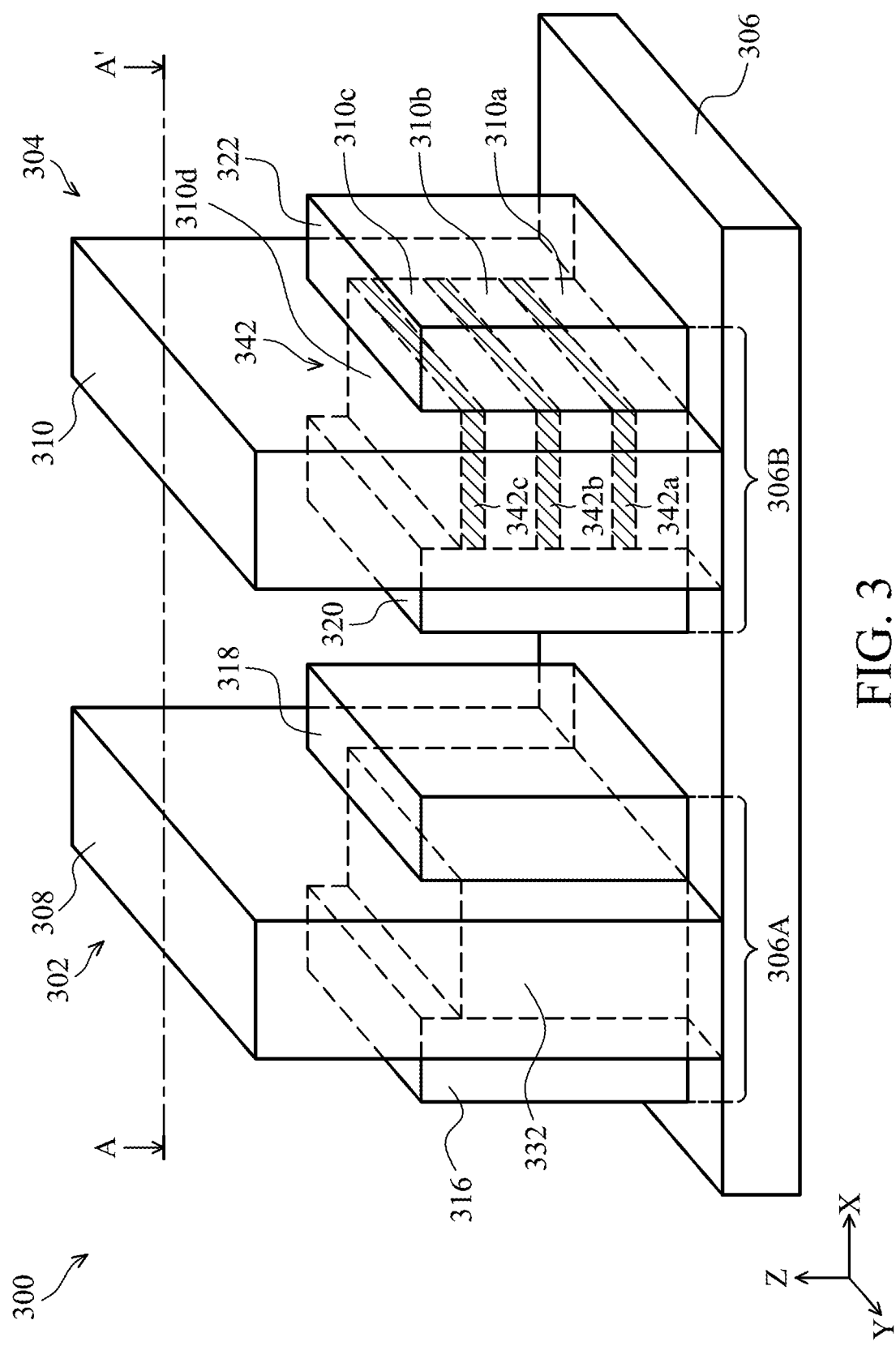
FIG. 3 illustrates a perspective view of a memory device including a memory cell shown in FIG. 1, in accordance with some embodiments.

Referring to FIG. 3, a perspective view of an example memory device 300 is shown. In accordance with some embodiments, the memory device 300 may be a portion of an anti-fuse memory cell that includes one programming transistor and one reading transistor, e.g., the memory cell 100 of FIG. 1. The perspective view of FIG. 3 is an overview of the anti-fuse memory cell and thus, some of the features of the anti-fuse memory cell may not be identified in FIG. 3. More detailed features of the memory device 300 (or a memory device similar to 300) will be shown and discussed below with respect to the cross-sectional views of FIGS. 19A-29 and 32.

As shown in FIG. 3, the memory device 300 includes a programming transistor 302 and a reading transistor 304. In some embodiments, the programming transistor 302 is configured as a non-GAA transistor (e.g., a FinFET), and the reading transistor is configured as a GAA transistor (e.g., a nanosheet transistor). The programing transistor 302 and the reading transistor 304 may be formed on a semiconductor substrate 306 in respective different active regions. For example, over a first active region 306A of the semiconductor substrate 306, the programming transistor 302 is formed; and over a second active region 306B of the semiconductor substrate 306, the reading transistor 304 is formed, wherein the first and second active regions, 306A and 306B, are laterally (e.g., along the X direction) separated from each other by an isolation structure (not shown in FIG. 3). Such an active region is sometimes referred to as an oxide diffusion (OD) region.

Specifically, the programming transistor 302 includes a gate structure 308 disposed over the active region 306A; and the reading transistor 304 includes a gate structure 310 disposed over the active region 306B. The gate structures 308 and 310, in parallel with each other, may be orientated and elongated along a lateral direction (e.g., the Y direction). In the active region 306A, the programming transistor 302 includes a source/drain structure 316 and a source/drain structure 318 formed on respective sides of the gate structure 308. In the active region 306B, the reading transistor 310 includes a source/drain structure 320 and a source/drain structure 322 formed on respective sides of the gate structure 310.

The gate structure 308 is formed to straddle a structure 332 protruding from the substrate 306 (hereinafter fin-based or protruding structure 332), with the source/drain structures 316 and 318 coupled to its respective ends, e.g., along the X direction. The protruding structure 332 can function as a channel of the programing transistor 302. The gate structure 310 is formed to wrap around a number of nanostructures (e.g., nanosheets, nanowires, or otherwise semiconductor layers with the dimensions of the order of a nanometer) 342a, 342b, and 342c, with the source/drain structures 320 and 322 coupled to their respective ends, e.g., along the X direction. The semiconductor layers 342a-c (which may sometimes be referred to as semiconductor layers 342) can collectively function as a channel of the reading transistor 304. The protruding structure 332 and the semiconductor layers 342a-c may be orientated and elongated along a lateral direction (e.g., the X direction), which is the same as the direction along which the source/drain structures 316-322 are aligned with each other. As such, the active region 306A where the source/drain structures 316-318 and the protruding structure 332 are formed, and the active region 306B where the source/drain structures 320-322 and the semiconductor layers 342a-c are formed, although laterally separated from each other, can be aligned with each other along a lateral direction (e.g., the X direction).

Referring still to FIG. 3, and in further detail, the gate structure 310 can include multiple gate stacks, in some embodiments. Each of the gate stacks may include one or more gate dielectrics and one or more gate metals (not shown in FIG. 3 for clarity). Two of the gate stacks are configured to collectively wrap around a corresponding one of the one or more semiconductor layers 342a-c. For instance, the gate structure 310 includes gate stacks 310a, 310b, 310c, and 310d. The gate stacks 310a-d may have a width (along the Y direction) substantially similar as a width of the gate structure 310 (along the Y direction), and the semiconductor layers 342a-c are characterized with a width (along the Y direction) less than the width of the gate stacks 310a-d. Each of the gate stacks 310a-d may further include portions that extend along the Z direction to be in contact with an adjacent gate stack. As such, two adjacent ones of the gate stacks 310a-d can wrap the full perimeter of a corresponding one of the semiconductor layers 342a-c.

For example, the gate stacks 310a and 310b can collectively wrap around at least four sides of the semiconductor layer 342a, with two sides (or ends) of the semiconductor layer 342a respectively coupled to the source/drain structure 320 and source/drain structure 322; the gate stacks 310b and 310c can collectively wrap around at least four sides of the semiconductor layer 342b, with two sides (or ends) of the semiconductor layer 342b respectively coupled to the source/drain structure 320 and source/drain structure 322; and the gate stacks 310c and 310d can collectively wrap around at least four sides of the semiconductor layer 342c, with two sides (or ends) of the semiconductor layer 342c respectively coupled to the source/drain structure 320 and source/drain structure 322.

Figure 4:
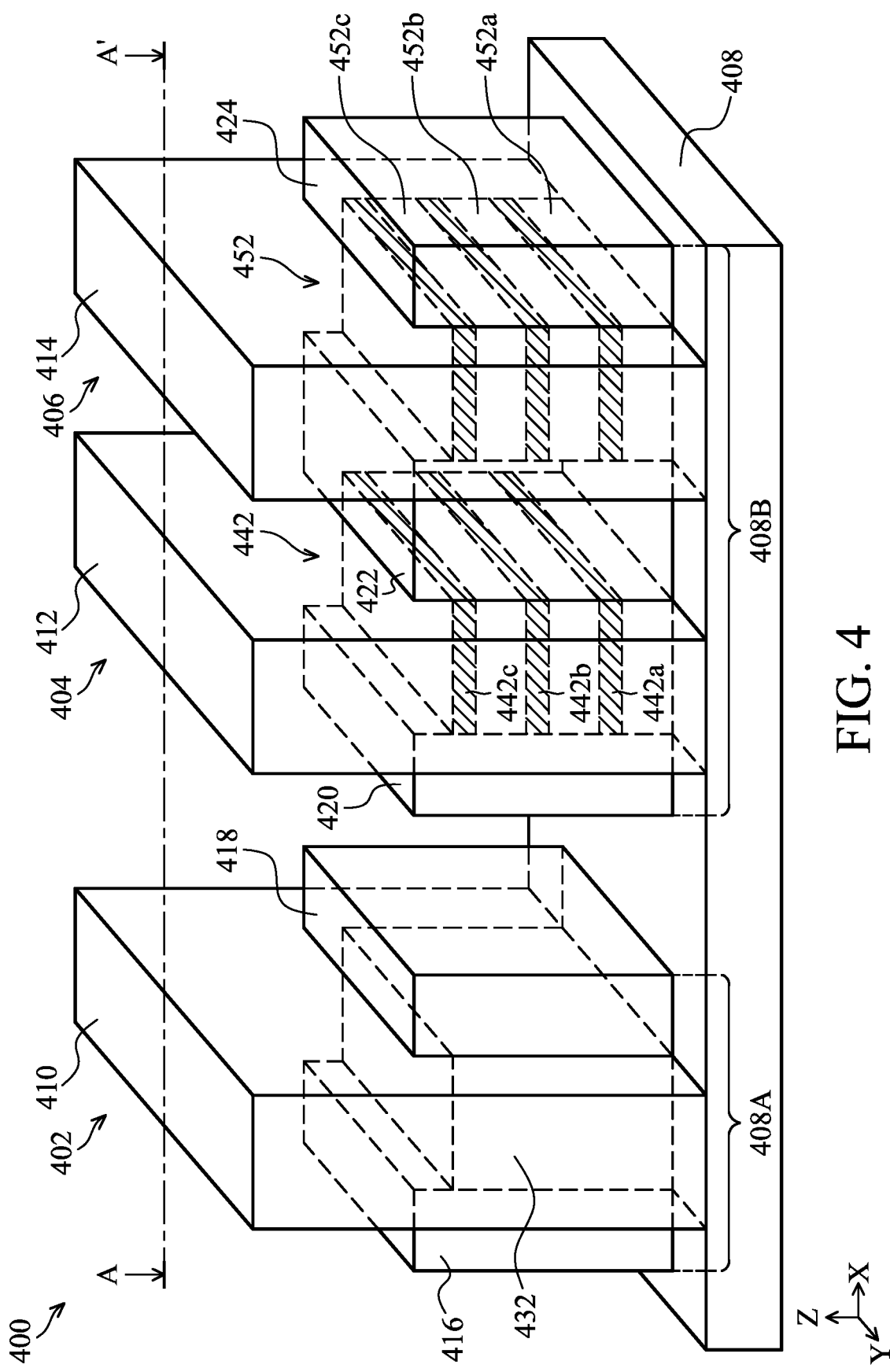
FIG. 4 illustrates a perspective view of a memory device including a memory cell shown in FIG. 2, in accordance with some embodiments.

Referring to FIG. 4, a perspective view of an example memory device 400 is shown. In accordance with some embodiments, the memory device 400 may be a portion of an anti-fuse memory cell that includes one programming transistor and two reading transistors, e.g., the memory cell 200 of FIG. 2. The perspective view of FIG. 4 is an overview of the anti-fuse memory cell and thus, some of the features of the anti-fuse memory cell may not be identified in FIG. 4. More detailed features of the memory device 400 (or a memory device similar to 400) will be shown and discussed below with respect to the cross-sectional views of FIGS. 30 and 31.

As shown in FIG. 4, the memory device 400 includes a programming transistor 402, a first reading transistor 404, and a second reading transistor 406. In some embodiments, the programming transistor 402 is configured as a non-GAA transistor (e.g., a FinFET), and the reading transistors, 404 and 406, are each configured as a GAA transistor (e.g., a nanosheet transistor). The programing transistor 402 and the reading transistors 404-406 may be formed on a semiconductor substrate 408 in respective different active regions. For example, over a first active region 408A of the semiconductor substrate 408, the programming transistor 402 is formed; and over a second active region 408B of the semiconductor substrate 408, the reading transistors 404-406 are formed, wherein the first and second active regions, 408A and 408B, are laterally (e.g., along the X direction) separated from each other by an isolation structure (not shown in FIG. 4). Such an active region is sometimes referred to as an oxide diffusion (OD) region.

Specifically, the programming transistor 402 includes a gate structure 410 disposed over the active region 408A; and the reading transistors 404 and 406 respectively include gate structures 412 and 414 disposed over the active region 408B. The gate structure 410, 412, and 414, in parallel with each other, may be orientated and elongated along a lateral direction (e.g., the Y direction). In the active region 408A, the programming transistor 402 includes a source/drain structure 416 and a source/drain structure 418 formed on respective sides of the gate structure 410. In the active region 408B, the reading transistor 404 includes a source/drain structure 420 and a source/drain structure 422 formed on respective sides of the gate structure 412; and the reading transistor 406 includes the source/drain structure 422 and a source/drain structure 424 formed on respective sides of the gate structure 414. In the illustrated embodiment of FIG. 4, the reading transistors 404 and 406 may share the same source/drain structure 422. However, the reading transistors 404 and 406 may not share the same source/drain structure, while remaining within the scope of the present disclosure.

The gate structure 410 is formed to straddle a structure 432 protruding from the substrate 408 (hereinafter fin-based or protruding structure 432), with the source/drain structures 416 and 418 coupled to its respective ends, e.g., along the X direction. The protruding structure 432 can function as a channel of the programing transistor 402. The gate structure 412 is formed to wrap around a number of nanostructures (e.g., nanosheets, nanowires, or otherwise semiconductor layers with the dimensions of the order of a nanometer) 442a, 442b, and 442c, with the source/drain structures 420 and 422 coupled to their respective ends, e.g., along the X direction. The semiconductor layers 442a-c (which may sometimes be referred to as semiconductor layers 442) can collectively function as a channel of the reading transistor 404. The gate structure 414 is formed to wrap around a number of other nanostructures (e.g., semiconductor layers) 452a, 452b, and 452c, with the source/drain structures 422 and 424 coupled to their respective ends, e.g., along the X direction. The semiconductor layers 452a-c (which may sometimes be referred to as semiconductor layers 452) can collectively function as a channel of the reading transistor 406. The protruding structure 432 and the semiconductor layers 442a-c and 452a-c may be orientated and elongated along a lateral direction (e.g., the X direction), which is the same as the direction along which the source/drain structures 416-424 are aligned with each other. As such, the active region 408A where the source/drain structures 416-418 and the protruding structure 432 are formed, and the active region 408B where the source/drain structures 420-424 and the semiconductor layers 442a-c and 452a-c are formed, although laterally separated from each other, can be aligned with each other along a lateral direction (e.g., the X direction).

Each of the gate structures 412 and 414 can include multiple gate stacks, in some embodiments. Each of the gate stacks may include one or more gate dielectrics and one or more gate metals (not shown in FIG. 4 for clarity). Two of the gate stacks are configured to collectively wrap around a corresponding one of the one or more semiconductor layers. As the gate structures 412 and 414 are similar as the gate structure 310 discussed with respect to FIG. 3, discussions of the gate structures 412 and 414 will not be repeated.

FIGS. 5, 6, 7, and 8 illustrate various examples of design layouts to fabricate an anti-fuse cell, in accordance with some embodiments. The layouts of FIGS. 5 to 8 may each be used to fabricate an anti-fuse memory cell having one programing transistor and one reading transistor, e.g., the memory cell 100 of FIG. 1. Further, the programming transistor may be formed as a non-GAA transistor and the reading transistor may be formed as a GAA transistor, in some embodiments. For example, the non-GAA programming transistor may be a FinFET and the GAA reading transistor may be a nanosheet transistor. However, it is understood that the layouts of FIGS. 5 to 8 may be used to fabricate any of various other combinations of transistors. For example, the non-GAA programming transistor may be a planar transistor and the GAA reading transistor may be a nanowire transistor. In another example, the non-GAA programming transistor may be a FinFET and the GAA reading transistor may be a nanowire transistor. In yet another example, the non-GAA programming transistor may be a FinFET and the GAA reading transistor may be a vertical transistor.

As a representative example, each of the layouts of FIGS. 5 to 8 is configured to fabricate an anti-fuse memory cell similar to the memory device 300 that includes a non-GAA programming transistor and a GAA reading transistor shown in FIG. 3. Thus, the following discussions of FIGS. 5 to 8 will be provided in conjunction with FIG. 3. It is appreciated that the layouts shown in FIGS. 5 to 8 have been simplified for illustration purposes. Thus, each of the layouts may include one or more other features while remaining within the scope of the present disclosure.

Figure 5:
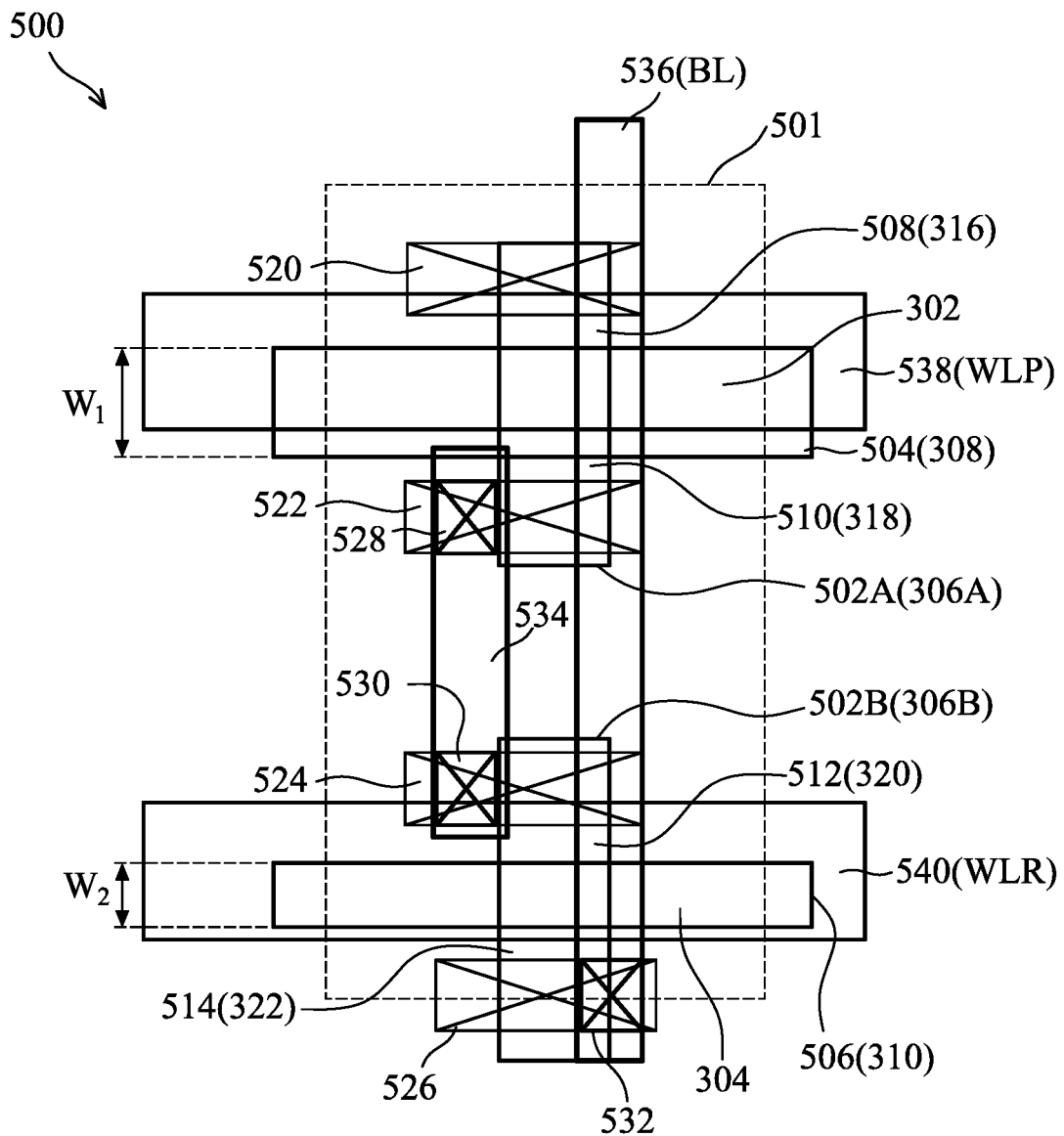
FIGS. 5, 6, 7, 8, 9, and 10 illustrate various example layouts to form memory devices, in accordance with some embodiments.

Referring to FIG. 5, a layout 500 is depicted, in accordance with some embodiments. The layout 500 includes a feature 501 that defines the boundary of an anti-fuse memory cell (hereinafter cell boundary 501). Over the cell boundary 501, the layout 500 includes various features, each of which corresponds to one or more patterning process (e.g., a photolithography process) to make a physical device feature.

For example, the layout 500 includes active features, 502A and 502B, and gate features, 504 and 506. The active feature 502A, extending along the X direction, may be configured to define a first active region, e.g., 306A of FIG. 3. The active feature 502B, extending along the X direction, may be configured to define a second active region, e.g., 306B of FIG. 3. Hereinafter, the active features 502A and 502B may sometimes be referred to as active regions 502A(306A) and 502B(306B), respectively. The gate feature 504, extending along the Y direction, may be configured to form a first gate structure, e.g., 308 of FIG. 3. The gate feature 506, extending along the Y direction, may be configured to form a second gate structure, e.g., 310 of FIG. 3. Hereinafter, the gate features 504 and 506 may sometimes be referred to as gate structures 504(308) and 506(310), respectively. In some embodiments, a width, $W_1$, of the gate structure 504(308) (extending along the X direction) may be wider than a width, $W_2$, of the gate structure 506(310) (extending along the X direction), as shown in FIG. 5. In some other embodiments, the width, $W_1$, can be equal to the width, $W_2$.

Each of the gate features can travel across a corresponding one of the active features to form one or more sub-active features on side(s) of the gate feature, which may be configured to form respective source/drain structure(s). For example in FIG. 5, the gate feature 504 travels across the active feature 502A to form sub-active features, 508 and 510, which may be used to form source/drain structures, e.g., 316 and 318 of FIG. 3. The gate feature 506 travels across the active feature 502B to form sub-active features, 512 and 514, which may be used to form source/drain structures, e.g., 320 and 322 of FIG. 3. Hereinafter, the sub-active features 508, 510, 512, and 514 may sometimes be referred to as source/drain structures 508(316), 510(318), 512(320), and 514(322), respectively.

In some embodiments, the portion of the active region 502A(306A) that is overlaid by the gate structure 504(308) is configured to form the channel of a non-GAA transistor, e.g., the protruding structure 332 of FIG. 3. The portion of the active region 502B(306B) that is overlaid by the gate structure 506(310) is configured to form the channel of a GAA transistor, e.g., the semiconductor layers 342a-c of FIG. 3. As such, the non-GAA programming transistor 302 (FIG. 3) can be formed based on the active feature 502A and the gate feature 504 of the layout 500; and the GAA reading transistor 304 (FIG. 3) can be formed based on the active feature 502B and the gate feature 506 of the layout 500.

Upon forming the non-GAA programming transistor 302 and the GAA reading transistor 304, a number of interconnecting structures can be formed to operate the programming transistor 302 and reading transistor 304. For example, the drain of the programming transistor 302 (e.g., source/drain structure 510(318)) and the source of the reading transistor 304 (e.g., source/drain structure 512(320)) are connected to each other by an interconnecting structure; the gate of the programming transistor 302 (e.g., gate structure 504(308)) and the gate of the reading transistor 304 (e.g., gate structure 506(310)) may be connected to interconnecting structures that functions as WLP (e.g., 130 of FIG. 1) and WLR (e.g., 132 of FIG. 1), respectively; and the drain of the reading transistor 304 (e.g., source/drain structure 514(322)) may be connected to an interconnecting structure that functions as a BL (e.g., 134 of FIG. 1).

As illustrated in the example of FIG. 5, the layout 500 includes a number of features to form such interconnecting structures (e.g., WLP, WLR, BL, etc.) and additional interconnecting structures to connect to those interconnecting structures. For example, the layout 500 includes features 520, 522, 524, and 526 extending along the Y direction. The features 520, 522, 524, and 526 are configured to form interconnecting structures to connect to the source/drain structure 508(316), the source/drain structure 510(318), the source/drain structure 512(320), and the source/drain structure 514(322), respectively. Such interconnecting structures connecting to the source/drain structures are sometimes referred to as MDs, which may be formed as slot or trench structures. Accordingly, the features 520, 522, 524, and 526 may hereinafter referred to as MD 520, MD 522, MD 524, and MD 526, respectively.

The layout 500 further includes features 528, 530, and 532, that are configured to form interconnecting structures to connect to the MDs 522, 524, and 526, respectively. Such interconnecting structures are sometimes referred to as VDs, which may be formed as via structures. Accordingly, the features 528, 530, and 532 may hereinafter referred to as VD 528, VD 530, and VD 532, respectively.

The layout 500 further includes features 534 and 536 both extending along the X direction. The feature 534 is configured to form an interconnecting structure interconnecting the transistors 302 and 304 together, which is hereinafter referred to as interconnecting structure 534. For example, the source/drain structure 510(318) of the programming transistor 302 can connect to the to the source/drain structure 512(320) of the reading transistor 304, through the MD 522, VD 528, the interconnecting structure 534, the VD 530, and the MD 524. The feature 536 is configured to form an interconnecting structure functioning as a BL, which is hereinafter referred to as BL 536. The BL 536 can connect to the source/drain structure 514(322) of the reading transistor 304, through the VD 532 and the MD 526.

The layout 500 further includes features 538 and 540 both extending along the Y direction. The features 538 and 540 are configured to form interconnecting structures functioning as a WLP and WLR, respectively, which are hereinafter referred to as WLP 538 and WLR 540. The WLP 538 may connect to the gate structure 504(308) of the programming transistor 302 through an interconnecting structure, sometimes referred to as a VG (not shown), and the WLR 540 may connect to the gate structure 506(310) of the reading transistor 304 through another VG (not shown). Such VGs may be formed as via structures, in some embodiments.

In some embodiments, the MDs 520-526, VDs 528-532, and the non-shown VGs may be disposed in a middle-end-of-line (MEOL) network. The interconnecting structure 534 and BL 536 may be disposed in a first metallization layer of a back-end-of-line (BEOL) network. The WLP 538 and WLR 540 may be disposed in a second metallization layer of the BEOL network. The second metallization layer can be disposed over the first metallization layer, and the first metallization layer can be disposed over the MEOL network.

Figure 6:
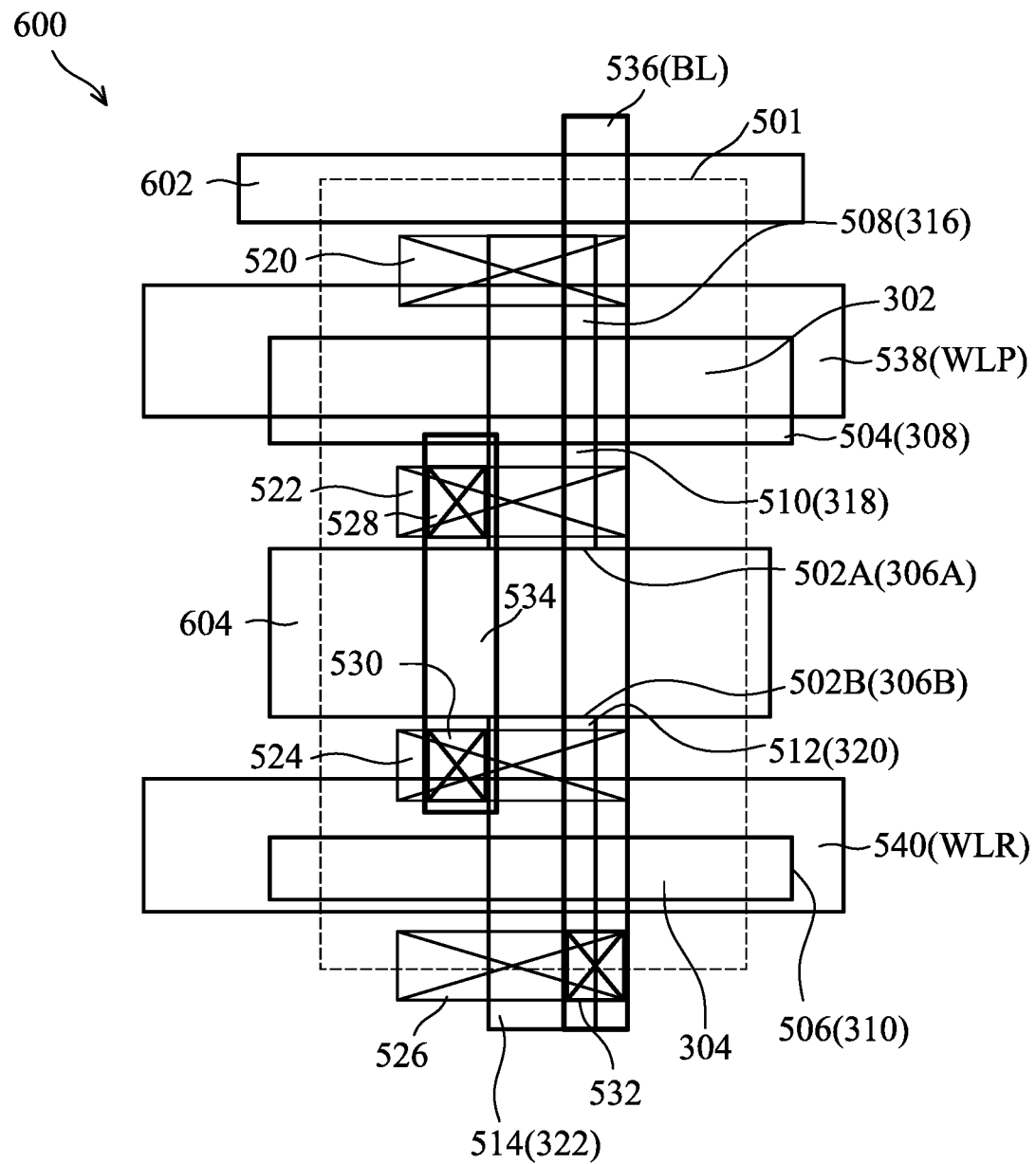

Referring to FIG. 6, a layout 600 is depicted, in accordance with some embodiments. The layout 600 is similar to the layout 500 except that the layout 600 further includes features to form one or more dummy gate structures. Thus, some of the reference numerals of FIG. 5 will be reused in the following discussions of FIG. 6.

As shown, the layout 600 further includes features 602 and 604 both extending along the Y direction. The features 602 and 604 are configured to form dummy gate structures, which are hereinafter referred to as dummy gate structures, 602 and 604. In some embodiments, the dummy gate structures 602-604 may be similar as the gate structures 308-310 of FIG. 3 (e.g., extending along the Y direction) but may not travel across any active region. Accordingly, the dummy gate structures 602-604 will not be adopted as an active gate structure to electrically control current in a finished semiconductor device (e.g., the memory device 300 of FIG. 3). As shown in FIG. 6, the dummy gate structure 602 is disposed along one of the sides of the cell boundary 501. The dummy gate structure 604 is disposed between the active regions 502A(306A) and 502B(306B).

Figure 7:
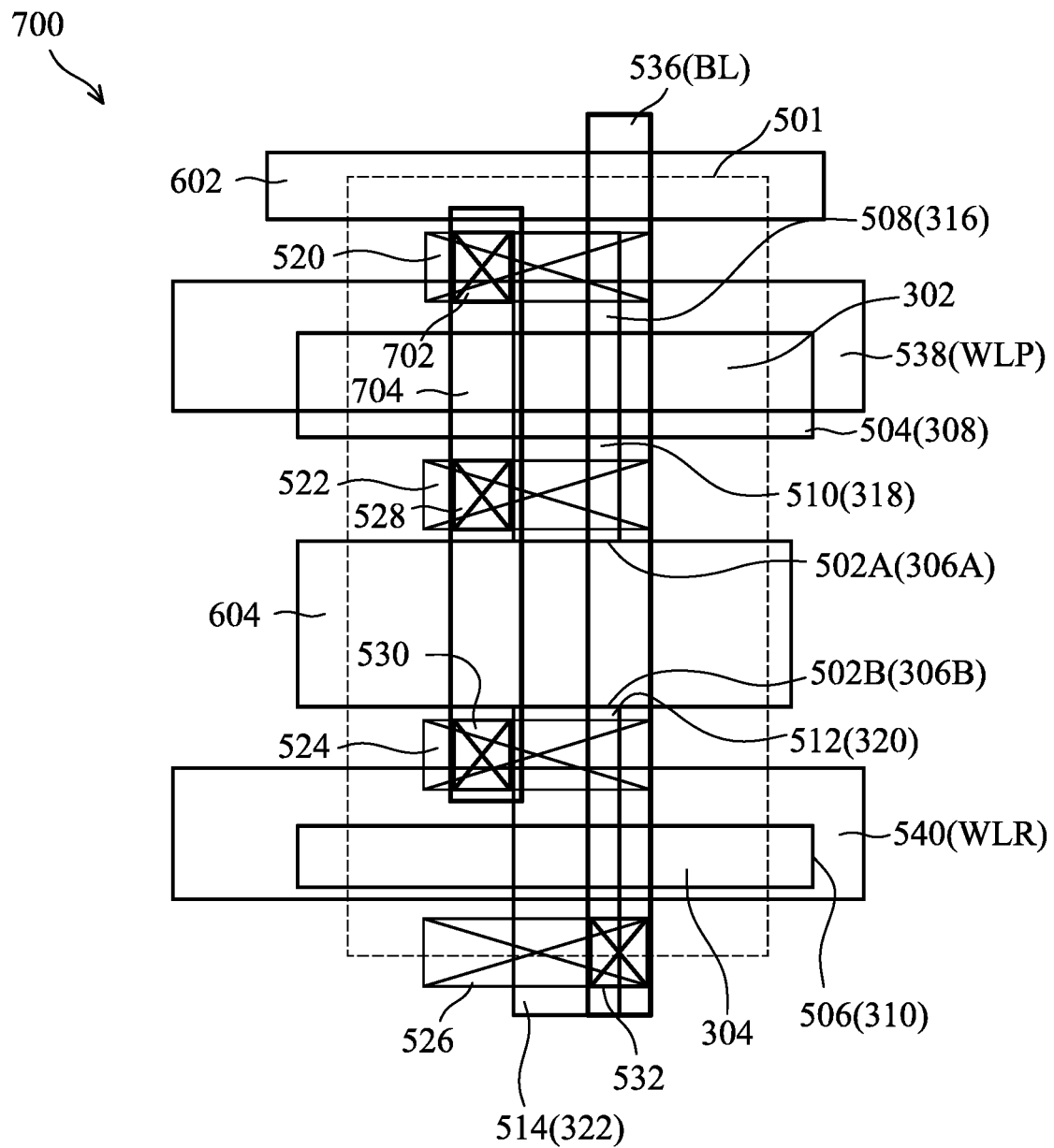

Referring to FIG. 7, a layout 700 is depicted, in accordance with some embodiments. The layout 700 is similar to the layout 600 except that the layout 700 further includes features to form one or more interconnecting structures. Thus, some of the reference numerals of FIG. 6 will be reused in the following discussions of FIG. 7.

As shown, the layout 700 further includes a feature 702 configured to form an interconnecting structure (e.g., a VD). Hereinafter, the feature 702 may be referred to as VD 702.

Similar to the VDs 528 and 530, the VD 702 is configured to connect to a corresponding MD, e.g., 520. The layout 700 includes a feature 704 similar to the feature 534 except that the feature 704 is configured to form an interconnecting structure connecting to the VD 702, in addition to the VDs, 528 and 530. In other words, the feature 704 may further extend across the gate structure 504(308), e.g., along the X direction. Hereinafter, the feature 704 may sometimes be referred to as interconnecting structure 704. By forming the interconnecting structure 704, the source/drain structure 508(316), which is connected to the MD 520, the source/drain structure 510(318), which is connected to the MD 522, and the source/drain structure 512(320), which is connected to the MD 524, can be interconnected to one another.

Figure 8:
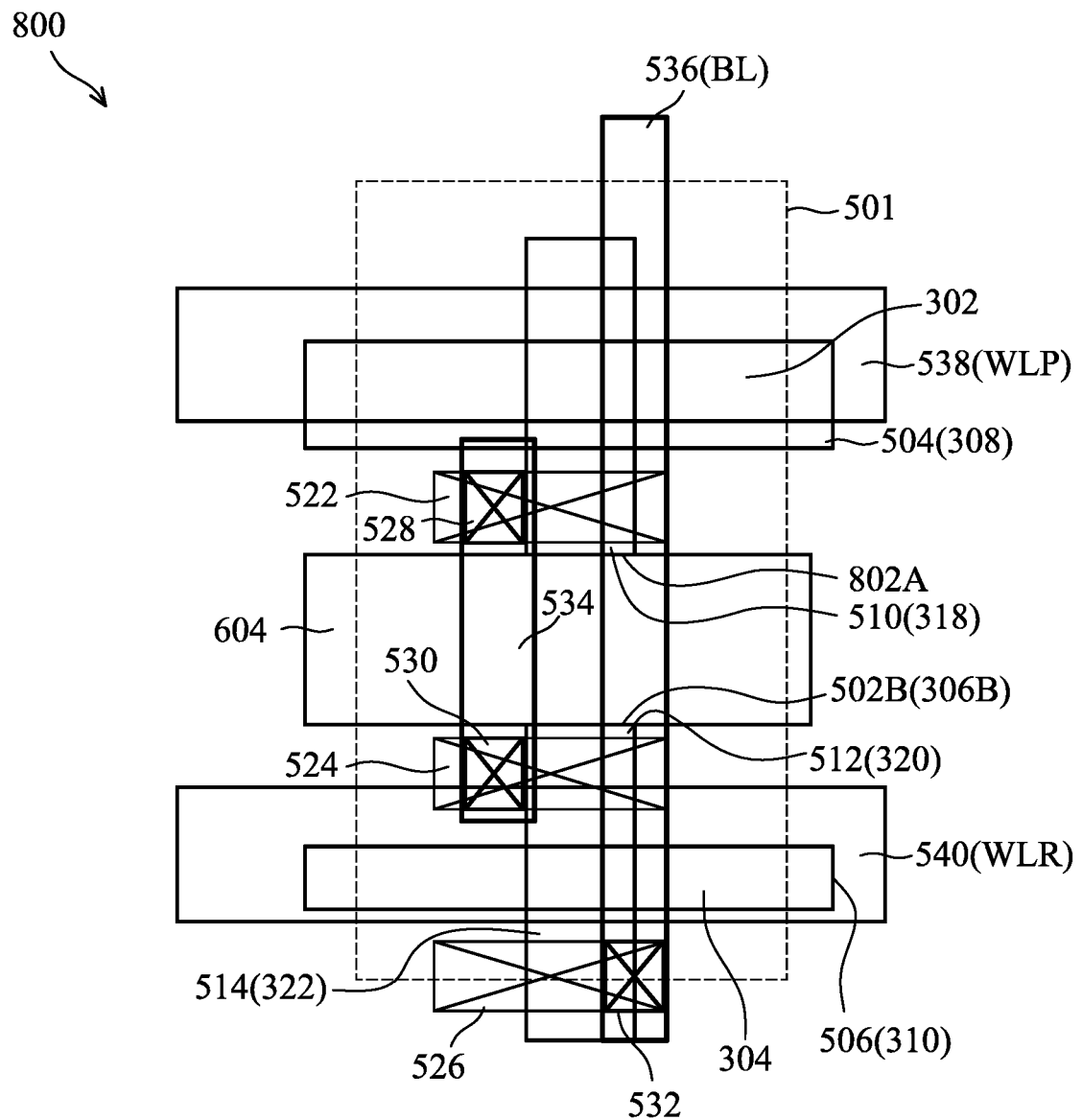

Referring to FIG. 8, a layout 800 is depicted, in accordance with some embodiments. The layout 800 is similar to the layout 600 except that the layout 800 includes a feature to form an active region partially overlaid by a corresponding gate structure. Thus, some of the reference numerals of FIG. 6 will be reused in the following discussions of FIG. 8.

As shown, the layout 800 includes a feature 802A configured to form an active region. Hereinafter, the feature 802A may sometimes be referred to as active region 802A. The active region 802A is similar as the active region 502A(306A) shown in FIGS. 5-7 except that the active region 802A is partially overlaid by the gate structure 504(308). Specifically, the portion of the active region 802A overlaid by the gate structure 504(308) is offset toward the active region 502B(306B), in some embodiments. As such, when using the layout 800 to form the memory device 300 in FIG. 3, the memory device 300 does not have the source/drain structure 316. Further, the protruding structure 332 formed by the portion of the active region 802A overlaid by the gate structure 504(308) may have an additional sidewall that is also overlaid by the gate structure 504(308). This sidewall should have been coupled to the source/drain structure 316. The programming transistor 302 that has only one source/drain structure (e.g., the source/drain structure 318) coupled to its channel (e.g., the protruding structure 332) may sometimes be referred to as a MOS (or MOSFET) capacitor.

Figure 9:
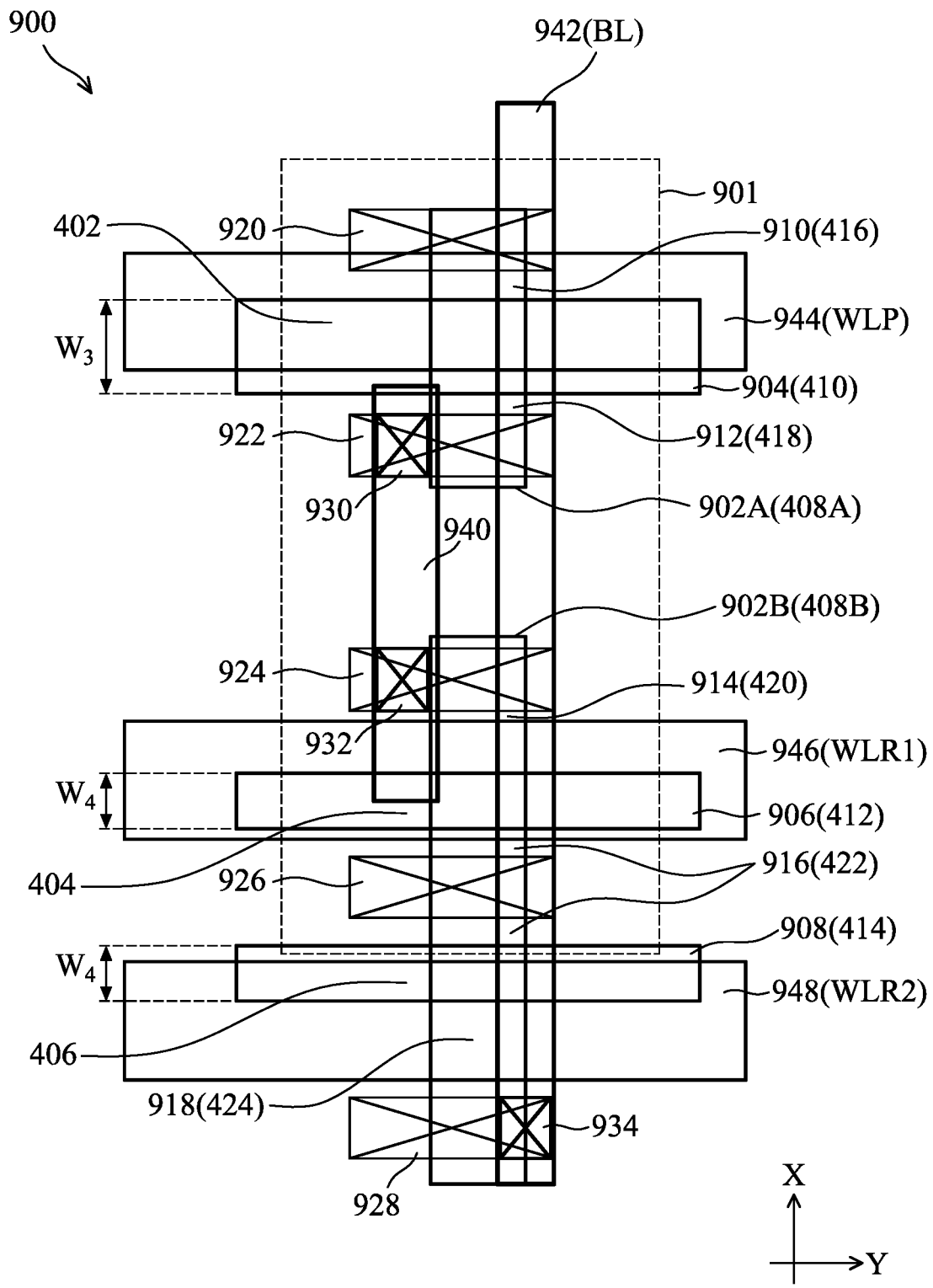
Figure 10:
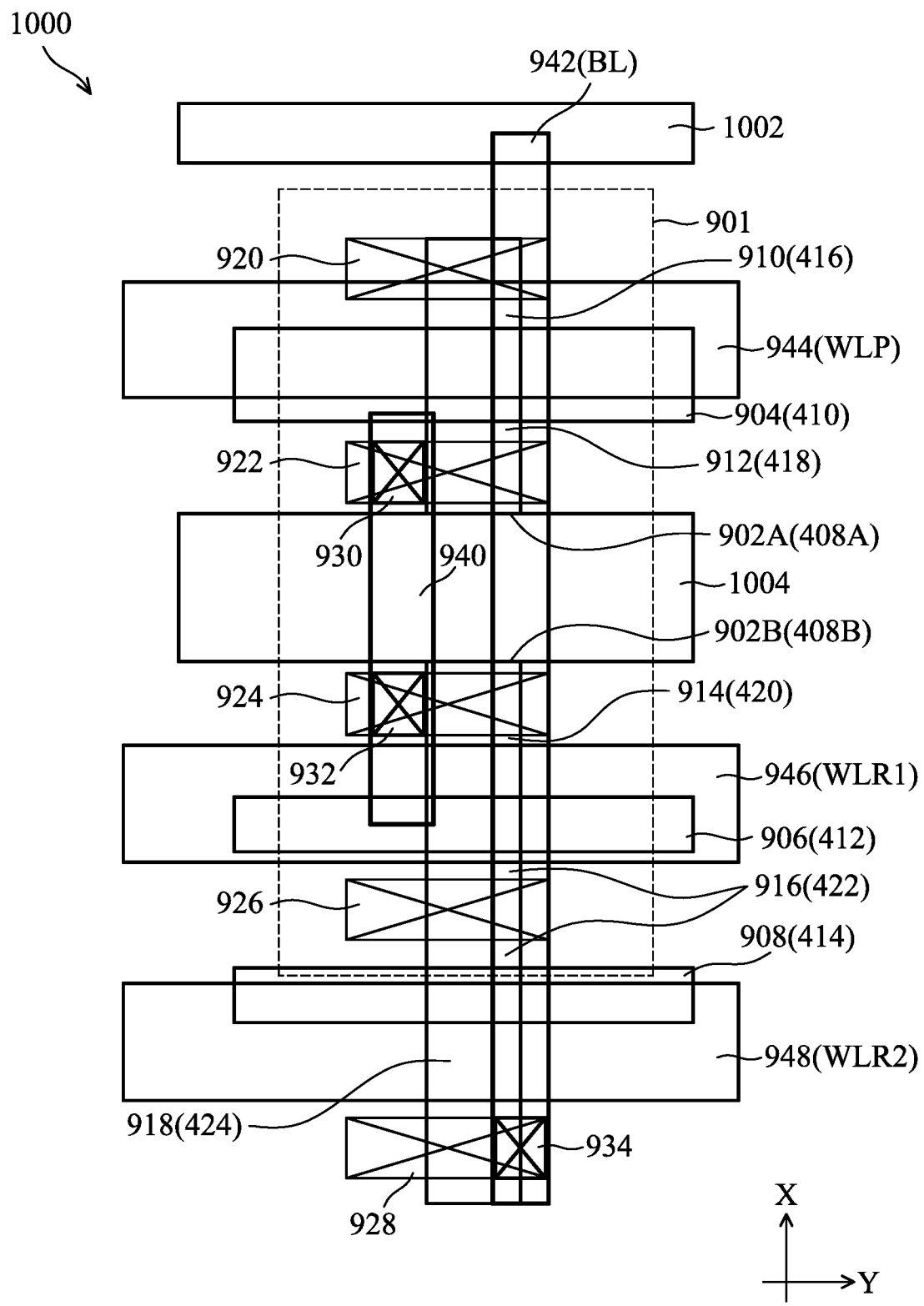

FIGS. 9 and 10 illustrate various examples of design layouts to fabricate an anti-fuse cell, in accordance with some embodiments. The layouts of FIGS. 9 to 10 may each be used to fabricate an anti-fuse memory cell having one programing transistor and two reading transistors, e.g., the memory cell 200 of FIG. 2. Further, the programming transistor may be formed as a non-GAA transistor and the reading transistors may each be formed as a GAA transistor, in some embodiments. For example, the non-GAA programming transistor may be a FinFET and the GAA reading transistors may each be a nanosheet transistor. However, it is understood that the layouts of FIGS. 9 to 10 may be used to fabricate any of various other combinations of transistors, while remaining within the scope of the present disclosure.

As a representative example, each of the layouts of FIGS. 9 to 10 is configured to fabricate an anti-fuse memory cell similar to the memory device 400 that includes a non-GAA programming transistor and two GAA reading transistors shown in FIG. 4. Thus, the following discussions of FIGS. 9 to 10 will be provided in conjunction with FIG. 4. It is appreciated that the layouts shown in FIGS. 9 to 10 have been simplified for illustration purposes. Thus, each of the layouts may include one or more other features while remaining within the scope of the present disclosure.

Referring to FIG. 9, a layout 900 is depicted, in accordance with some embodiments. The layout 900 includes a feature 901 that defines the boundary of an anti-fuse memory cell (hereinafter cell boundary 901). Over the cell boundary 901, the layout 900 includes various features, each of which corresponds to one or more patterning process (e.g., a photolithography process) to make a physical device feature.

For example, the layout 900 includes active features, 902A and 902B, and gate features, 904, 906, and 908. The active feature 902A, extending along the X direction, may be configured to form a first active region, e.g., 408A of FIG. 4. The active feature 902B, extending along the X direction, may be configured to form a second active region, e.g., 408B of FIG. 4. Hereinafter, the active features 902A and 902B may sometimes be referred to as active regions 902A(408A) and 902B(408B), respectively. The gate feature 904, extending along the Y direction, may be configured to form a first gate structure, e.g., 410 of FIG. 4. The gate feature 906, extending along the Y direction, may be configured to form a second gate structure, e.g., 412 of FIG. 4. The gate feature 908, extending along the Y direction, may be configured to form a third gate structure, e.g., 414 of FIG. 4. Hereinafter, the gate features 904, 906, and 908 may sometimes be referred to as gate structures 904(410), 906(412), and 908(414), respectively. In some embodiments, a width, $W_3$, of the gate structure 904(410) (extending along the X direction) may be wider than a width, $W_4$, of the gate structures 906(412) and 908(414) (extending along the X direction), as shown in FIG. 9. In some other embodiments, the width, $W_3$, can be equal to the width, $W_4$.

Each of the gate features can travel across a corresponding one of the active features to form one or more sub-active features on side(s) of the gate feature, which may be configured to form respective source/drain structure(s). For example in FIG. 9, the gate feature 904 travels across the active feature 902A to form sub-active features, 910 and 912, which may be used to form source/drain structures, e.g., 416 and 418 of FIG. 4. The gate features 906 and 908 respectively travel across the active feature 902B to form sub-active features, 914, 916, and 918, which may be used to form source/drain structures, e.g., 420, 422, and 424 of FIG. 4, respectively. Hereinafter, the sub-active features 910, 912, 914, 916, and 918 may sometimes be referred to as source/drain structures 910(416), 912(418), 914(420), 916(422), and 918(424), respectively.

In some embodiments, the portion of the active region 902A(408A) that is overlaid by the gate structure 904(410) is configured to form the channel of a non-GAA transistor, e.g., the protruding structure 432 of FIG. 4. The portion of the active region 902B(408B) that is overlaid by the gate structure 906(412) is configured to form the channel of a first GAA transistor, e.g., the semiconductor layers 442a-c of FIG. 4. The portion of the active region 902B(408B) that is overlaid by the gate structure 908(414) is configured to form the channel of a second GAA transistor, e.g., the semiconductor layers 452a-c of FIG. 4. As such, the non-GAA programming transistor 402 (FIG. 4) can be formed based on the active feature 902A and the gate feature 904 of the layout 900; the GAA reading transistor 404 (FIG. 4) can be formed based on the active feature 902B and the gate feature 906 of the layout 900; and the GAA reading transistor 406 (FIG. 4) can be formed based on the active feature 902B and the gate feature 908 of the layout 900.

Upon forming the non-GAA programming transistor 402 and the GAA reading transistors 404-406, a number of interconnecting structures can be formed to operate the programming transistor 402 and reading transistors 404-406. For example, the drain of the programming transistor 402

(e.g., source/drain structure 912(418)) and the source of the reading transistor 404 (e.g., source/drain structure 914(420)) are connected to each other by an interconnecting structure; the gate of the programming transistor 402 (e.g., gate structure 904(410)), the gate of the reading transistor 404 (e.g., gate structure 906(412)), and the gate of the reading transistor 406 (e.g., gate structure 908(414)) may be connected to interconnecting structures that functions as WLP (e.g., 240 of FIG. 2), WLR1 (e.g., 242 of FIG. 2), and WLR2 (e.g., 244 of FIG. 2), respectively; and the drain of the reading transistor 406 (e.g., source/drain structure 918(424)) may be connected to an interconnecting structure that functions as a BL (e.g., 250 of FIG. 2).

As illustrated in the example of FIG. 9, the layout 900 includes a number of features to form such interconnecting structures (e.g., WLP, WLR1, WLR2, BL, etc.) and additional interconnecting structures to connect to those interconnecting structures. For example, the layout 900 includes features 920, 922, 924, 926, and 928 extending along the Y direction. The features 920, 922, 924, 926, and 928 are configured to form interconnecting structures to connect to the source/drain structure 910(416), the source/drain structure 912(418), the source/drain structure 914(420), the source/drain structure 916(422), and the source/drain structure 918(424), respectively. Such interconnecting structures connecting to the source/drain structures are sometimes referred to as MDs. Accordingly, the features 920, 922, 924, 926, and 928 may hereinafter referred to as MD 920, MD 922, MD 924, MD 926, and MD 928, respectively.

The layout 900 further includes features 930, 932, and 934, that are configured to form interconnecting structures to connect to the MDs 922, 924, and 928, respectively. Such interconnecting structures are sometimes referred to as VDs. Accordingly, the features 930, 932, and 934 may hereinafter referred to as VD 930, VD 932, and VD 934, respectively.

The layout 900 further includes features 940 and 942 both extending along the X direction. The feature 940 is configured to form an interconnecting structure interconnecting the transistors 402 and 404 together, which is hereinafter referred to as interconnecting structure 940. For example, the source/drain structure 912(418) of the programming transistor 402 can connect to the to the source/drain structure 914(420) of the reading transistor 404, through the MD 922, VD 930, the interconnecting structure 940, the VD 932, and the MD 924. The feature 942 is configured to form an interconnecting structure functioning as a BL, which is hereinafter referred to as BL 942. The BL 942 can connect to the source/drain structure 918(424) of the reading transistor 406, through the VD 934 and the MD 928.

The layout 900 further includes features 944, 946, and 948 both extending along the Y direction. The features 944, 946, and 948 are configured to form interconnecting structures functioning as a WLP, WLR1, and WLR2, respectively, which are hereinafter referred to as WLP 944, WLR1 946 and WLR2 948. The WLP 944 may connect to the gate structure 904(410) of the programming transistor 402 through an interconnecting structure, sometimes referred to as a VG (not shown), the WLR1 946 may connect to the gate structure 906(412) of the reading transistor 404 through another VG (not shown), and the WLR2 948 may connect to the gate structure 908(414) of the reading transistor 406 through yet another VG (not shown).

In some embodiments, the MDs 920-928, VDs 930-934, and the non-shown VGs may be disposed in a middle-end-of-line (MEOL) network. The interconnecting structure 940 and BL 942 may be disposed in a first metallization layer of a back-end-of-line (BEOL) network. The WLP 944, WLR1 946, and WLR2 948 may be disposed in a second metallization layer of the BEOL network. The second metallization layer can be disposed over the first metallization layer, and the first metallization layer can be disposed over the MEOL network.

Referring to FIG. 10, a layout 1000 is depicted, in accordance with some embodiments. The layout 1000 is similar to the layout 900 except that the layout 1000 further includes features to form one or more dummy gate structures. Thus, some of the reference numerals of FIG. 9 will be reused in the following discussions of FIG. 10.

As shown, the layout 1000 further includes features 1002 and 1004 both extending along the Y direction. The features 1002 and 1004 are configured to form dummy gate structures, which are hereinafter referred to as dummy gate structures, 1002 and 1004. In some embodiments, the dummy gate structures 1002-1004 may be similar as the gate structures 410-414 of FIG. 4 (e.g., extending along the Y direction) but may not travel across any active region. Accordingly, the dummy gate structures 1002-1004 will not be adopted as an active gate structure to electrically control current in a finished semiconductor device (e.g., the memory device 400 of FIG. 4). As shown in FIG. 10, the dummy gate structure 1002 is disposed along one of the sides of the cell boundary 901. The dummy gate structure 1004 is disposed between the active regions 902A(408A) and 902B(408B).

Figure 11:
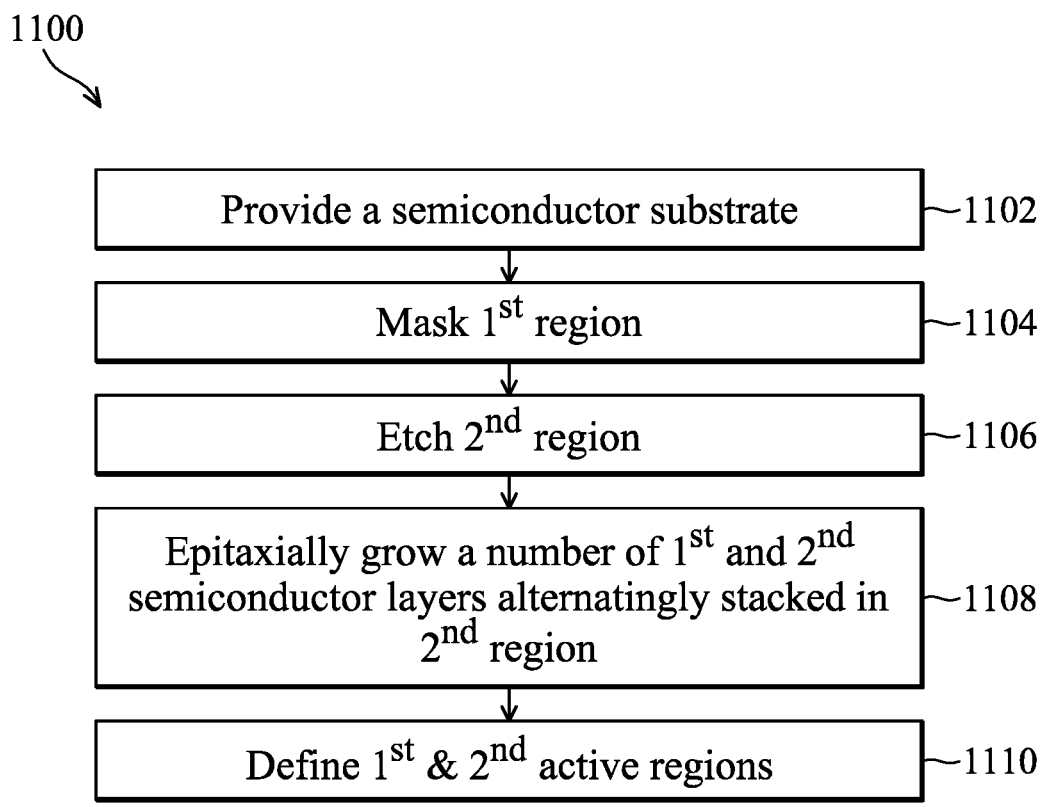
FIG. 11 illustrates a flow chart of an example method to define a first active region and a second active region for a memory device, in accordance with some embodiments.

FIG. 11 illustrates a flowchart of a method 1100 to define a first active region and a second active region over a substrate, according to one or more embodiments of the present disclosure. The first and second active regions may be laterally separated from each other by at least one isolation structure. In some embodiments, the first active region may include a structure protruding from the substrate (e.g., a fin-based structure), and the second active region may include a number of nanostructures (e.g., nanosheets, nanowires or otherwise semiconductor layers with the dimensions of the order of a nanometer) alternatingly stacked on top of one another. Upon the first and second active regions being defined, the method 1100 may be followed by the method 1800 of FIG. 18 to form one or more non-GAA transistors and one or more GAA transistors in the first active region and second active region, respectively, which will be discussed in further detail below.

The operations of the method 1100 may be associated with cross-sectional views of a memory device 1200 at respective fabrication stages as shown in FIGS. 12, 13, 14, 15, and 16. For example, the memory device 1200 may be similar to the memory device 300 of FIG. 3, or the memory device 400 of FIG. 4. The cross-sectional view of FIGS. 12-16 may be cut along line A-A' as shown in FIGS. 3 and 4. In some embodiments, the memory device 1200 may be included in or otherwise coupled to a microprocessor, another memory device, and/or other integrated circuit (IC). Also, FIGS. 12-16 are simplified for a better understanding of the concepts of the present disclosure. Although the figures illustrate the memory device 1200, it is understood the IC may include a number of other devices such as inductors, resistor, capacitors, transistors, etc., which are not shown in FIGS. 12-16, for purposes of clarity of illustration.

In brief overview, the method 1100 starts with operation 1102 in which a semiconductor substrate is provided. Next, the method 1100 proceeds to operation 1104 in which a first region of the semiconductor substrate is masked. Next, the method 1100 continues to operation 1106 in which a second region of the semiconductor substrate is etched to form a recess. Next, in operation 1108, a number of first semiconductor layers and a number of second semiconductor layers are epitaxially grown in the second region (the recess) to alternatingly stack on top of one another. Upon growing the first and second semiconductor layers in the second region, the method 1100 proceeds to operation 1110 in which a first active region and a second active region are defined.

Figure 12:
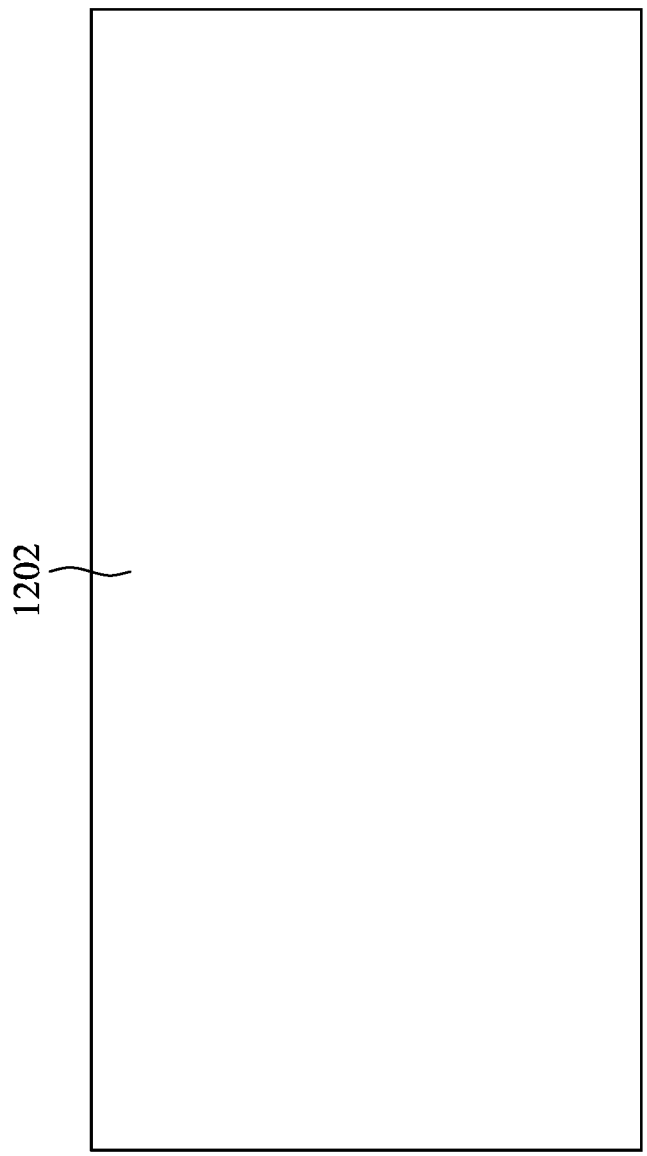
FIGS. 12, 13, 14, 15, and 16 illustrate cross-sectional views of the memory device, made by the method of FIG. 11, at various fabrication stages, in accordance with some embodiments.

Corresponding to operation 1102 of FIG. 11, FIG. 12 is a cross-sectional view of the memory device 1200 that includes a semiconductor substrate 1202, at one of the various stages of fabrication.

The semiconductor substrate 1202 includes a semiconductor material substrate, for example, silicon. Alternatively, the semiconductor substrate 1202 may include other elementary semiconductor material such as, for example, germanium. The semiconductor substrate 1202 may also include a compound semiconductor such as silicon carbide, gallium arsenic, indium arsenide, and indium phosphide. The semiconductor substrate 1202 may include an alloy semiconductor such as silicon germanium, silicon germanium carbide, gallium arsenic phosphide, and gallium indium phosphide. In one embodiment, the semiconductor substrate 1202 includes an epitaxial layer. For example, the semiconductor substrate 1202 may have an epitaxial layer overlying a bulk semiconductor. Furthermore, the semiconductor substrate 1202 may include a semiconductor-on-insulator (SOI) structure. For example, the semiconductor substrate 1202 may include a buried oxide (BOX) layer formed by a process such as separation by implanted oxygen (SIMOX) or other suitable technique, such as wafer bonding and grinding.

Figure 13:
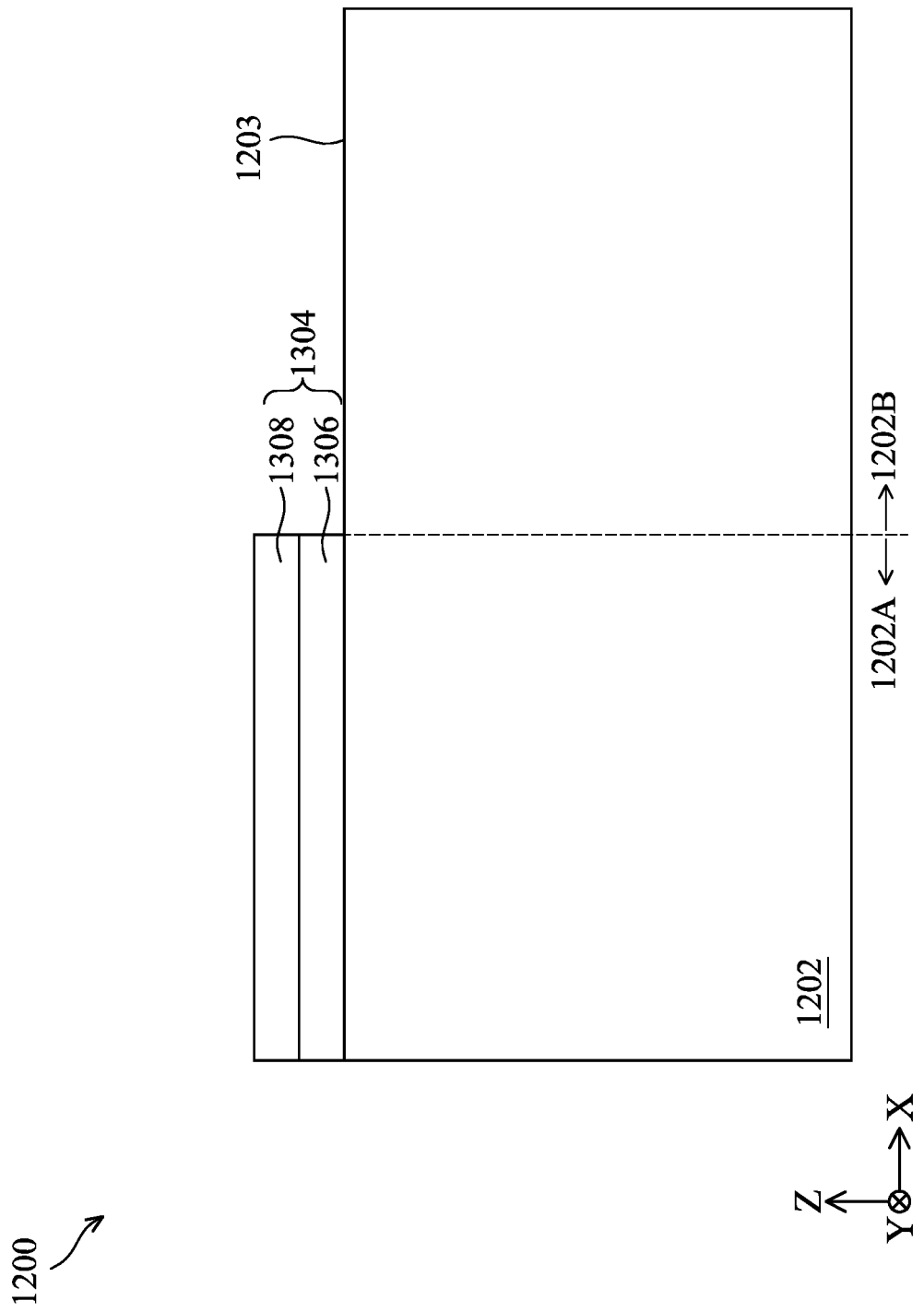

Corresponding to operation 1104 of FIG. 11, FIG. 13 is a cross-sectional view of the memory device 1200 that includes a patterned mask 1304 formed on a top surface 1203 of the semiconductor substrate 1202, at one of the various stages of fabrication.

The patterned mask 1304 covers a first region 1202A of the semiconductor substrate 1202 and includes an opening that exposes a second region 1202B of the semiconductor substrate 1202. In an embodiment, the first region 1202A may include an active region defined for forming one or more non-GAA transistors (e.g., 302 of FIG. 3, 402 of FIG. 4), which are configured as n-type transistors, and the second region 1202B may include an active region defined for forming one or more GAA transistors (e.g., 304 of FIG. 3, 404-406 of FIG. 4), which are also configured as n-type transistors. As such, the regions 1202A-B may be doped with p-type dopants. It is understood that the memory device 1200 may alternatively have p-type transistors form in the regions 1202A-B.

The patterned mask 1304 may be a soft mask such as a patterned resist layer, or a hard mask such as a dielectric material layer, or a combination thereof. In the illustrated embodiment of FIG. 13, the patterned mask 1304 includes a hard mask 1306 disposed on the region 1202A and a patterned resist layer 1308 formed on the hard mask 1306 by a lithography process. The hard mask 1306 is etched to transfer the opening from the patterned resist layer 1308 to the hard mask 1306. For example, the hard mask 1306 includes silicon oxide, silicon nitride, silicon oxynitride, silicon carbide, silicon carbide nitride, silicon carbide oxynitride, other semiconductor material, and/or other dielectric material. In an embodiment, the hard mask 1306 has a thickness ranging from about 1 nanometer (nm) to about 40 nm. The hard mask 1306 may be formed by thermal oxidation, chemical vapor deposition (CVD), atomic layer deposition (ALD), or any other appropriate method. An example photolithography process may include forming a resist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing. In some embodiments, the patterned resist layer 1308 may be directly used as an etch mask for the subsequent etch process. The patterned resist layer 1308 may be removed by a suitable process, such as wet stripping or plasma ashing, after the patterning of the hard mask 1306.

Figure 14:
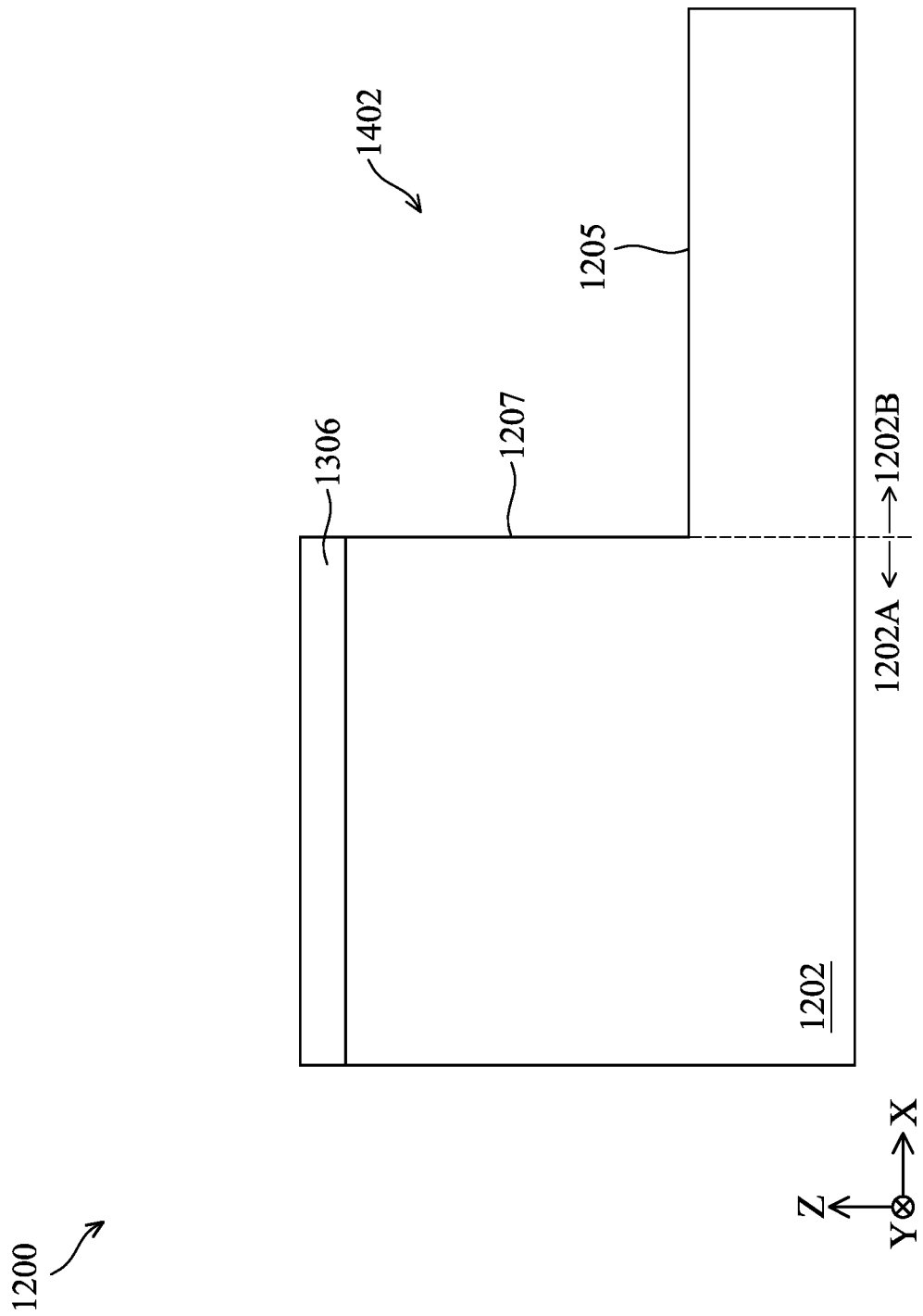

Corresponding to operation 1106 of FIG. 11, FIG. 14 is a cross-sectional view of the memory device 1200 in which the semiconductor substrate 1202 is etched to form a recess 1402, at one of the various stages of fabrication.

The semiconductor substrate 1202 in the second region 1202B is etched to form the recess 1402. The etching process is designed to selectively remove the semiconductor substrate 1202 in the second region 1202B using the hard mask 1306 as an etch mask. The etching process may be continued to ensure that a bottom surface 1205 of the semiconductor substrate 1202 is exposed in the recess 1402. A sidewall 1207 of the semiconductor substrate 1202 in the first region 1202A is also exposed defining an edge of the recess 1402. The etching process may include dry etch, wet etch, or a combination thereof. The patterned mask 1306 protects the semiconductor substrate 1202 within the first region 1202A from etching. In various examples, the etching process may include a dry etch with a suitable etchant, such as fluorine-containing etching gas or chlorine-containing etching gas, such as $Cl_2$, $CCl_2F_2$, $CF_4$, $SF_6$, $NF_3$, $CH_2F_2$ or other suitable etching gas. In some other examples, the etching process may include a wet etch with a suitable etchant, such as a hydrofluoric acid (HF) based solution, a sulfuric acid ($H_2SO_4$) based solution, a hydrochloric (HCl) acid based solution, an ammonium hydroxide ($NH_4OH$) based solution, other suitable etching solution, or combinations thereof. The etching process may include more than one step.

Figure 15:
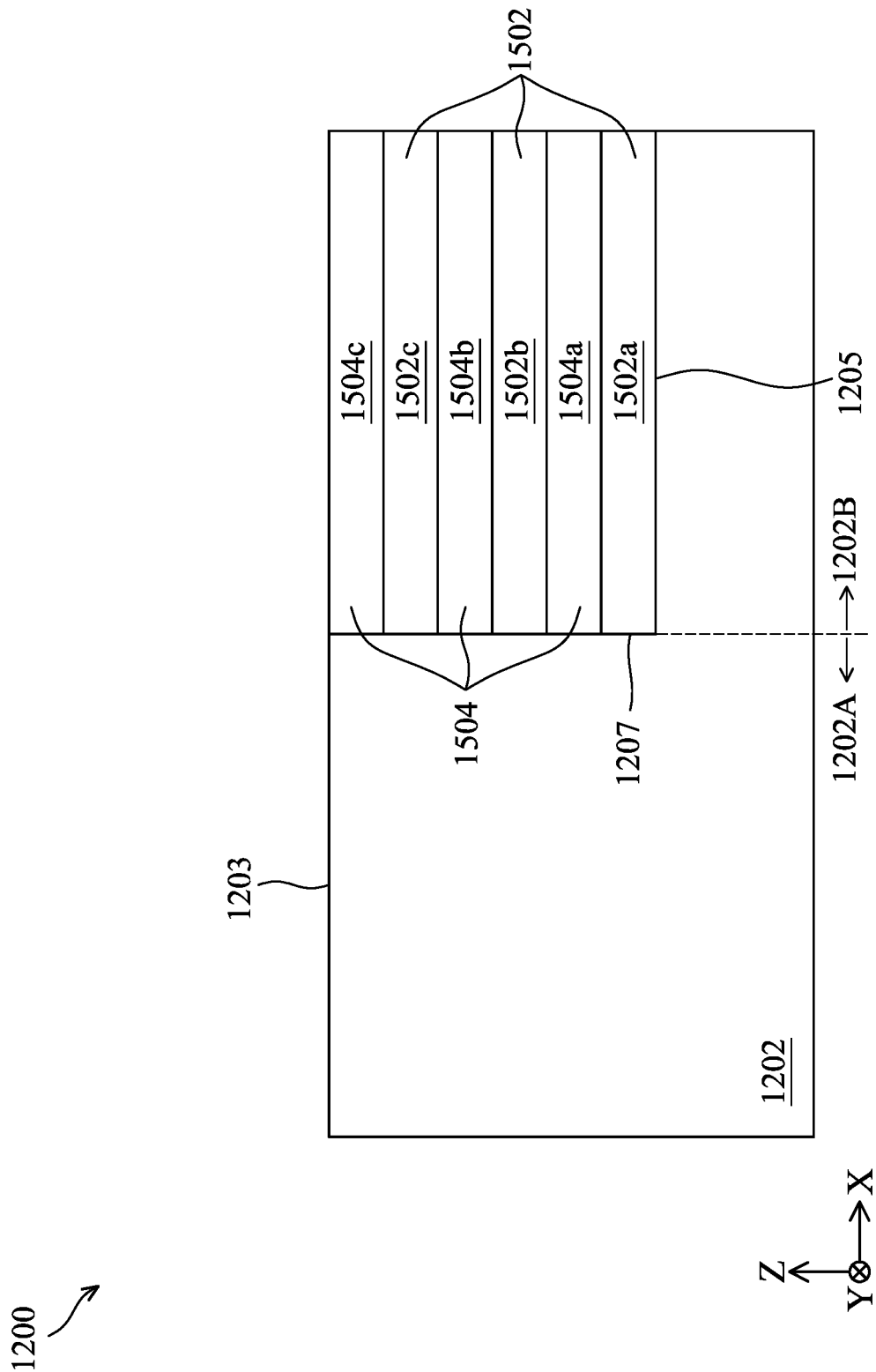

Corresponding to operation 1108 of FIG. 11, FIG. 15 is a cross-sectional view of the memory device 1200 that includes a number of first semiconductor layers 1502 (e.g., 1502a, 1502b, and 1502c) and a number of second semiconductor layers 1504 (e.g., 1504a, 1504b, and 1504c), at one of the various stages of fabrication.

In some embodiments, the first semiconductor layers 1502a-c and the second semiconductor layers 1504a-c are alternatingly disposed on top of one another (e.g., along the Z direction) in the recess 1402 (FIG. 14) to form a stack. For example, one of the second semiconductor layers, 1504a, is disposed over one of the first semiconductor layers, 1502a, then another one of the first semiconductor layers, 1502b, is disposed over the second semiconductor layer 1504a, so on and so forth.

In various embodiments, the stack may include any number of alternately disposed semiconductor layers 1502 and 1504. The semiconductor layers 1502 and 1504 may have different thicknesses. The semiconductor layers 1502 may have different thicknesses from one layer to another layer. The semiconductor layers 1504 may have different thicknesses from one layer to another layer. The thickness of each of the semiconductor layers 1502 and 1504 may range from few nanometers to few tens of nanometers. The first layer of the stack may be thicker than other semiconductor layers 1502 and 1504. For example, the layer 1502a may be thicker than other layers 1502b-c and 1504a-c. In an embodiment, each of the first semiconductor layers 1502a-c has a thickness ranging from about 5 nm to about 20 nm, and each of the second semiconductor layers 1504a-c has a thickness ranging from about 5 nm to about 20 nm.

The two semiconductor layers 1502 and 1504 have different compositions. In various embodiments, the two semiconductor layers 1502 and 1504 have compositions that provide for different oxidation rates and/or different etch selectivity between the layers. In an embodiment, the semiconductor layers 1502 include silicon germanium ($Si_{1-x}Ge_x$), and the semiconductor layers 1504 include silicon (Si). In an embodiment, each of the semiconductor layers 1504 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 1504 (e.g., of silicon). Alternatively, the semiconductor layers 1504 may be intentionally doped. For example, each of the semiconductor layers 1504 may be silicon that is doped with a p-type dopant such as boron (B), aluminum (Al), indium (In), and gallium (Ga) for forming a p-type channel, or an n-type dopant such as phosphorus (P), arsenic (As), antimony (Sb), for forming an n-type channel. In some embodiments, each of the semiconductor layers 1502 is $Si_{1-x}Ge_x$ that includes less than 50% (x<0.5) Ge in molar ratio. For example, Ge may comprise about 15% to 35% of the semiconductor layers 1502 of $Si_{1-x}Ge_x$ in molar ratio. Furthermore, the semiconductor layers 1502 may include different compositions among them, and the semiconductor layers 1504 may include different compositions among them.

In various embodiments, either of the semiconductor layers 1502 and 1504 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 1502 and 1504 may be chosen based on providing differing oxidation rates and/or etch selectivity. The semiconductor layers 1502 and 1504 may be doped or undoped, as discussed above.

In various embodiments, the semiconductor layers 1502 and 1504 are epitaxially grown from the bottom surface 1205 in the second region 1202B. For example, each of the semiconductor layers 1502 and 1504 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 1202 extends upwardly (e.g., along the Z direction), resulting in the semiconductor layers 1502 and 1504 having the same crystal orientation with the semiconductor substrate 1202.

In the first region 1202A, the hard mask 1306 (FIG. 14) can function as a capping layer on the top surface 1203 of the semiconductor substrate 1202, blocking epitaxial growth from taking place in the first region 1202A. Although not shown, an optional dielectric layer may be formed to extend along the sidewall 1207. As such, the dielectric layer can covers the sidewall 1207 thereby blocking epitaxial growth from originating from the sidewall 1207 so that the epitaxially growth does not take place in lateral direction from the sidewall 1207 into the second region 1202B. Therefore, in some embodiments, the epitaxial growth of the semiconductor layers 1502 and 1504 are limited in the second region 1202B. In some embodiments, after forming a desired number of the semiconductor layers 1502 and 1504 (e.g., the third semiconductor layer 1504c), a polishing process (e.g., a chemical mechanical polishing (CMP) process) may be performed to level the first and second regions 1202A and 1202B.

Figure 16:
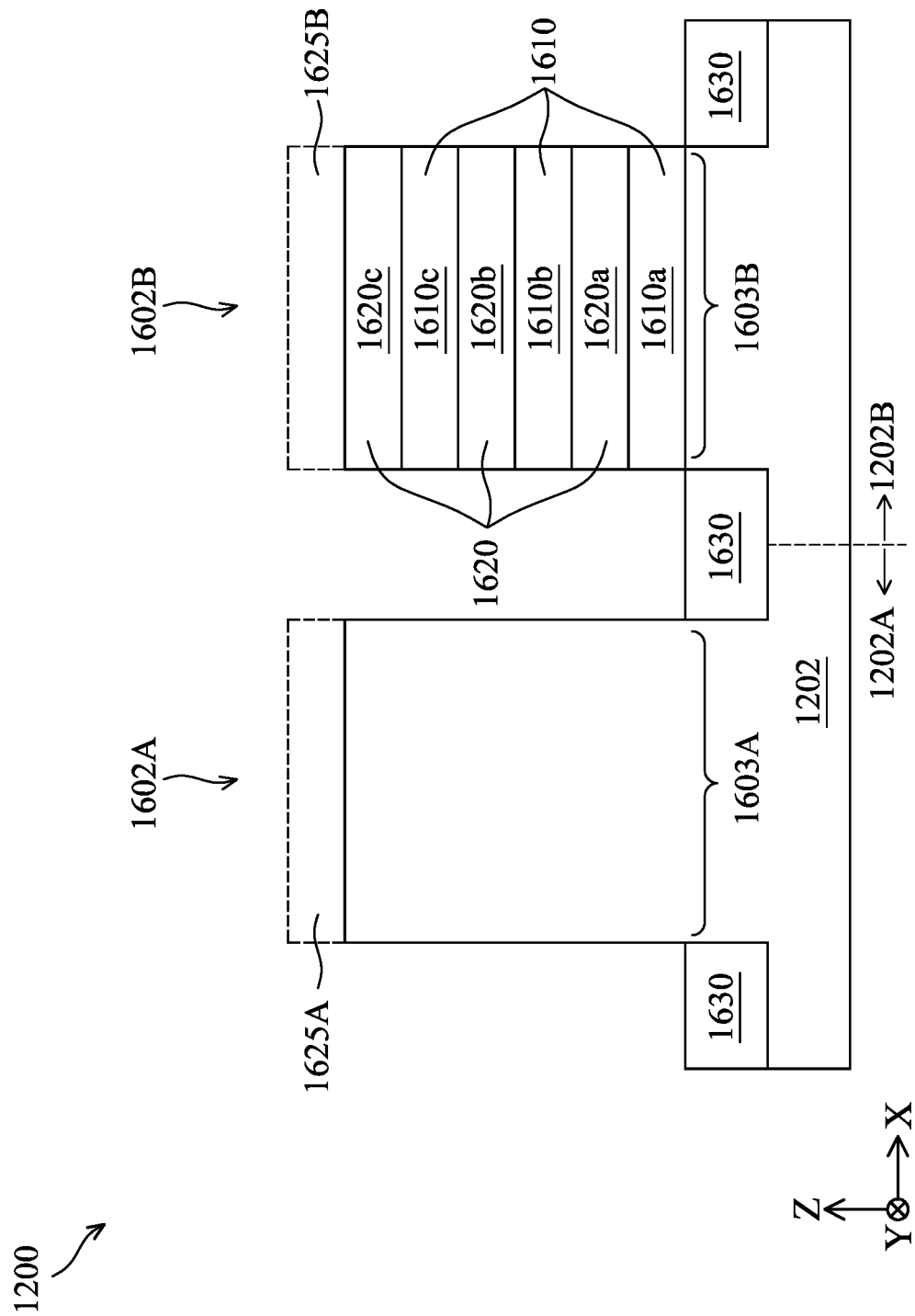

Corresponding to operation 1110 of FIG. 11, FIG. 16 is a cross-sectional view of the memory device 1200 that includes a first active structure 1602A and a second active structure 1602B, at one of the various stages of fabrication.

The first active structure 1602A may be formed in the region 1202A where no alternatingly stacked semiconductor layers (e.g., 1502 and 1504) are formed, and the second active structure 1602B may be formed in the region 1202B where the alternatingly stacked semiconductor layers (e.g., 1502 and 1504) are formed. As will be discussed below, a corresponding region of the first active structure 1602A is such defined as a region or footprint where one or more non-GAA transistors (e.g., 302 of FIG. 3, 402 of FIG. 4) are to be formed (hereinafter "first active region 1603A"), and a corresponding region of the second active structure 1602B is such defined as a region or footprint where one or more GAA transistors (e.g., 304 of FIG. 3, 404-406 of FIG. 4) are to be formed (hereinafter "second active region 1603B").

As shown in FIG. 16, the first active structure 1602A is formed as a fin-based structure protruding from the semiconductor substrate 1202, and the second active structure 1602B is formed as an alternating-semiconductor layer column disposed over the semiconductor substrate 1202. In some embodiments, the first active structure 1602A may be an integrally contiguous structure extended from the semiconductor substrate 1202. The first active structure 1602A may be elongated along a lateral direction (e.g., the X direction). The second active structure 1602B includes a stack of semiconductor layers 1610 and 1620 interleaved with each other.

In the formation of the first active structure 1602A and the second active structure 1602B, patterned masks 1625A and 1625B (shown in dotted lines) can be formed over the semiconductor substrate 1202 in the regions 1202A and 1202B, respectively. The patterned masks 1625A and 1625B can define the footprint of the first active structure 1602A and the second active structure 1602B (e.g., by masking the to-be formed active structures 1602A-B), and one or more etching processes can be applied to the semiconductor substrate 1202 in the first region 1202A and the semiconductor layers 1502 and 1504 in the second region 1202B, respectively, to form the first active structure 1602A and the second active structure 1602B. Accordingly, the first and second active regions 1603A and 1603B can be defined. In some embodiments, the semiconductor layers 1610a, 1620a, 1610b, 1620b, 1610c, and 1620c may be the remaining portions of the semiconductor layers 1502a, 1504a, 1502b, 1504b, 1502c, and 1504c, respectively. Upon the formation of the first active structure 1602A and the second active structure 1602B, the patterned masks 1625A-B may be removed.

The one or more etching processes may include one or more dry etching processes, wet etching processes, and other suitable etching techniques. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF), potassium hydroxide (KOH) solution, ammonia, a solution containing hydrofluoric acid (HF), nitric acid (HNO$_3$), and/or acetic acid (CH$_3$COOH), or other suitable wet etchant.

In some embodiments, the patterned masks 1625A-B used to form the active structures 1602A-B may be formed in accordance with the respective active features of a layout. In various embodiments, any of the layouts 500-1000 of FIGS. 5-10 can be used to form the active structures 1602A-B, and corresponding active regions 1603A-B. For example, upon growing the semiconductor layers 1502 and 1504 in the corresponding region over a semiconductor substrate (FIG. 15), the active features 502A and 502B, as shown in FIGS. 5-8, can be used to form the first and second active structures, 1602A and 1602B, respectively, and accordingly to define the first and second active regions, 1603A and 1603B, respectively. In another example, upon growing the semiconductor layers 1502 and 1504 in the corresponding region over a semiconductor substrate (FIG. 15), the active features 902A and 902B, as shown in FIGS. 9-10, can be used to form the first and second active structures, 1602A and 1602B, respectively, and accordingly to define the first and second active regions, 1603A and 1603B, respectively.

After forming the active structures 1602A-B, one or more isolation structures 1630 may be formed between the active structures 1602A-B. The isolation structure 1630, which are formed of an insulation material, can electrically isolate neighboring active structures from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process, may remove any excess insulation material and form a top surface of the insulation material and a top surface of the patterned masks 1625A-B that are coplanar (not shown). The patterned masks 1625A-B may also be removed by the planarization process.

Next, the insulation material is recessed to form the isolation structures 1630, as shown in FIG. 16, which are sometimes referred to as shallow trench isolations (STIs). The isolation structures 1630 are recessed such that the active structures 1602A-B protrude from between neighboring isolation structures 1630. Respective top surfaces of the isolation structures (STIs) 1630 may have a flat surface (as illustrated), a convex surface, a concave surface (such as dishing), or combinations thereof. The top surfaces of the isolation structures 1630 may be formed flat, convex, and/or concave by an appropriate etch. The isolation structures 1630 may be recessed using an acceptable etching process, such as one that is selective to the material of the isolation structures 1630. For example, a dry etch or a wet etch using dilute hydrofluoric (DHF) acid may be performed to recess the isolation structures 1630.

Figure 17:
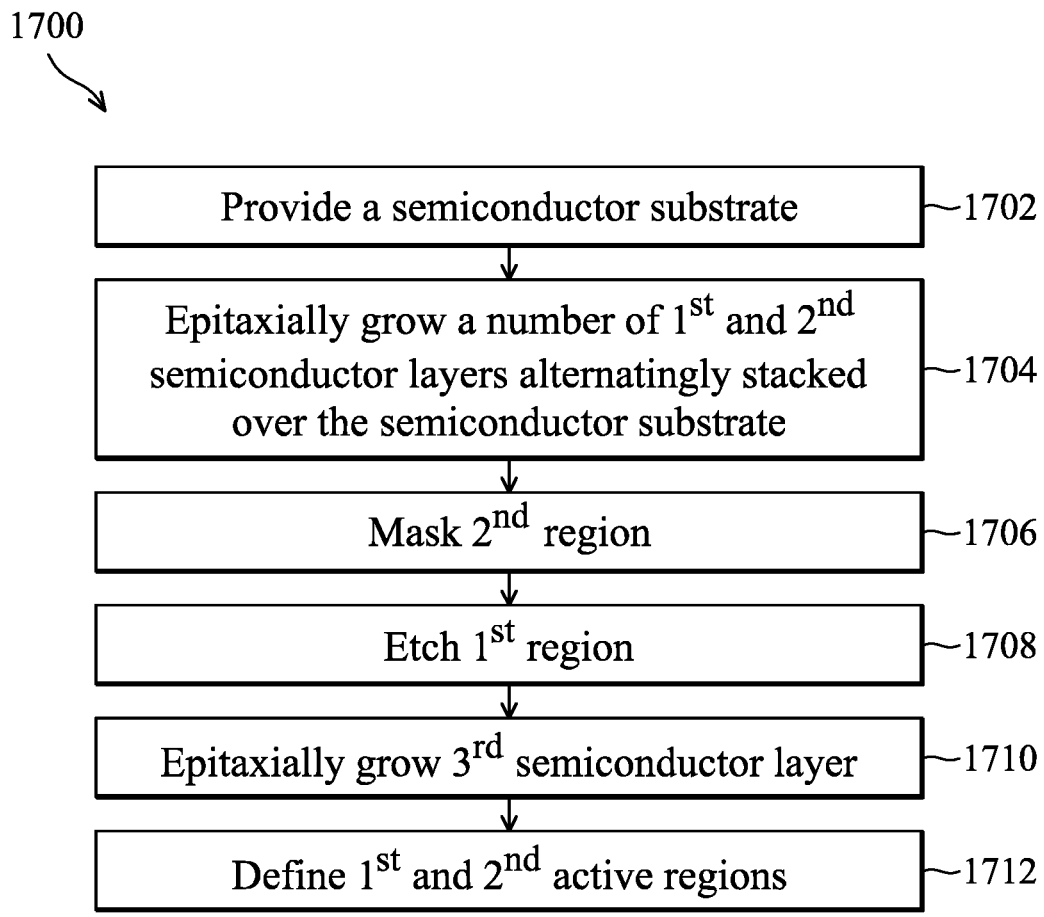
FIG. 17 illustrates a flow chart of another example method to define a first active region and a second active region for the memory device, in accordance with some embodiments.

FIG. 17 illustrates a flowchart of another method 1700 to define the first active region 1603A and the second active region 1603B, according to one or more embodiments of the present disclosure. Similar as the method 1100 of FIG. 11, the method 1700 may be followed by the method 1800 of FIG. 18 to form one or more non-GAA transistors and one or more GAA transistors in the first active region and second active region, respectively, which will be discussed in further detail below. The operations of the method 1700 will be briefly discussed as follows, with reference to the cross-sectional views of FIGS. 12-16.

For example, the method 1700 starts with operation 1702 in which the semiconductor substrate 1202 is provided (FIG. 12). Next, different from the method 1100 (e.g., instead of growing the semiconductor layers 1502 and 1504 in the recess 1402), the method 1700 proceeds to operation 1704 in which the first semiconductor layers 1502 and the second semiconductor layers 1504 are epitaxially grown over the semiconductor substrate 1202. The first and second semiconductor layer 1502 and 1504 are alternatingly stacked on top of one another. Next, the method 1700 proceeds to operation 1706 in which the second region 1202B is masked, followed by operation 1708 in which the first region 1202A is etched to form a recess. Next, in operation 1710, a third semiconductor layer, similar to the second semiconductor layer, is epitaxially grown in the recess of the first region. Upon growing the third semiconductor layer in the first region, similar as the method 1100, the method 1700 proceeds to operation 1712 in which the first active structure 1602A and the second active structure 1602B are defined.

Figure 18:
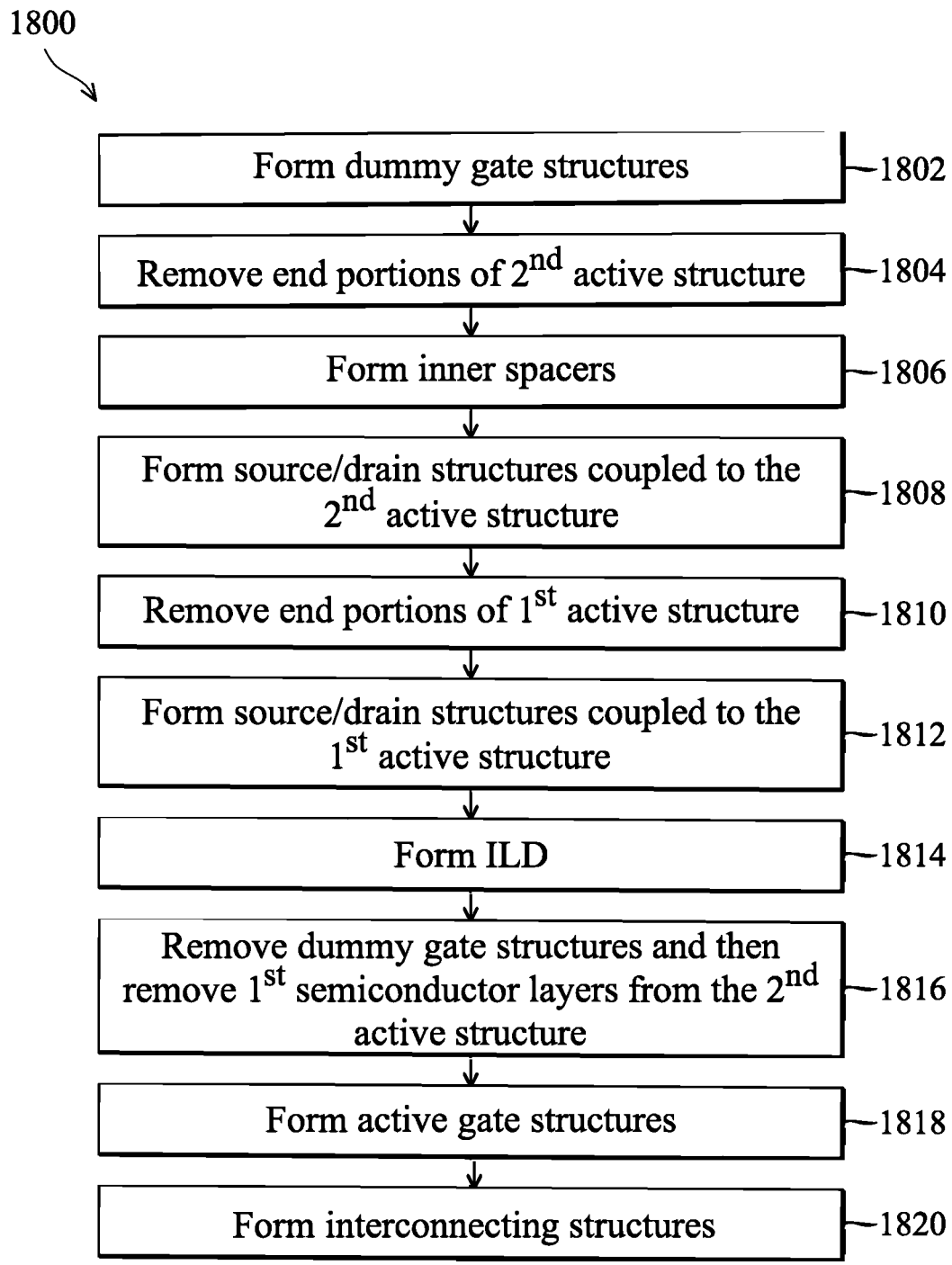
FIG. 18 illustrates a flow chart of an example method to follow the method of either FIG. 11 or FIG. 17 to make the memory device, in accordance with some embodiments.

As mentioned above, either of the methods 1100 (FIG. 11) and 1700 (FIG. 17) can be followed by the method 1800 (FIG. 18). In various embodiments, the operations of the method 1800 can form one or more non-GAA transistors and one or more GAA transistors in the first active region 1603A and second active region 1603B, respectively.

Referring to FIG. 18, a flowchart of the method 1800 to form at least one non-GAA transistor and at least one GAA transistor in the first active region 1603A and second active region 1603B, respectively, is depicted, according to one or more embodiments of the present disclosure. The operations of the method 1800 may be associated with cross-sectional views of the memory device 1200 at respective fabrication stages as shown in FIGS. 19A, 19B, 19C, 20, 21, 22, 23, 24, 25, 26, 27A, 27B, 27C, and 28. The cross-sectional view of FIGS. 19A, 20-27A, and 28 may be cut along line A-A' as shown in FIGS. 3 and 4; FIGS. 19B and 27B may be cut along line B-B' as shown in FIGS. 3 and 4; and FIGS. 19C and 27C may be cut along line C-C' as shown in FIGS. 3 and 4. FIGS. 19A-28 are simplified for a better understanding of the concepts of the present disclosure, and thus, it is understood the memory device 1200 may include a number of other devices such as inductors, resistor, capacitors, transistors, etc., which are not shown in FIGS. 19A-28, for purposes of clarity of illustration.

In brief overview, the method 1800 starts with operation 1802 in which dummy gate structures are formed. Next, the method 1800 proceeds to operation 1804 in which end portions of the second active structure are removed. Next, the method 1800 continues to operation 1806 in which inner spacers are formed in the second active structure. Next, the method 1800 continues to operation 1808 in which source/drain structures coupled to the second active structure are formed. Next, the method 1800 continues to operation 1810 in which end portions of the first active structure are removed. Next, the method 1800 continues to operation 1812 source/drain structures coupled to the first active structure are formed. Next, the method 1800 continues to operation 1814 in which an ILD is formed. Next, the method 1800 continues to operation 1816 in which the dummy gate structures are first removed and the first semiconductor layers are then removed from the second active structure. Next, the method 1800 continues to operation 1818 in which active gate structures are formed. Next, the method 1800 continues to operation 1820 in which interconnecting structures are formed.

Figure 19A:
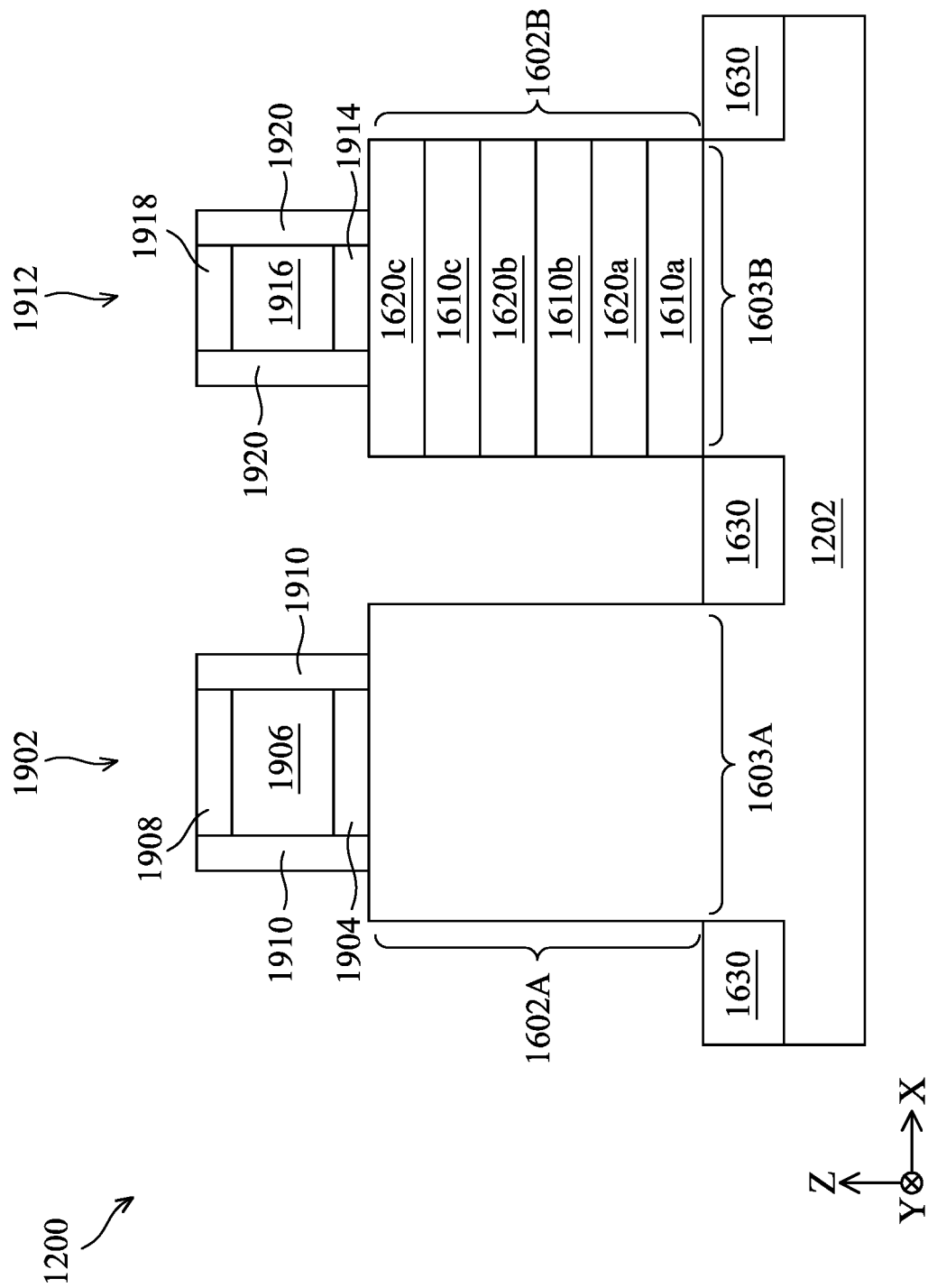
FIGS. 19A, 19B, 19C, 20, 21, 22, 23, 24, 25, 26, 27A, 27B, 27C, and 28 illustrate cross-sectional views of the memory device, made by the method of FIG. 18, at various fabrication stages, in accordance with some embodiments.
Figure 19B:
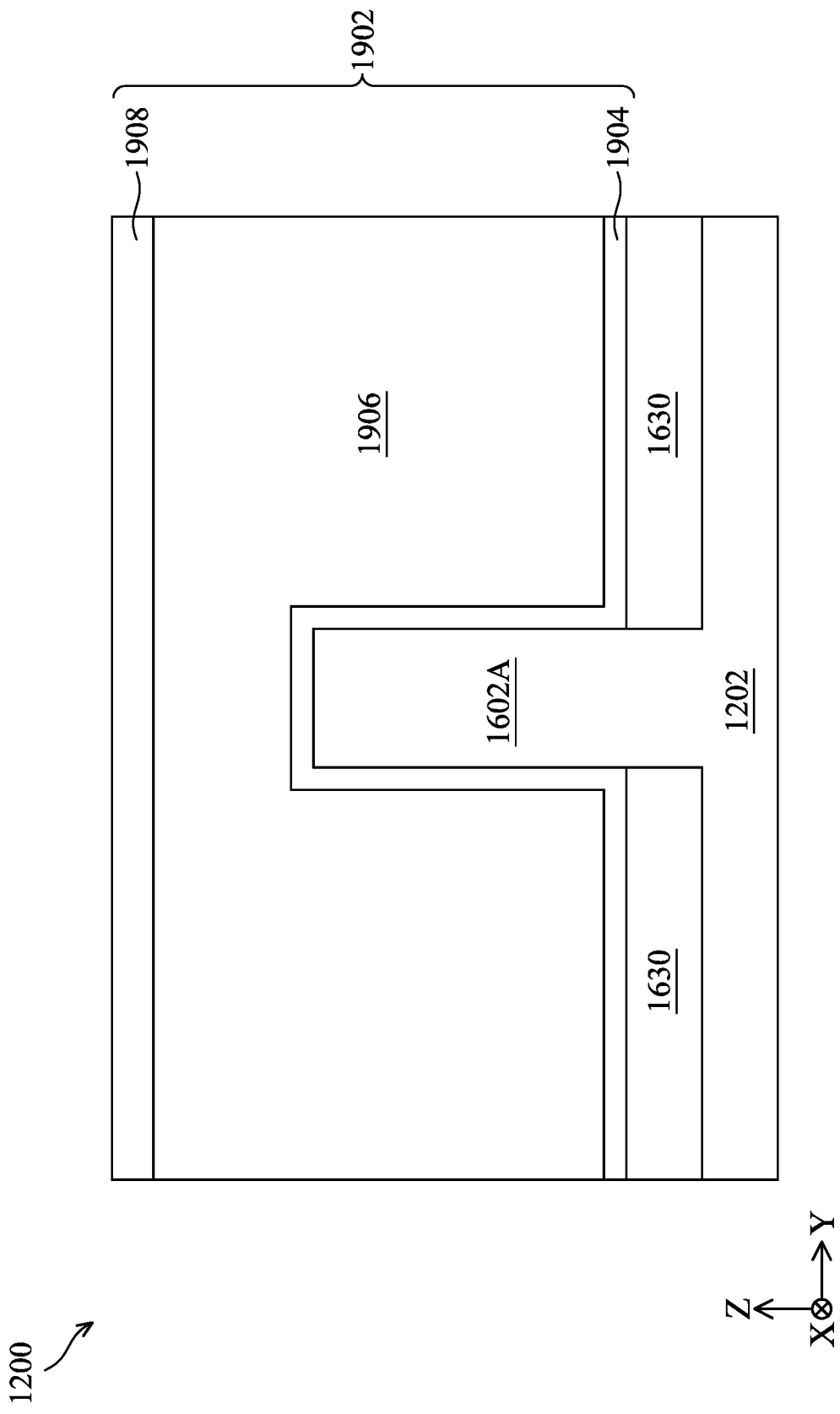

Corresponding to operation 1802 of FIG. 18, FIG. 19A is a cross-sectional view of the memory device 1200, cut along line A-A' (e.g., as indicated in FIGS. 3-4), that includes a first dummy gate structure 1902 and a second dummy gate structure 1912, at one of the various stages of fabrication. For clarity of illustration, FIG. 19B illustrates a corresponding cross-sectional view of the memory device 1200, cut along line B-B' (e.g., as indicated in FIGS. 3-4); and FIG. 19C illustrates a corresponding cross-sectional view of the memory device 1200, cut along line C-C' (e.g., as indicated in FIGS. 3-4).

Each of the dummy gate structures includes a dummy gate dielectric, a dummy gate, and a hard mask. For example in FIGS. 19A and 19B, the first dummy gate structure 1902 includes a dummy gate dielectric 1904 formed over the first active structure 1602A, a dummy gate 1906 formed over the dummy gate dielectric 1904, and a hard mask 1908 formed over the dummy gate 1906; and for example in FIGS. 19A and 19C, the second dummy gate structure 1912 includes a dummy gate dielectric 1914 formed over the second active structure 1602B, a dummy gate 1916 formed over the dummy gate dielectric 1914, and a hard mask 1918 formed over the dummy gate 1916.

Figure 19C:
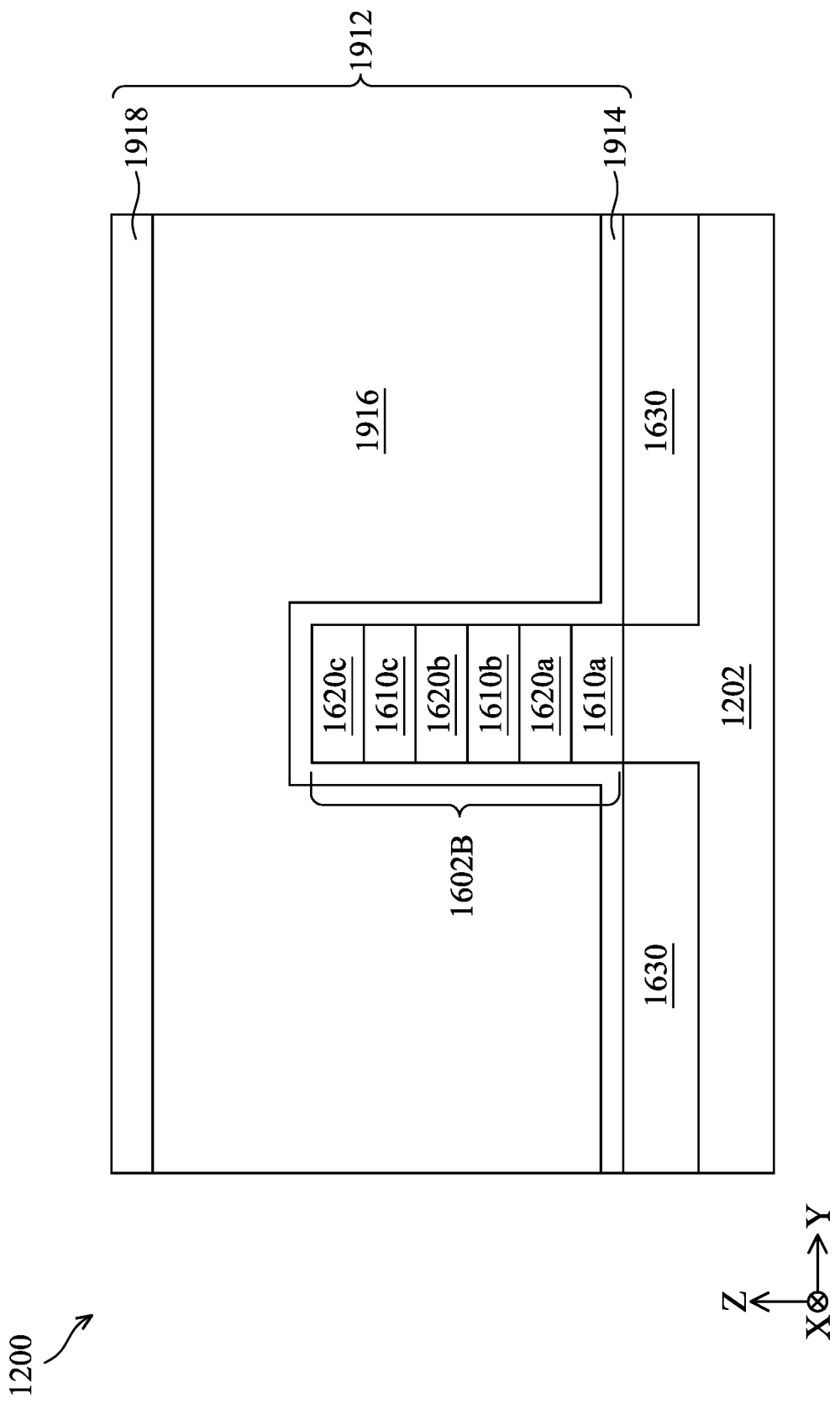

As shown in in FIGS. 19A-C, the dummy gate structure 1902 is formed over a top surface and around sidewalls of the first active structure 1602A; and the dummy gate structure 1912 is formed over a top surface and around sidewalls of the second active structure 1602B. To form the dummy gate structure 1902 (which is used as a representative example), a dielectric layer is formed over the first active structure 1602A. The dielectric layer may be, for example, silicon oxide, silicon nitride, multilayers thereof, or the like, and may be deposited or thermally grown. A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using acceptable photolithography and etching techniques to form the hard mask 1908. The pattern of the hard mask 1908 then may be transferred to the gate layer and the dielectric layer by an acceptable etching technique to form the dummy gate 1906 and the underlying dummy gate dielectric 1904, respectively. The dummy gate structure 1912 can be concurrently or respectively formed using the similar operations, as discussed above.

After forming the dummy gate structures 1902 and 1912, gate spacers 1910 and 1920 may be formed to extend along respective sidewalls of the dummy gate structures 1902 and 1912, as illustrated in FIG. 19A. The gate spacers 1910-1920 can be formed using a spacer pull down formation process. The gate spacers 1910-1920 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., ME).

In some embodiments, the dummy gate structures 1902 and 1912 may be formed according to the gate features of each of the layouts 500-1000 (FIGS. 5-10). Using the layout 500 of FIG. 5 as an example, the patterns of the hard masks 1908 and 1918 may be formed according to the gate features 504 and 506, respectively. As such, the dummy gate structure 1902 can straddle or otherwise cover a central portion (e.g., the channel of a subsequently formed non-GAA transistor of the memory device 1200) of the first active structure 1602A, which is formed based on the active feature 502A; and the dummy gate structure 1912 can straddle or otherwise cover a central portion (e.g., the channel of a subsequently formed GAA transistor of the memory device 1200) of the second active structure 1602B, which is formed based on the active feature 502B. Further, each of the dummy gate structures 1902 and 1912 may have a lengthwise direction (e.g., along the Y direction) substantially perpendicular to the lengthwise direction (e.g., along the X direction) of the active structures 1602A-B. In various embodiments, the dummy gate structures 1902 and 1912 may be subsequently replaced by respective active gate structures, with the gate spacers 1910 and 1920 substantially intact. Consequently, when the memory device 1200 is finished, such active gate structures may function as the gates of a non-GAA transistor and a GAA transistor, respectively, of the memory device 1200 (similar as the memory device 300 of FIG. 3), which will be further shown in FIGS. 27A-C.

Although two dummy gate structures are shown in FIGS. 19A-C, it is understood that the memory device 1200 can have more than two dummy gate structures while remaining within the scope of the present disclosure. For example, when using the layouts 600-700 of FIGS. 6-7 to form dummy gate structures, in addition to the dummy gate structures over the active structures (formed based on the gate features 504 and 506), at least one dummy gate structure can be formed between the active structures based on the gate feature 604. Such an additional dummy gate structure, also with a gate spacer extending along its sidewalls, can be formed over the isolation structure 1630 between the active structures 1602A-B and may not be replaced by an active gate structure. Consequently, when the memory device 1200 is finished, this "remaining" dummy gate structure may be disposed between a non-GAA transistor and a GAA transistor of the memory device 1200 (similar as the memory device 300 of FIG. 3 except for including at least one additional dummy gate structure), which will be further shown in FIG. 29.

In another example, when using the layout 900 of FIG. 9 to form dummy gate structures, at least three dummy gate structures can be formed. The patterns of the hard masks 1908 and 1918 shown in FIGS. 19A-C may be formed according to the gate features 904 and 906, respectively. As such, the dummy gate structure 1902 can straddle or otherwise cover a central portion (e.g., the channel of a subsequently formed non-GAA transistor of the memory device 1200) of the first active structure 1602A, which is formed based on the active feature 902A; and the dummy gate structure 1912 can straddle or otherwise cover a first portion (e.g., the channel of one of two subsequently formed GAA transistors of the memory device 1200) of the second active structure 1602B, which is formed based on the active feature 902B. Additionally, the pattern of a third hard mask (not shown) may be formed according to the gate feature 908, and thus, another dummy gate structure (not shown) can straddle or otherwise cover a second portion (e.g., the channel of the other of two subsequently formed GAA transistors of the memory device 1200) of the second active structure 1602B. In various embodiments, these three dummy gate structures may be subsequently replaced by respective active gate structures, with the corresponding gate spacers substantially intact. Consequently, when the memory device 1200 is finished, such active gate structures may function as the gates of a non-GAA transistor, a first GAA transistor, and a second GAA transistor, respectively, of the memory device 1200 (similar as the memory device 400 of FIG. 4), which will be further shown in FIG. 30.

In yet another example, when using the layout 1000 of FIG. 10 to form dummy gate structures, in addition to the three dummy gate structures over the active structures (formed based on the gate features 904, 906, and 908), at least one dummy gate structure can be formed between the active structures based on the gate feature 1004. Such an additional dummy gate structure, also with a gate spacer extending along its sidewalls, can be formed over the isolation structure 1630 between the active structures 1602A-B and may not be replaced by an active gate structure. Consequently, when the memory device 1200 is finished, this "remaining" dummy gate structure may be disposed between a non-GAA transistor and two GAA transistors of the memory device 1200 (similar as the memory device 400 of FIG. 4 except for including at least one additional dummy gate structure), which will be further shown in FIG. 31.

Although the dummy gate structure 1902 shown in FIGS. 19A-C straddles the active structure 1602A with its sidewalls along the X direction exposed, it is understood that the memory device 1200 can include the dummy gate structure further extending one of the sidewalls along the X direction, while remaining within the scope of the present disclosure. For example, when using the layout 800 of FIG. 8 to form dummy gate structures, as the gate feature 504 only travels across an end portion of the active feature 802A (used to form the first active structure 1602A), the dummy gate structure 1902, in addition to straddling the top surface and sidewalls (along the Y direction) of the first active structure 1602A, may extend along one of the sidewalls (along the X direction) that faces opposite to the second active structure 1602B. In various embodiments, the dummy gate structures 1902 and 1912 may be subsequently replaced by respective active gate structures, with the gate spacers 1910 and 1920 substantially intact. Consequently, when the memory device 1200 is finished, such active gate structures may function as the gates of a non-GAA transistor and a GAA transistor, respectively, of the memory device 1200. Specifically, the non-GAA transistor may have only one source/drain structure formed opposite to the sidewall along which the corresponding active gate structure extends (similar as the memory device 300 of FIG. 3 except for not including the source/drain structure 316), which will be further shown in FIG. 32. In some embodiments, such a transistor with only one source/drain structure is sometimes referred to as a MOS capacitor.

In the following discussions of the method 1800 for making the memory device 1200, the layout 500 of FIG. 5 will be focused. In other words, the cross-sectional views of the memory device 1200 in FIGS. 20-28 will not illustrate an additional dummy gate structure between active structures 1602A-B, a third active/dummy gate structure formed over the second active structure 1602B, or a MOS capacitor. The cross-sectional view of such other embodiments of the memory device 1200, which can be formed based on the layouts shown in FIGS. 6-10, will be shown in FIGS. 29-32, respectively.

Figure 20:
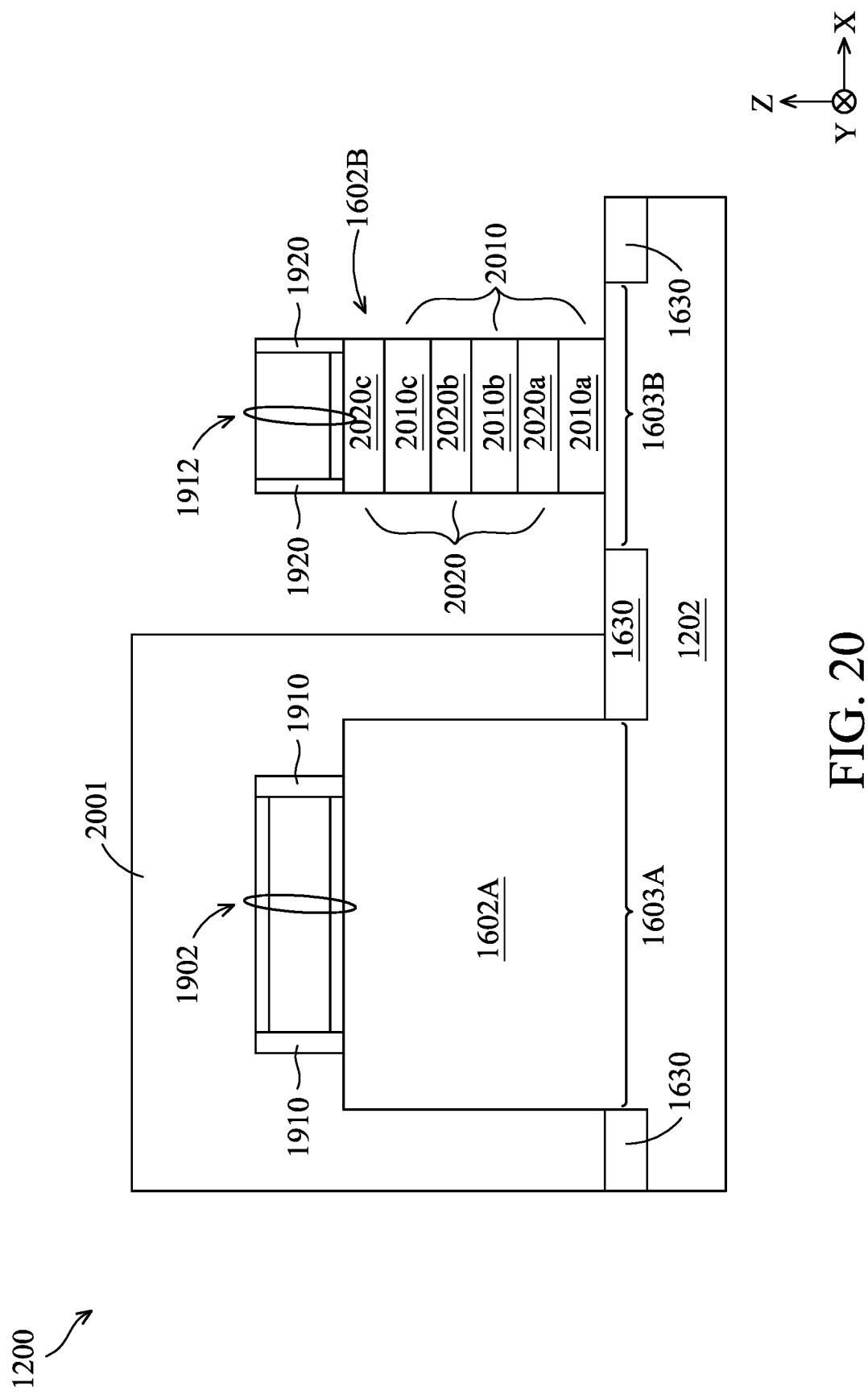

Corresponding to operation 1804 of FIG. 18, FIG. 20 is a cross-sectional view of the memory device 1200, cut along line A-A' (e.g., as indicated in FIGS. 3-4), in which end portions of the second active structure 1602B (along the X direction) are removed, at one of the various stages of fabrication.

In some embodiments, when removing the end portions of the second active structure 1602B, the first active structure 1602A (or the first active region 1603A) may be covered by a blocking mask 2001. The blocking mask 2001 is formed to overlay the first active structure 1602A while remaining the second active structure 1602B exposed. The blocking mask 2001 may be formed to have a sufficiently great thickness (or height) such that the top surface and sidewalls of the first active structure 1602A are fully covered, as shown in FIG. 20. Formation of the blocking mask 2001 may allow one or more processes, which will be discussed below, to be performed on the second active structure 1602B only. The blocking mask 2001 may be formed of a material relatively resistant to etchants that can etch SiGe such as, for example, silicon oxide, silicon nitride, silicon oxynitride, SiBCN, SiOCN, SiOC, or any suitable combinations of those materials.

Upon covering the first active structure 1602A (or the first active region 1603A) with the blocking mask 2001, the dummy gate structure 1912 together with the gate spacer 1920 can be used as a mask to etch the end portions of the second active structure 1602B, which results in the second active structure 1602B in the second active region 1603B having an alternatingly stack of the remaining portions of the semiconductor layers 1610 and 1620. For example, semiconductor layers 2010a, 2020a, 2010b, 2020b, 2010c, and 2020c of the second active structure 1602B, as shown in FIG. 20, are the remaining portions of the semiconductor layers 1610a, 1620a, 1610b, 1620b, 1610c, and 1620c, respectively. In some embodiments, the semiconductor layers 2010a-c and 2020a-c may sometimes be referred to as nanostructures 2010a-c and 2020a-c.

Figure 21:
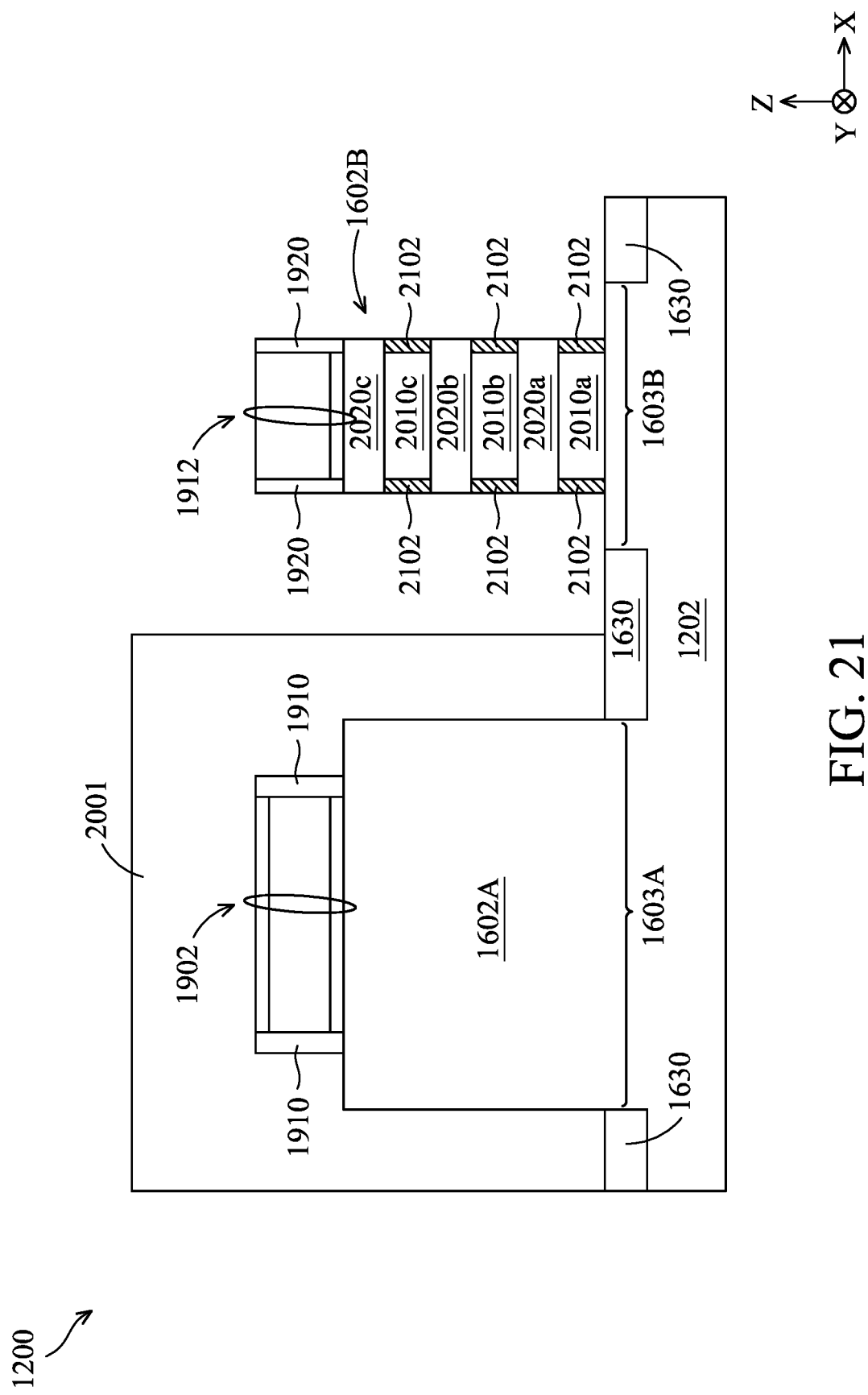

Corresponding to operation 1806 of FIG. 18, FIG. 21 is a cross-sectional view of the memory device 1200, cut along line A-A' (e.g., as indicated in FIGS. 3-4), that includes inner spacers 2102 formed along respective etched ends of each of the semiconductor layers 2010a-c (along the X direction), at one of the various stages of fabrication.

To form the inner spacers 2102, respective end portions of each of the semiconductor layers 2010a-c may first be removed. During the removal of the respective end portions of the semiconductor layers 2010a-c, the first active structure 1602A may remain covered by the blocking mask 2001, which allows the first active structure 1602A to remain intact. The end portions of the semiconductor layers 2010a-c can be removed (e.g., etched) using a "pull-back" process to pull the semiconductor layers 2010a-c back by an initial pull-back distance such that the ends of the semiconductor layers 2010a-c terminate underneath (e.g., aligned with) the gate spacer 1920. Although in the illustrated embodiment of FIG. 21, the etched ends of each of the semiconductor layers 2010a-c are approximately aligned with the sidewalls of the gate spacer 1920, it is understood that the pull-back distance (i.e., the extent to which each of the semiconductor layers 2010a-c is etched, or pulled-back) can be arbitrarily increased or decreased. In an example where the semiconductor layers 2020a-c include Si, and the semiconductor layers 2010a-c include $Si_{1-x}Ge_x$, the pull-back process may include a hydrogen chloride (HCL) gas isotropic etch process, which etches SiGe without attacking Si. As such, the semiconductor layers 2020a-c may remain intact during this process.

Next, the inner spacers 2102 can be formed along the etched ends of each of the semiconductor layers 2010a-c, with the first active structure 1602A covered by the blocking mask 2001. In some embodiments, the inner spacers 2102 can be formed conformally by chemical vapor deposition (CVD), or by monolayer doping (MLD) of nitride followed by spacer RIE. The inner spacers 2102 can be deposited using, e.g., a conformal deposition process and subsequent isotropic or anisotropic etch back to remove excess spacer material on the sidewalls of the second active structure 1602B and on a surface of the semiconductor substrate 1202. A material of the inner spacers 2102 can be formed from the same or different material as the gate spacer 1920 (e.g., silicon nitride). For example, the inner spacers 2102 can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Figure 22:
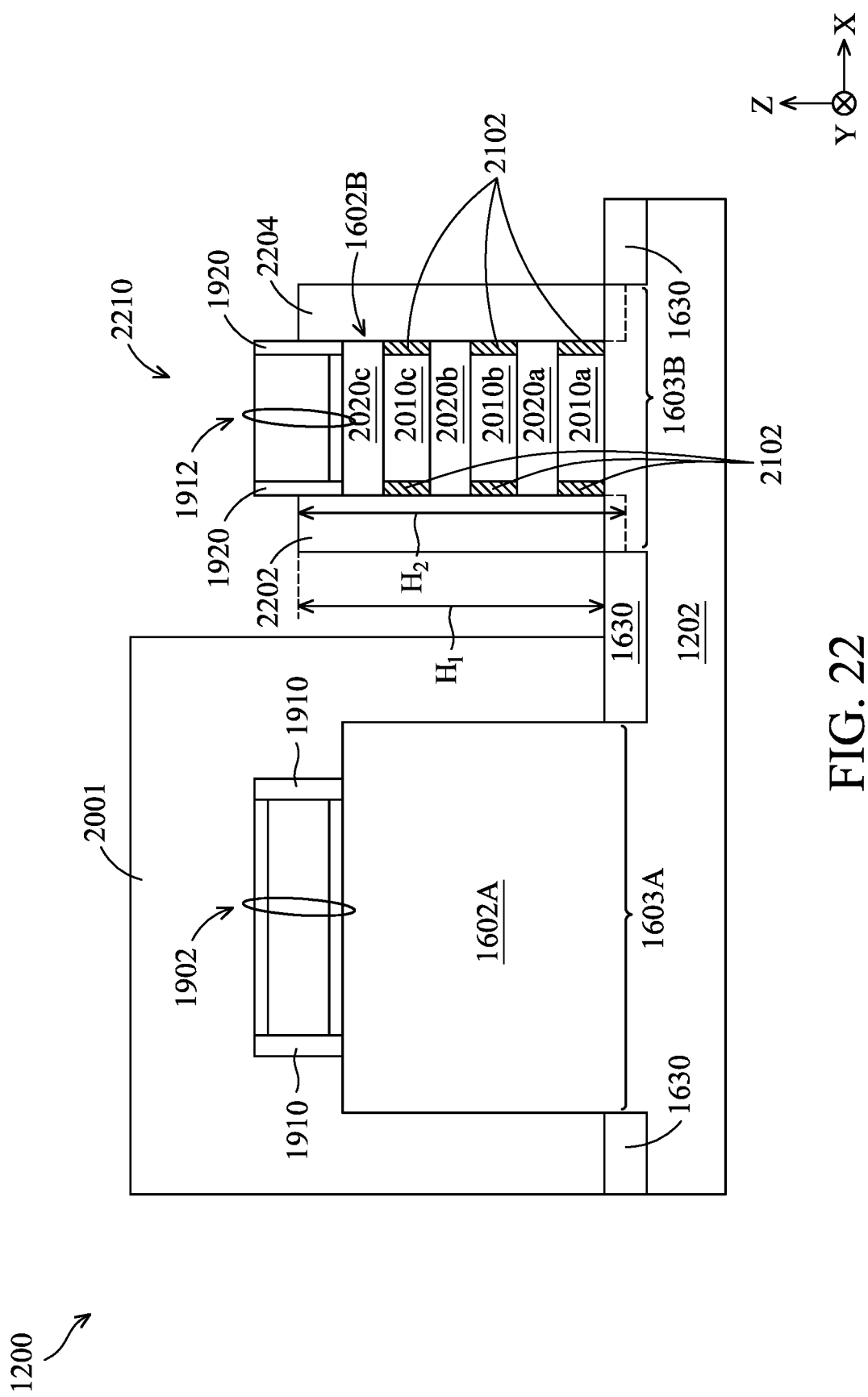

Corresponding to operation 1808 of FIG. 18, FIG. 22 is a cross-sectional view of the memory device 1200, cut along line A-A' (e.g., as indicated in FIGS. 3-4), that includes source/drain structures 2202 and 2204 in the second active region 1603B, at one of the various stages of fabrication. The source/drain structures 2202 and 2204 are coupled to respective ends of the second active structure 1602B.

During the formation of the source/drain structures 2202 and 2204, the first active structure 1602A may remain covered by the blocking mask 2001. The source/drain structures 2202 and 2204 may be formed using an epitaxial layer growth process on exposed ends of each of the semiconductor layers 2020a-c. In some embodiments, a bottom surface of the source/drain structures 2202 and 2204 may be leveled with the top surface of the isolation structure 1630, as shown in solid lines of FIG. 22. Accordingly, the source/drain structures 2202 and 2204 may have a height, $H_1$. In some other embodiments, the bottom surface of the source/drain structures 2202 and 2204 may be lower than the top surface of the isolation structure 1630, as shown in dotted lines of FIG. 22. Accordingly, the source/drain structures 2202 and 2204 may have a height, $H_2$.

The source/drain structures 2202 and 2204 are electrically coupled to the semiconductor layers 2020a-c. In various embodiments, the semiconductor layers 2020a-c may collectively function as the channel of a GAA transistor, hereinafter GAA transistor 2210. It is noted that at this stage of fabrication, the GAA transistor 2210 is not finished yet, in some embodiments. Referring again to FIG. 3, the GAA transistor 2210, upon being finished, may be similar to the GAA transistor 304. Accordingly, the semiconductor layers 2020a-c may correspond to the semiconductor layers 342a-c, respectively; and the source/drain structures 2202 and 2204 may correspond to the source/drain structures 320 and 322, respectively.

In-situ doping (ISD) may be applied to form doped source/drain structures 2202 and 2204, thereby creating the junctions for the GAA transistor 2210. N-type and p-type FETs are formed by implanting different types of dopants to selected regions (e.g., the source/drain structures 2202 and 2204) of the device to form the junction(s). N-type devices can be formed by implanting arsenic (As) or phosphorous (P), and p-type devices can be formed by implanting boron (B).

Figure 23:
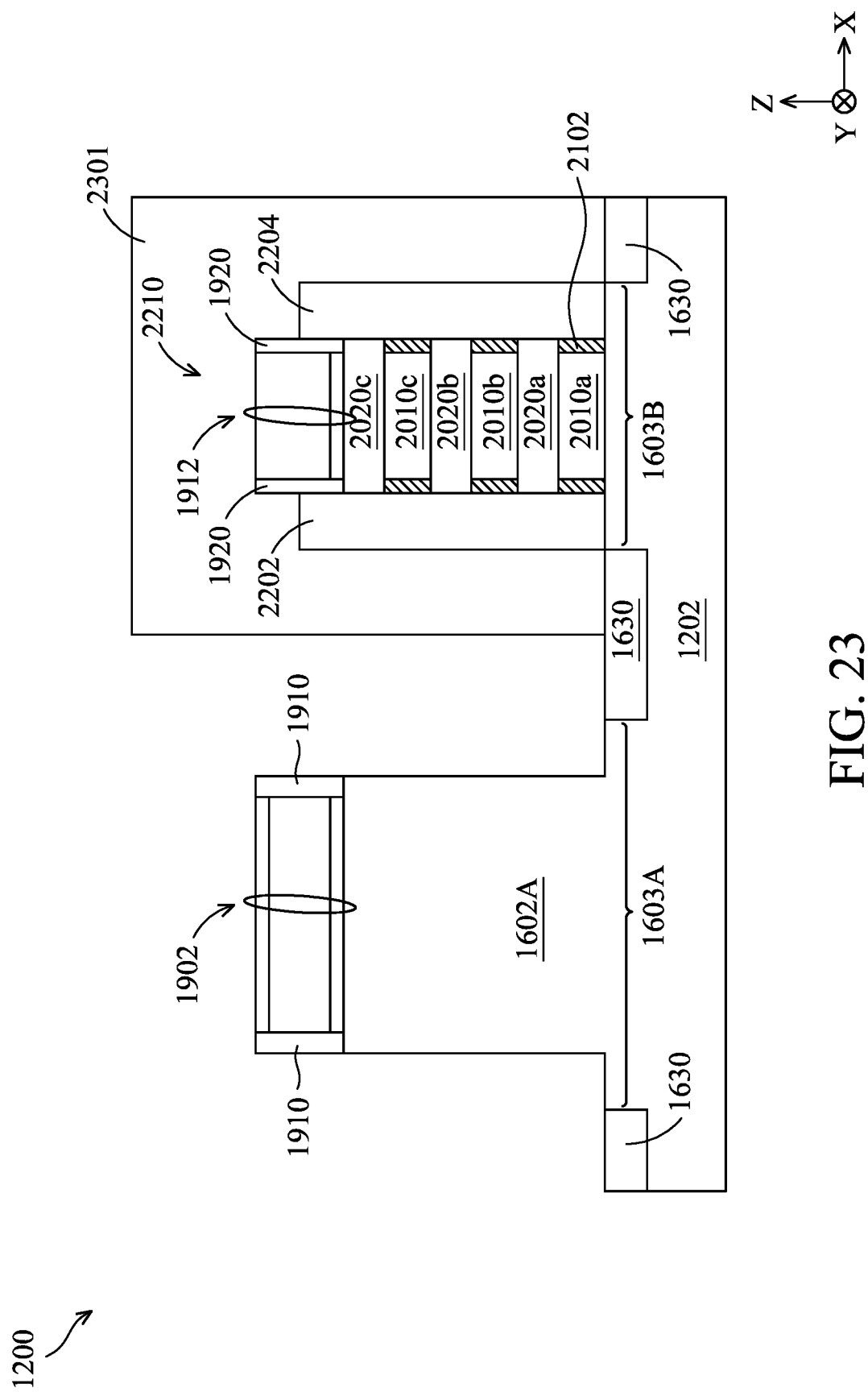

Corresponding to operation 1810 of FIG. 18, FIG. 23 is a cross-sectional view of the memory device 1200, cut along line A-A' (e.g., as indicated in FIGS. 3-4), in which end portions of the first active structure 1602A (along the X direction) are removed, at one of the various stages of fabrication.

In some embodiments, when removing the end portions of the first active structure 1602A, the partially formed GAA transistor 2210 may be covered by a blocking mask 2301. The blocking mask 2301 is formed to overlay the partially formed GAA transistor 2210 while remaining the first active structure 1602A exposed. The blocking mask 2301 may be formed to have a sufficiently great thickness (or height) such that the partially formed GAA transistor 2210 is fully covered, as shown in FIG. 23. Formation of the blocking mask 2301 may allow one or more processes, which will be discussed below, to be performed on the first active structure 1602A only. The blocking mask 2301 may be formed of a material relatively resistant to etchants that can etch SiGe such as, for example, silicon oxide, silicon nitride, silicon oxynitride, SiBCN, SiOCN, SiOC, or any suitable combinations of those materials.

Upon covering the partially formed transistor 2210 with the blocking mask 2301, the dummy gate structure 1902 together with the gate spacer 1910 can be used as a mask to etch the end portions of the first active structure 1602A, which results in the first active structure 1602A having its sidewalls (or ends) along the X direction exposed to form respective source/drain structures.

Figure 24:
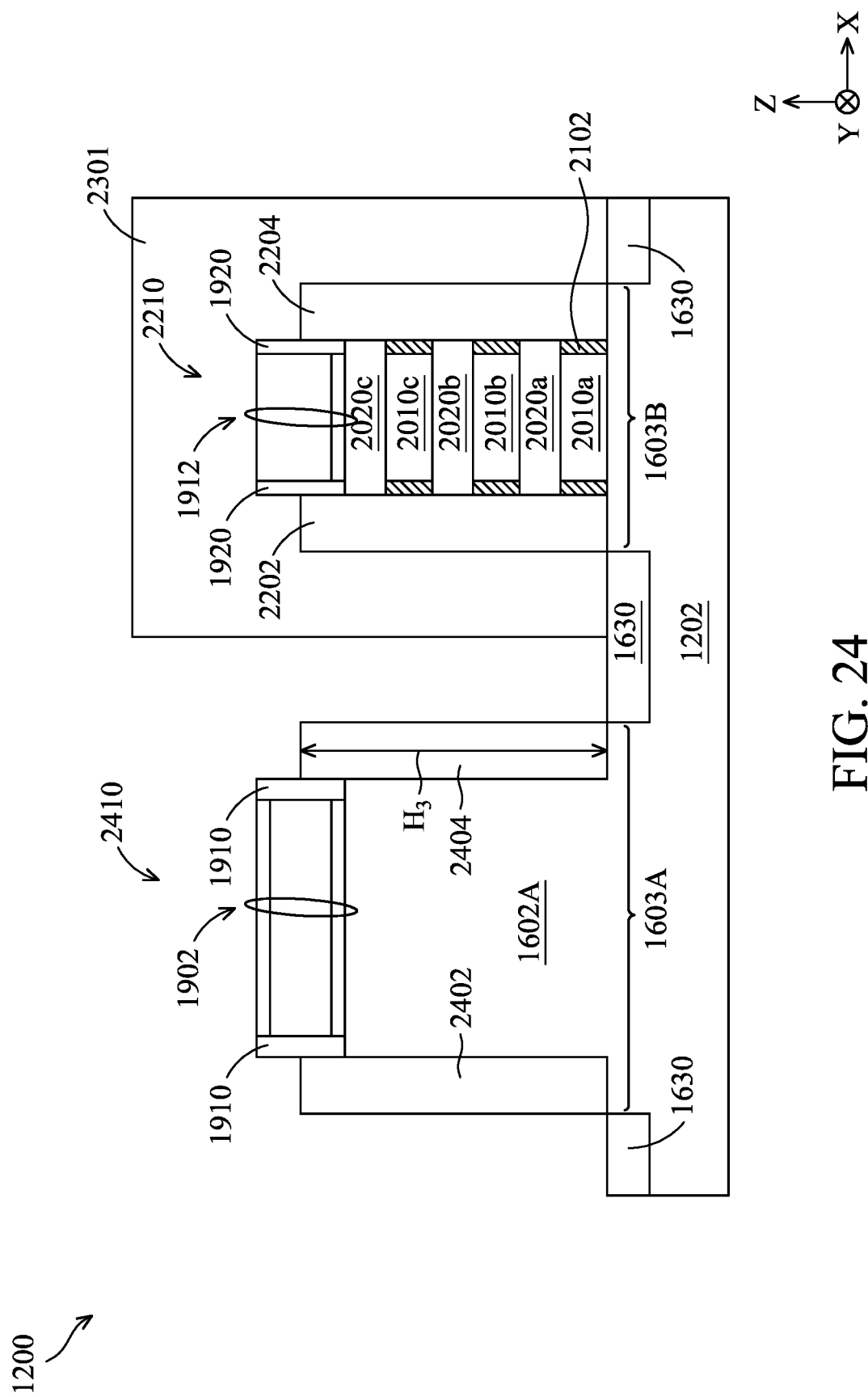

Corresponding to operation 1812 of FIG. 18, FIG. 24 is a cross-sectional view of the memory device 1200, cut along line A-A' (e.g., as indicated in FIGS. 3-4), that includes source/drain structures 2402 and 2404 in the first active region 1603A, at one of the various stages of fabrication. The source/drain structures 2402 and 2404 are coupled to respective ends of the first active structure 1602A.

During the formation of the source/drain structures 2402 and 2404, the partially formed GAA transistor 2210 may remain covered by the blocking mask 2301. The source/drain structures 2402 and 2404 may be formed using an epitaxial layer growth process on the exposed ends of the first active structure 1602A. In some embodiments, a bottom surface of the source/drain structures 2402 and 2404 may be leveled with the top surface of the isolation structure 1630, as shown in of FIG. 24. Accordingly, the source/drain structures 2402 and 2404 may have a height, $H_3$, which is about equal to $H_1$ but less than $H_2$ (FIG. 22).

The source/drain structures 2402 and 2404 are electrically coupled to the first active structure 1602A. In various embodiments, the first active structure 1602A may function as the channel of a non-GAA transistor, hereinafter non-GAA transistor 2410. It is noted that at this stage of fabrication, the non-GAA transistor 2410 is not finished yet, in some embodiments. Referring again to FIG. 3, the non-GAA transistor 2410, upon being finished, may be similar to the non-GAA transistor 302. Accordingly, the first active structure 1602A may correspond to the protruding structure 332; and the source/drain structures 2402 and 2404 may correspond to the source/drain structures 316 and 318, respectively.

In-situ doping (ISD) may be applied to form doped source/drain structures 2402 and 2404, thereby creating the junctions for the non-GAA transistor 2410. N-type and p-type FETs are formed by implanting different types of dopants to selected regions (e.g., the source/drain structures 2402 and 2404) of the device to form the junction(s). N-type devices can be formed by implanting arsenic (As) or phosphorous (P), and p-type devices can be formed by implanting boron (B).

Figure 25:
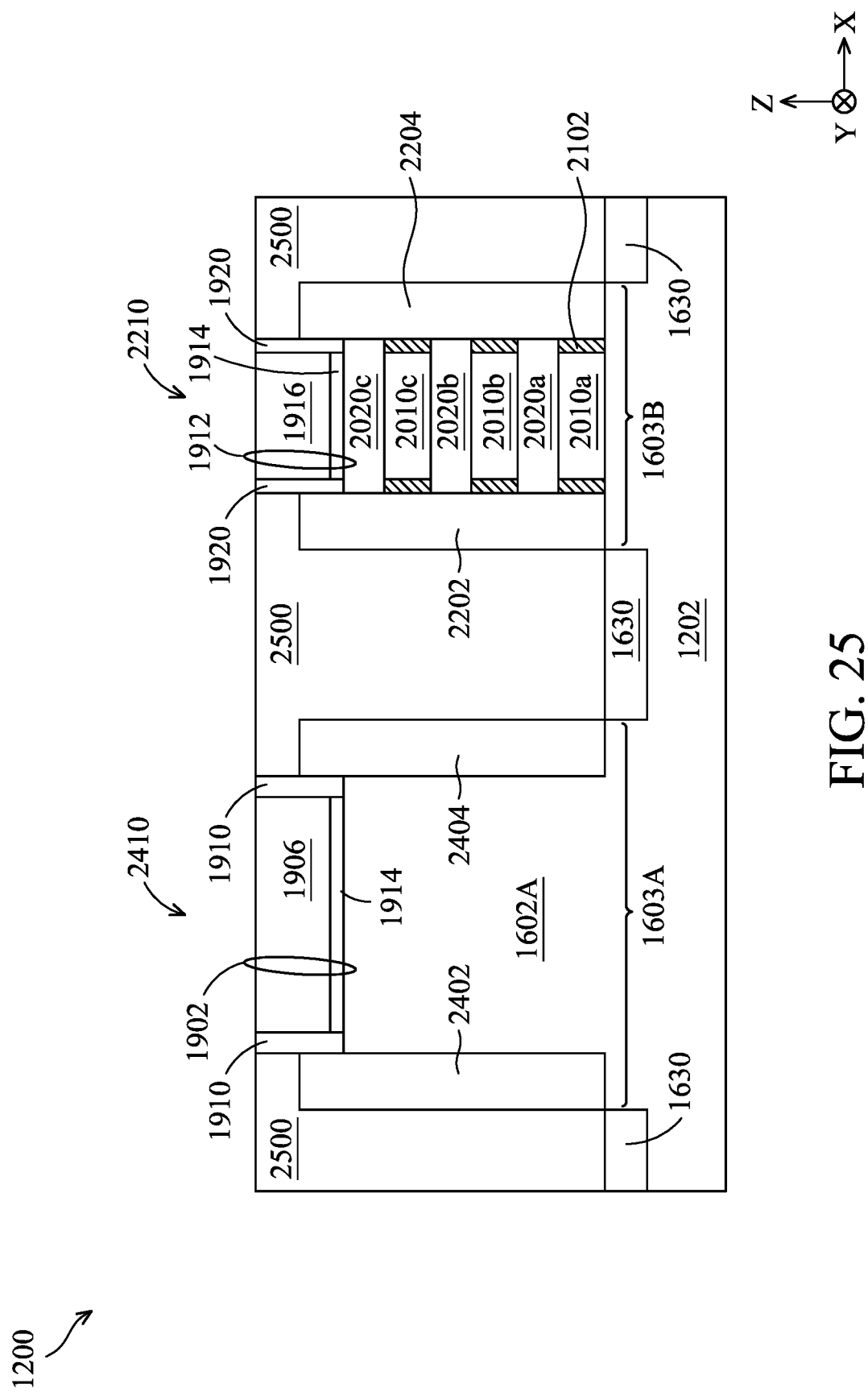

Corresponding to operation 1814 of FIG. 18, FIG. 25 is a cross-sectional view of the memory device 1200, cut along line A-A' (e.g., as indicated in FIGS. 3-4), that includes an inter-layer dielectric (ILD) 2500, at one of the various stages of fabrication. The ILD 2500 may sometimes be referred to as ILD0. The ILD 2500 can be formed by depositing a dielectric material in bulk over the partially formed GAA transistor 2210 and non-GAA transistor 2410, and polishing the bulk oxide back (e.g., using CMP) to the level of the dummy gates 1906 and 1916, which causes the hard masks 1908 and 1918 to be removed. As such, the dummy gates 1906 and 1916 can be exposed. The dielectric material of ILD 2500 includes silicon oxide, phosphosilicate glass (PSG), borosilicate glass (BSG), boron-doped phosphosilicate Glass (BPSG), undoped silicate glass (USG), and combinations thereof.

Figure 26:
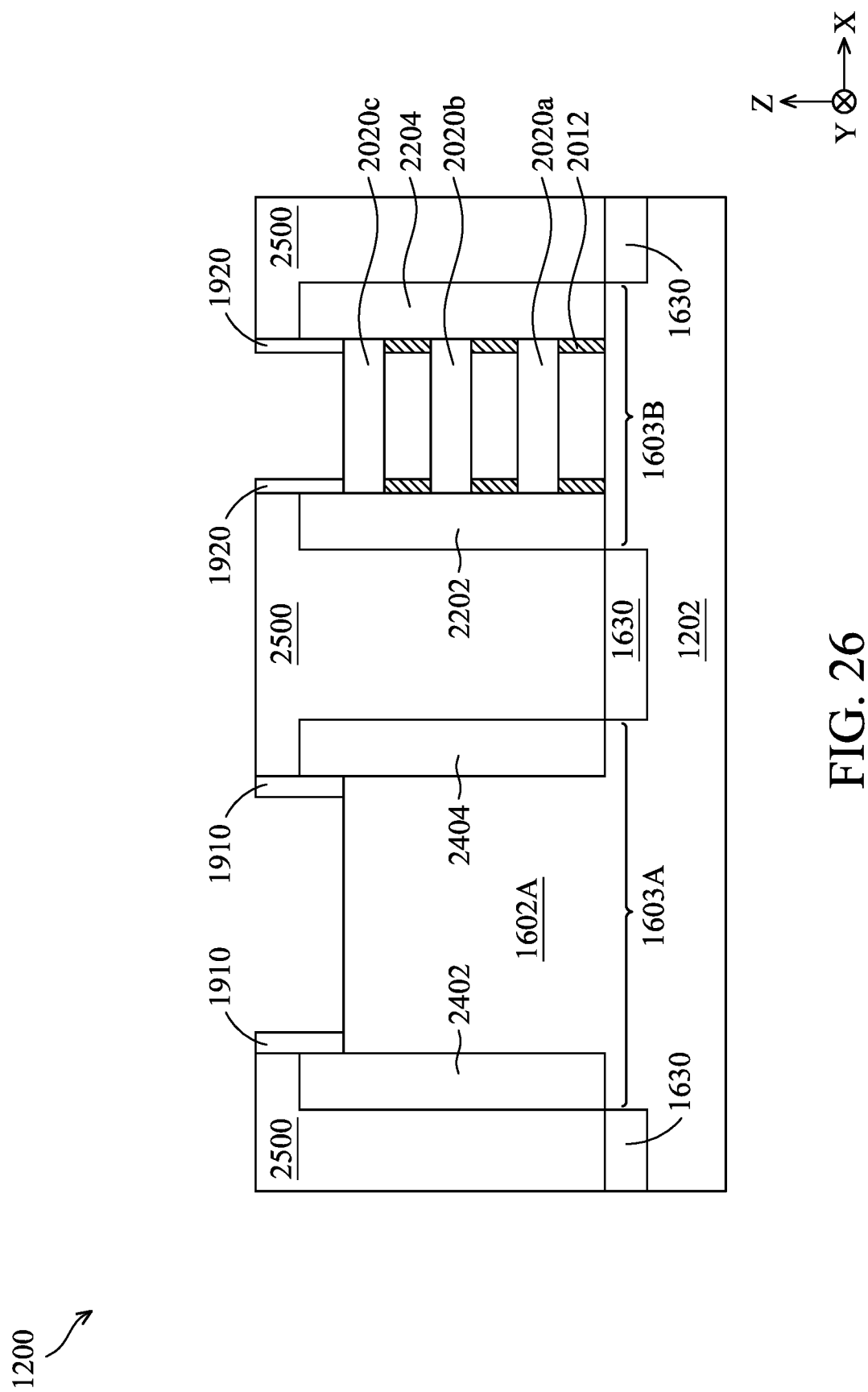

Corresponding to operation 1816 of FIG. 18, FIG. 26 is a cross-sectional view of the memory device 1200, cut along line A-A' (e.g., as indicated in FIGS. 3-4), in which the dummy gate structures 1902 and 1912 are first removed and the semiconductor layers 2010a-c are then removed, at one of the various stages of fabrication.

Subsequently to forming the ILD 2500 and exposing the dummy gates 1906 and 1916 (FIG. 25), the dummy gate structures 1902 and 1912 are removed. The dummy gate structures 1902 and 1912 can be removed by a known etching process, e.g., RIE or chemical oxide removal (COR). After the removal of the dummy gate structure 1902, the top surface of the first active structure 1602A is exposed. Although not shown in the cross-sectional view of FIG. 26, it is appreciated that in addition to the top surface, the sidewalls of the first active structure 1602A (facing the Y direction) may be exposed. Similarly, after the removal of the dummy gate structure 1912, a top surface of the semiconductor layer 2020c us exposed. Although not shown in the cross-sectional view of FIG. 26, it is appreciated that in addition to the top surface, the sidewalls of each of the semiconductor layers 2010a-c and 2020a-c (facing the Y direction) may be exposed. Next, the semiconductor layers 2010a-c are removed by applying a selective etch (e.g., a hydrochloric acid (HCl)). After the removal of the semiconductor layers 2010a-c, respective bottom surface and top surface of each of the semiconductor layers 2020a-c may be exposed.

Figure 27A:
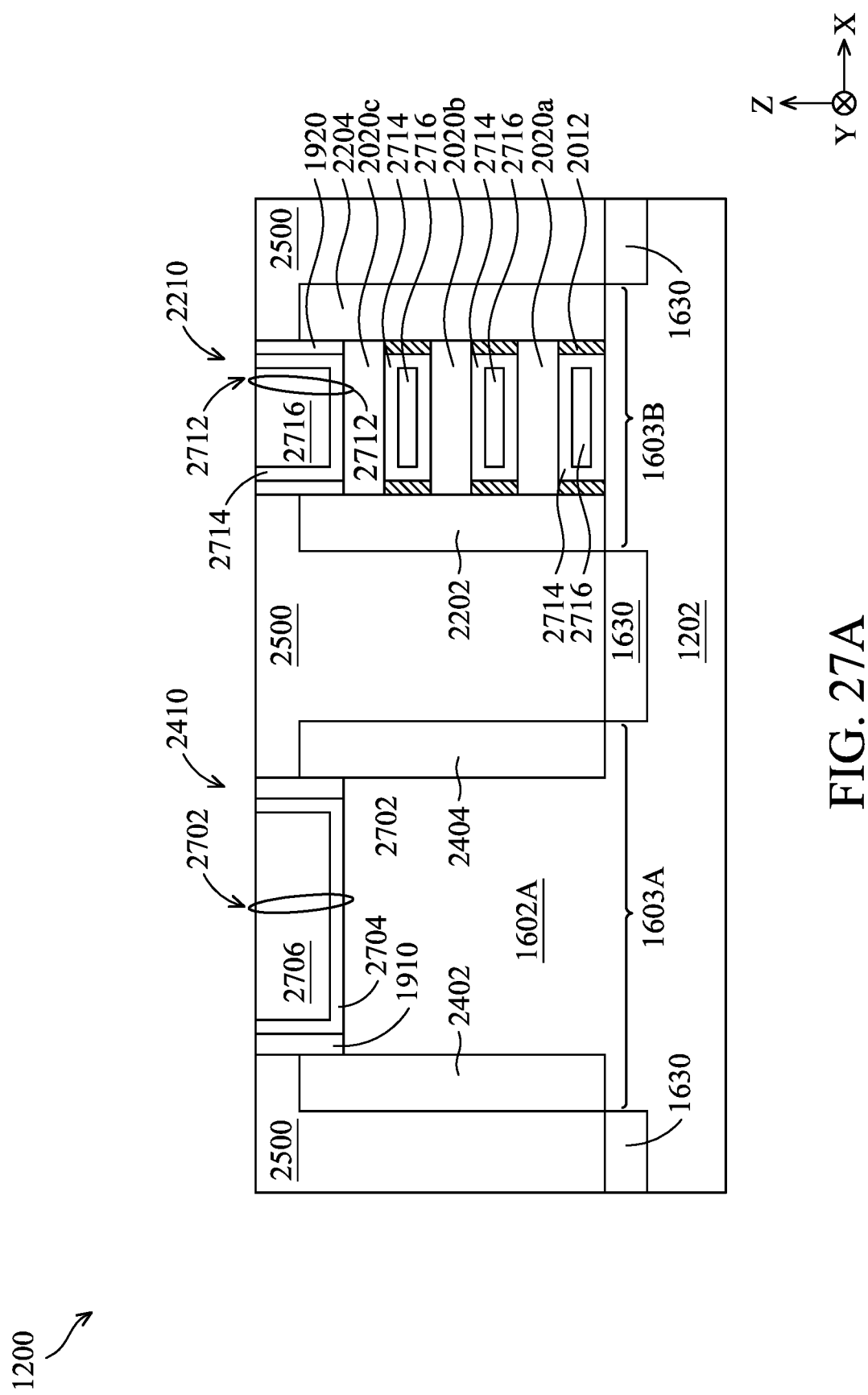
Figure 27B:
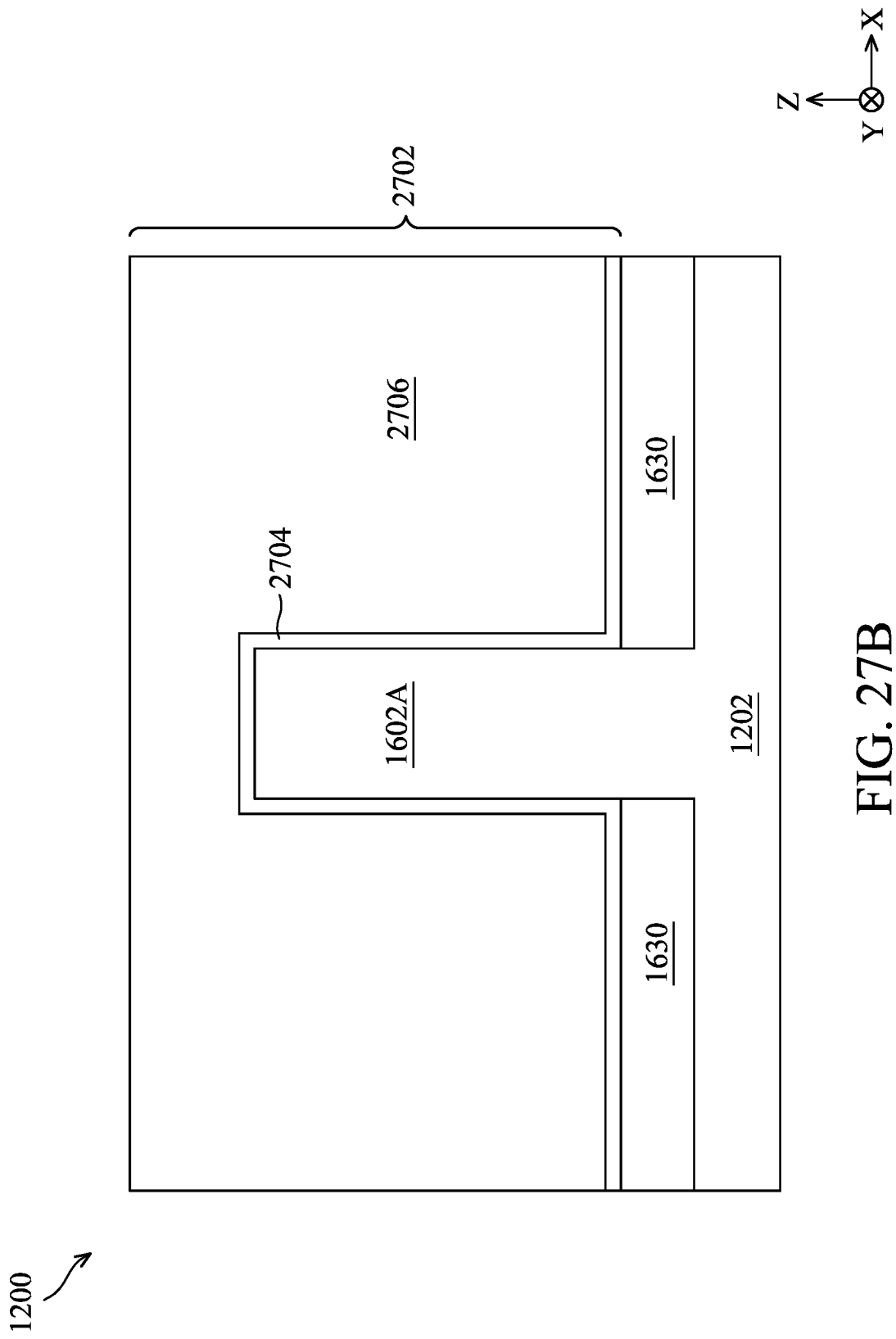
Figure 27C:
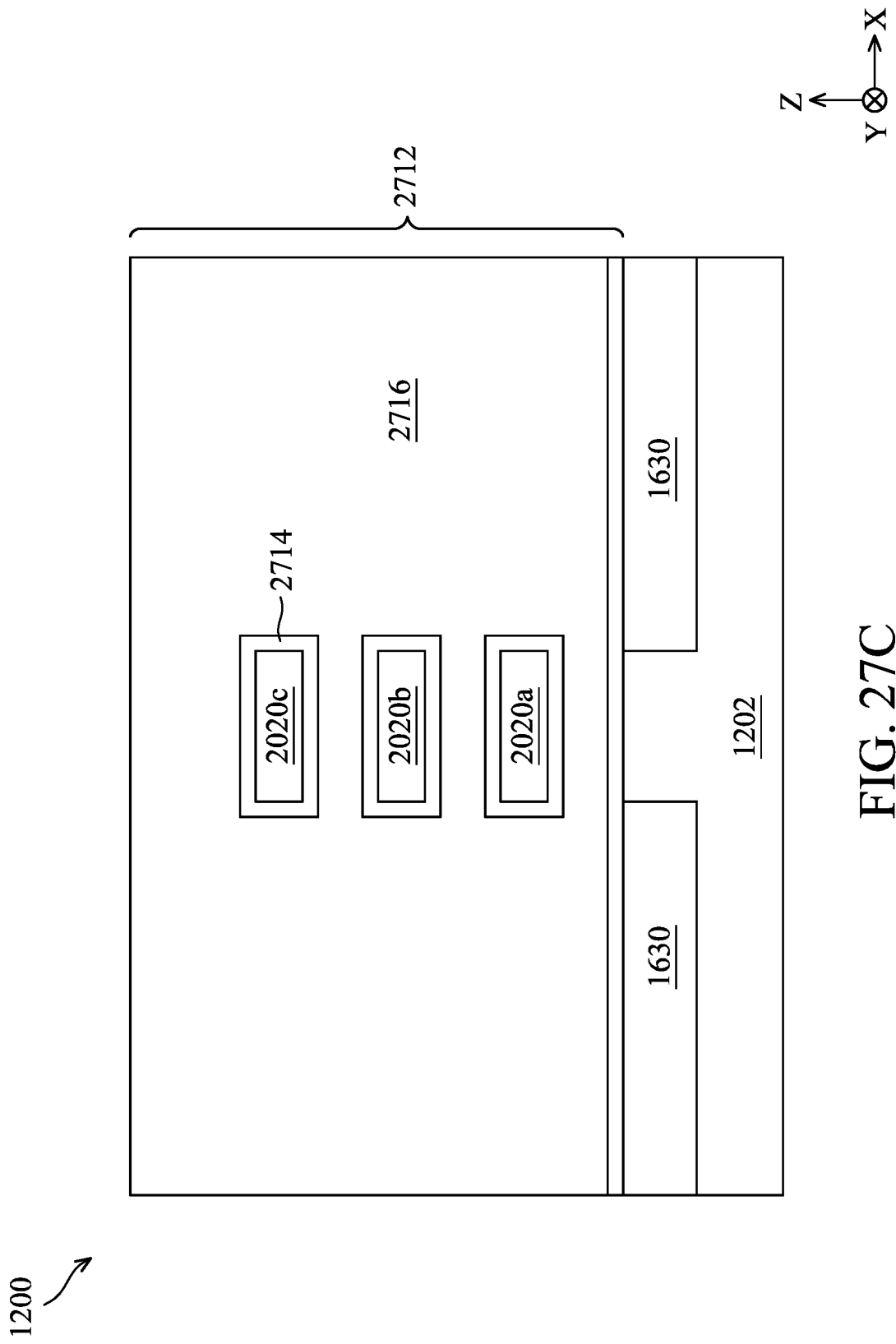

Corresponding to operation 1818 of FIG. 18, FIG. 27A is a cross-sectional view of the memory device 1200, cut along line A-A' (e.g., as indicated in FIGS. 3-4), that includes a first active gate structure 2702 and a second active structure 2712, at one of the various stages of fabrication. For clarity of illustration, FIG. 27B illustrates a corresponding cross-sectional view of the memory device 1200, cut along line B-B' (e.g., as indicated in FIGS. 3-4); and FIG. 27C illustrates a corresponding cross-sectional view of the memory device 1200, cut along line C-C' (e.g., as indicated in FIGS. 3-4).

Each of the active gate structures includes a gate dielectric and a gate metal, in some embodiments. For example in FIGS. 27A-C, the first active gate structure 2702 includes a gate dielectric 2704 and a gate metal 2706; and the active gate structure 2712 includes a gate dielectric 2714 and a gate metal 2716.

The gate dielectric 2704 is in direct contact with the first active structure 1602A. The gate dielectric 2714 wraps around each of the semiconductor layers 2020a-c. As further illustrated in FIGS. 27B-C, respectively, the gate dielectric 2704 is formed to straddle the top surface and sidewalls of the first active structure 1602A, and the gate dielectric 2714 is formed to wrap around each of the semiconductor layers 2020a-c (e.g., the top/bottom surface and sidewalls perpendicular to the Y direction). The gate dielectrics 2704 and 2714 may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectrics 2704 and 2714 may include a stack of multiple high-k dielectric materials. The gate dielectrics 2704 and 2714 can be concurrently or respectively deposited using any suitable method, including, for example, molecular beam deposition (MBD), atomic layer deposition (ALD), PECVD, and the like. In some embodiments, the gate dielectrics 2704 and 2714 may optionally include a substantially thin oxide (e.g., $SiO_x$) layer.

The gate metal 2706 can straddle the top surface and sidewalls of the first active structure 1602A with the gate dielectric 2704 disposed therebetween. The gate metal 2716 can wrap around each of the semiconductor layers 2020a-c with the gate dielectric 2714 disposed therebetween. As further illustrated in FIGS. 27B-C, respectively, the gate metal 2706 is formed to straddle the top surface and sidewalls of the first active structure 1602A, with the gate dielectric disposed therebetween; and the gate dielectric 2716 is formed to wrap around each of the semiconductor layers 2020a-c (e.g., the top/bottom surface and sidewalls perpendicular to the Y direction), with the gate dielectric 2714 disposed therebetween. Specifically, the gate metal 2716 can include a number of gate metal sections abutted to each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin together to wrap around a corresponding one of the semiconductor layers 2020a-c, with the gate dielectric 2714 disposed therebetween.

The gate metals 2706 and 2716 may be formed of different metal materials or a similar metal material. The gate metals 2706 and 2716 may each include a stack of multiple metal materials. For example, each of the gate metals 2706 and 2716 may be a P-type work function layer, an N-type work function layer, multi-layers thereof, or combinations thereof. The work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process.

In some embodiments, upon the formation of the active gate structures 2702 and 2712, the GAA transistor 2210 and the non-GAA transistor 2410 may be finished. For example, the GAA transistor 2210 may include the gate structure 2712, source/drain structure 2202, and source/drain structure 2204 functioning as its gate, source, and drain, respectively; and the non-GAA transistor 2410 may include the gate structure 2702, source/drain structure 2402, and source/drain structure 2404 functioning as its gate, source, and drain, respectively.

To operate the GAA transistor 2210 and non-GAA transistor 2410, for example, as an anti-fuse memory cell, various interconnecting structures may be formed. For example, the non-GAA transistor 2410 may function as a programming transistor of the anti-fuse memory cell (e.g., 110 of FIG. 1), and the GAA transistor 2210 may function as a reading transistor of the anti-fuse memory cell (e.g., 120 of FIG. 1). Various interconnecting structures may be formed, for example, to allow an electrical connection between the drain of the non-GAA programming transistor (source/drain structure 2404) and the source of the GAA reading transistor (source/drain structure 2202), to electrically connect the gate of the non-GAA programming transistor (active gate structure 2702) to a WLP, to electrically connect the gate of the GAA reading transistor (active gate structure 2712) to a WLR, and to electrically connect the drain of the GAA reading transistor (source/drain structure 2204) to a BL.

Figure 28:
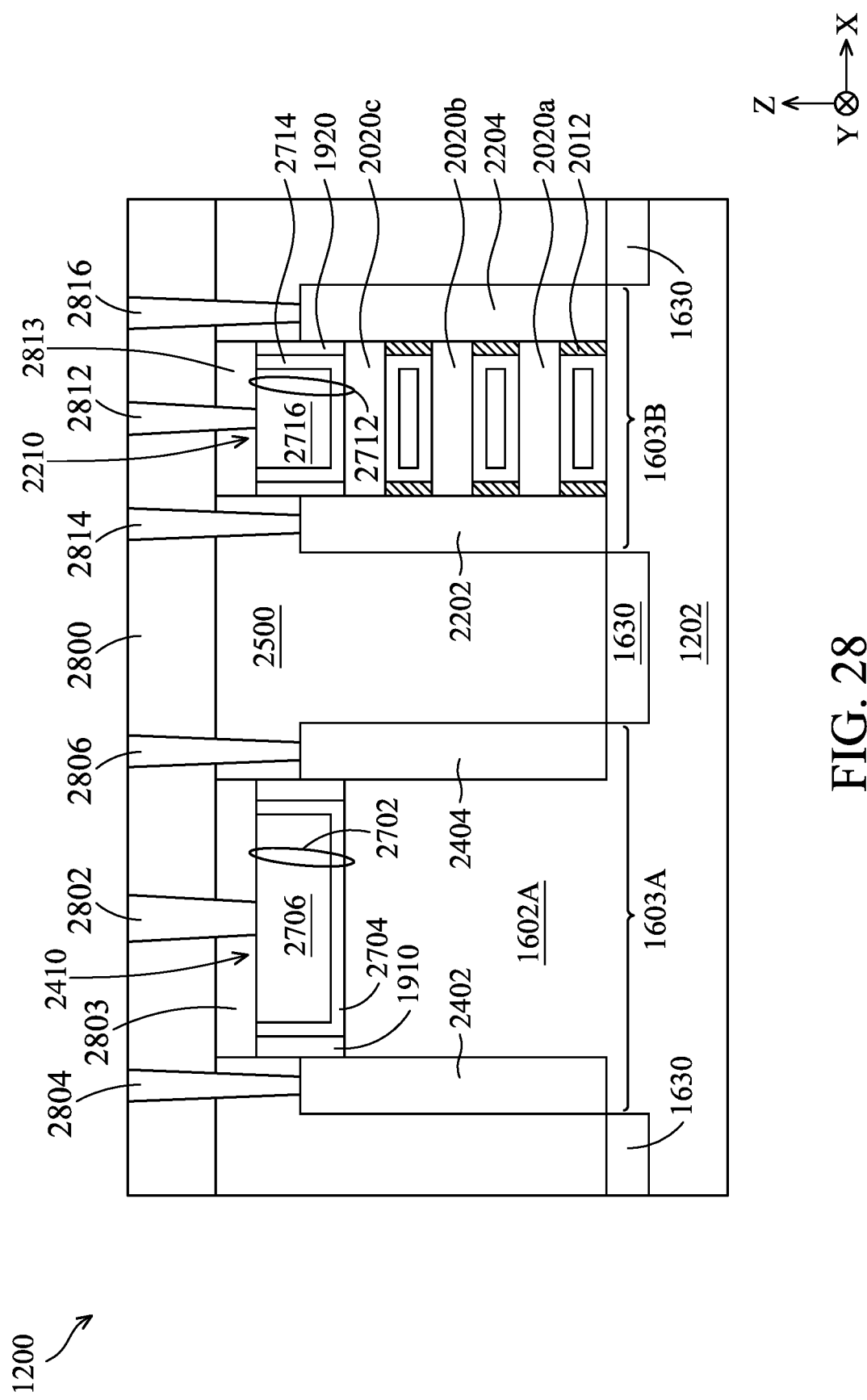

Corresponding to operation 1820 of FIG. 18, FIG. 28 is a cross-sectional view of the memory device 1200, cut along line A-A' (e.g., as indicated in FIGS. 3-4), that includes a number of interconnecting structures (e.g., contacts) 2802, 2804, 2806, 2812, 2814, and 2816, at one of the various stages of fabrication. In some embodiments, the interconnecting structures 2802, 2804, 2806 provide electrical connection to the non-GAA programming transistor 2410; and the interconnecting structures 2812, 2814, and 2816 provide electrical connection to the GAA reading transistor 2210.

As shown, the interconnecting structure 2802 is coupled to the active gate structure 2702 (or to the gate metal 2706); the interconnecting structure 2804 is coupled to the source/drain structure 2402; the interconnecting structure 2806 is coupled to the source/drain structure 2404; the interconnecting structure 2812 is coupled to the active gate structure 2712 (or to the gate metal 2716); the interconnecting structure 2814 is coupled to the source/drain structure 2202; and the interconnecting structure 2816 is coupled to the source/drain structure 2204.

In various embodiments, to operate the GAA transistor 2210 and non-GAA transistor 2410 as the reading transistor and programming transistor of an anti-fuse memory cell, respectively, an interconnecting structure (e.g., which can be formed by the feature 534 of FIG. 5, but is not shown in FIG. 28) can be established between the source/drain structure 2404 (which functions as the drain the of the non-GAA transistor 2410) and the source/drain structure 2202 (which functions as the source of the GAA transistor 2210) through the interconnecting structures 2806 and 2814, respectively; a WLP can be electrically connected to the active gate structure 2702 (which functions as the gate of the non-GAA transistor 2410); a WLR can be electrically connected to the active gate structure 2712 (which functions as the gate of the GAA reading transistor 2210); a BL can be electrically connected to the source/drain structure 2204 (which functions as the drain of the GAA reading transistor 2210).

Each of the interconnecting structures may extend through another ILD 2800 to couple to the respective structure. The ILD 2800, formed of the similar dielectric material as the ILD 2500, may sometimes be referred to as ILD 1, with respect to ILD 0 (the ILD 2500). The interconnecting structure 2802 may further extend through a dielectric hard mask 2803 (e.g., silicon nitride) to couple to the active gate structure 2702; and the interconnecting structure 2812 may further extend through a dielectric hard mask 2813 (e.g., silicon nitride) to couple to the active gate structure 2712. Such dielectric hard masks may be formed subsequently to forming the active gate structures and prior to forming the interconnecting structures. For example, upon forming the active gate structures 2702 and 2712, an etching process may be performed to recess the active gate structures 2702 and 2712. The recessed active gate structures are then filled with a dielectric material (e.g., silicon nitride), followed by a planarization process (e.g., a CMP), so as to form the dielectric hard masks 2803 and 2813.

Each of the interconnecting structures 2802-2816 may include a metal-containing material such as copper, aluminum, tungsten, the like, combinations thereof, or multilayers thereof. For example, after forming the dielectric hard masks 2803 and 2813, the ILD 2800 is deposited over the memory device 1200. Next, one or more contact holes are formed (e.g., by at least one patterning process) to extend through the ILD 2800 and selectively the dielectric hard mask 2803 or 2813 to expose each of the structures (e.g., 2702, 2402, 2404, 2712, 2202, 2204). Such contact holes are then filled with the metal-containing material by, e.g., electroplating, electroless plating, or other suitable methods to form the interconnecting structures 2802-2816. After the formation of the interconnecting structures, a planarization process, such as a CMP, may be performed to remove the excess portions of the metal-containing material.

Although, in FIG. 28, each of the interconnecting structures 2802-2816 is illustrated as a single via structure, it should be understood that some of the interconnecting structures 2802-2816 may include multiple structures that are formed of a similar metal-containing material and connected to each other. For example, each of the interconnecting structures 2804, 2806, 2814, and 2816 may include an MD (formed as a slot or trench structure) and a VD (formed as a via structure), as discussed above with respect to FIGS. 5-10.

Although not shown, each of the interconnecting structures may further include a barrier layer. For example, a bottom surface and sidewalls of each of the interconnecting structures may be surrounds by such a barrier layer. The barrier layer can include an electrically conductive material such as titanium nitride, although other materials, such as tantalum nitride, titanium, tantalum, or the like, may alternatively be utilized. The barrier layer may be formed using a CVD process, such as PECVD. However, other alternative processes, such as sputtering, metal organic chemical vapor deposition (MOCVD), or ALD, may alternatively be used.

Figure 29:
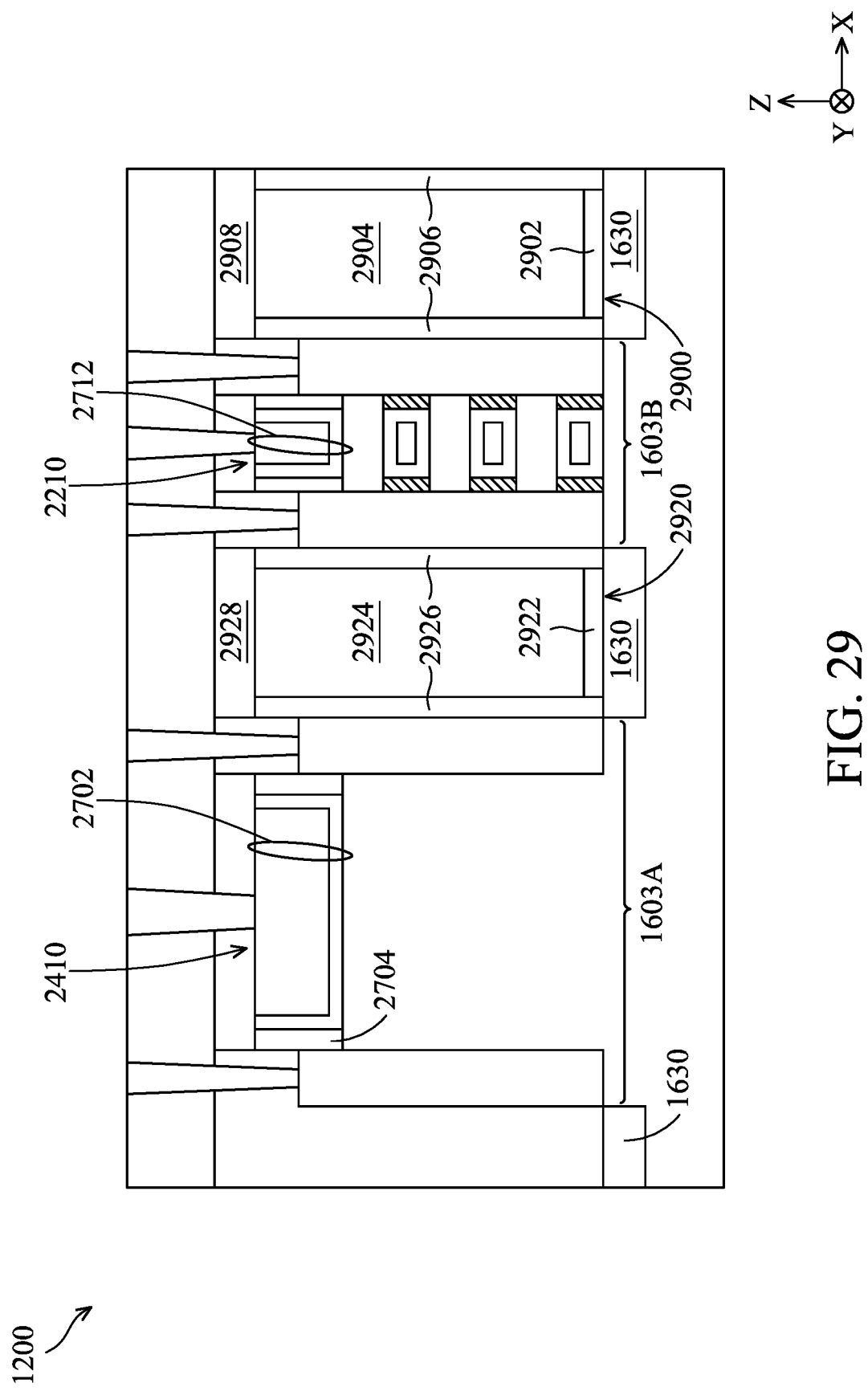
FIG. 29 illustrates a cross-sectional view of another embodiments of the memory device, made by the method of FIG. 18, in accordance with some embodiments.

FIG. 29 illustrates a cross-sectional view of another embodiment of the memory device 1200, which can be made based on the layout 600 FIG. 6 or layout 700 of FIG. 7. Referring again to FIGS. 6-7, the layouts 600 and 700 each include one or more features (e.g., 602 and 604) configured to form dummy gate structures that will not be replaced by active gate structures.

As shown in FIG. 29, the memory device 1200 further includes dummy gate structures 2900 and 2920, when compared to the embodiment shown in FIG. 28 that is made based on the layout 500 of FIG. 5. The dummy gate structures 2900 and 2920 can be formed using the features 602 and 604 (FIGS. 6-7), respectively, at operation 1802 of FIG. 18. For example, the dummy gate structures may be formed concurrently with the dummy gate structures 1902 and 1912 that will be replaced by respective active gate structures at operations 1816 and 1818. Thus, each of the dummy gate structures 1902 and 1912 includes the similar configuration as the dummy gate structures 2900 and 2920 except that the dummy gate structures 2900 and 2920 are formed over the isolation structures 1630 (e.g., not to overlay any active region).

For example, the dummy gate structure 2900, formed over the isolation structure 1630 opposite the active region 1603B from the active region 1603A, includes a dummy gate dielectric 2902 and a dummy gate 2904, with a spacer 2906 extending along 2900's sidewalls; and the dummy gate structure 2920, formed over the isolation structure 1630 between the active regions 1603A-B, includes a dummy gate dielectric 2922 and a dummy gate 2924, with a spacer 2926 extending along 2920's sidewalls. However, the dummy gate structures 2900 and 2920 will not be replaced by active gate structures at operation operations 1816 and 1818, for example, by masking the dummy gate structure 2900 and 2920 at operations 1816 and 1818. Upon the formation of the active gate structures 2702 and 2712, both of the active gate structures, 2702 and 2712, and the dummy gate structures, 2900 and 2920, can be recessed so as to overlaid by respective dielectric hard masks. For example, the dummy gate structures 2900 and 2920 are overlaid dielectric hard masks 2908 and 2928, respectively.

Figure 30:
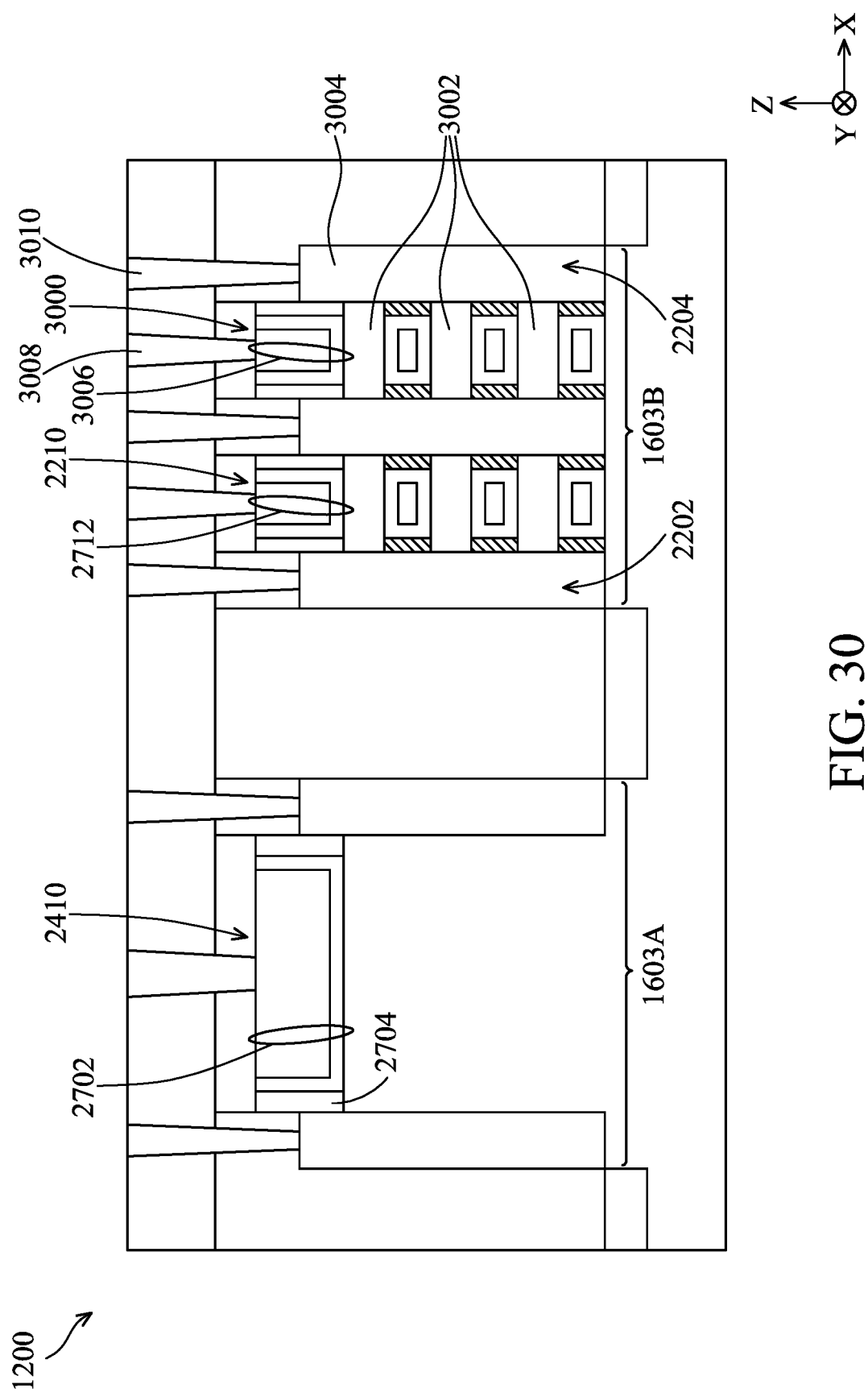
FIG. 30 illustrates a cross-sectional view of yet another embodiments of the memory device, made by the method of FIG. 18, in accordance with some embodiments.

FIG. 30 illustrates a cross-sectional view of another embodiment of the memory device 1200, which can be made based on the layout 900 of FIG. 9. Referring again to FIG. 9, the layout 900 includes an additional gate feature 908 (with respect to the layout 500 of FIG. 5) that travels across the active feature 902B, which results in forming the active gate structure of another GAA transistor. For example in FIGS. 19A-C, after forming an additional dummy gate structure (with respect to the dummy gate structures 1902 and 1912) using the gate feature 908 at operation 1802 of FIG. 18, the rest of the operations of the method 1800 of FIG. 18 can be used to form the memory device 1200, which includes one non-GAA transistor and two GAA transistors.

As shown in FIG. 30, in addition to the active gate structures of the non-GAA transistor 2410 and the GAA transistor 2210, which can be formed by the gate features 904 and 906, respectively, the memory device 1200 includes an active gate structure 3006 of another GAA transistor 3000, which can be formed by the gate feature 908. As the gate features 906 and 908 both travel across the active feature 902B, the formed GAA transistors 2210 and 3000 may share the source/drain structure 2204, but have respective channels. For example, the GAA transistor 3000 include semiconductor layers 3002 collectively functioning as its channel. The GAA transistor 3000 includes the shared source/drain structure 2204 connected to one end of the semiconductor layers 3002, and a source/drain structure 3004 connected to the opposite end of the semiconductor layers 3002. The active gate structure 3006 and the source/drain structure 3004 are connected by respective interconnecting structures, 3008 and 3010, to enable operation of the memory device 1200 including one non-GAA programming transistor and two GAA reading transistors. For example, a WLR2 is connected to the active gate structure 3006 of the GAA transistor 3000 through the interconnecting structure 3008 (with a WLR 1 is connected to the active gate structure of the GAA transistor 2210) and a BL is connected to the source/drain structure 3004 of the GAA transistor 3000 through the interconnecting structure 3010.

Figure 31:
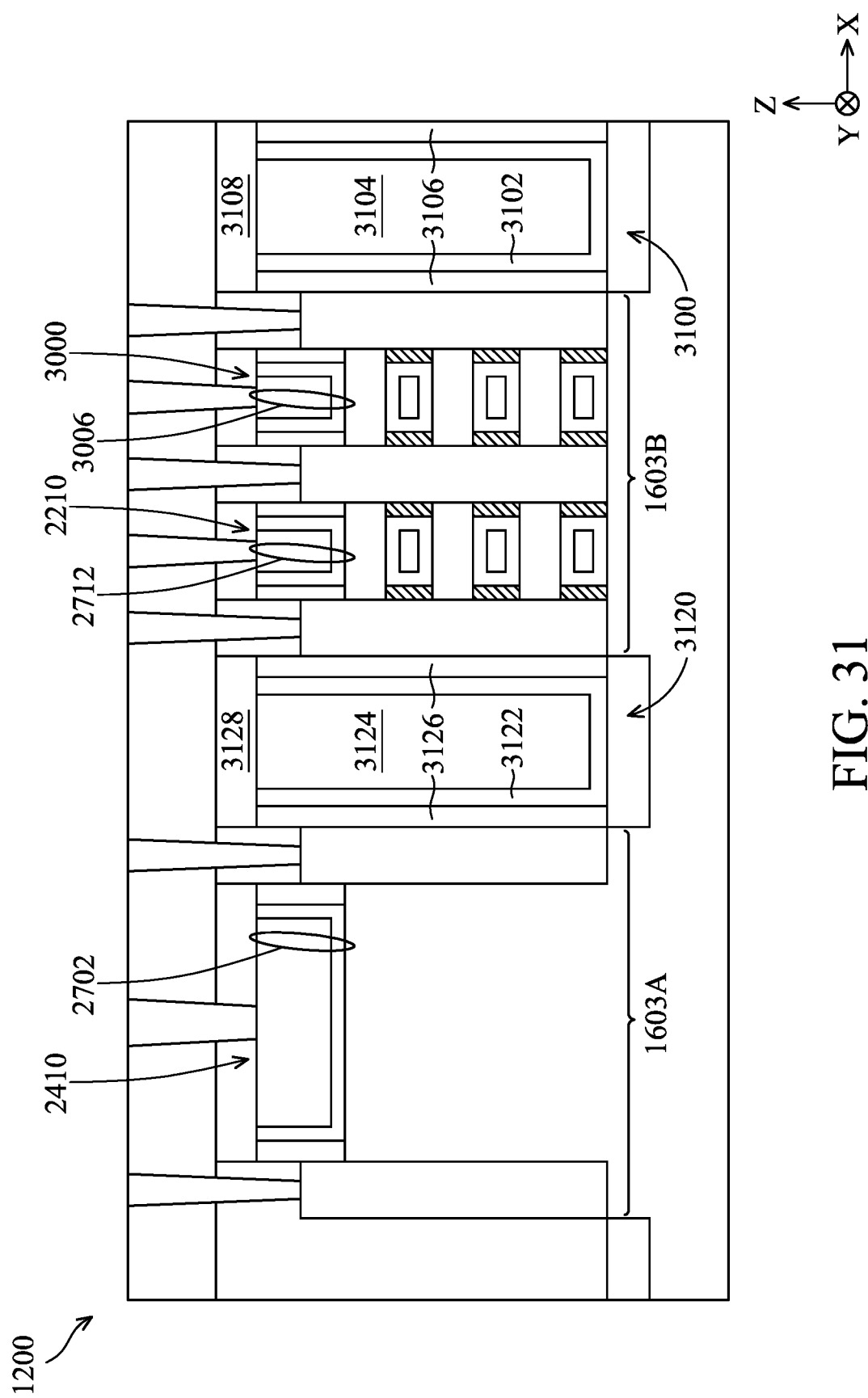
FIG. 31 illustrates a cross-sectional view of yet another embodiments of the memory device, made by the method of FIG. 18, in accordance with some embodiments.

FIG. 31 illustrates a cross-sectional view of another embodiment of the memory device 1200, which can be made based on the layout 1000 of FIG. 10. Referring again to FIG. 10, the layout 1000 includes one or more additional features (e.g., 1002 and 1004) when compared to the layout 900 of FIG. 9. The features 1002 and 1004 can be configured to form dummy gate structures that will not be replaced by active gate structures.

As shown in FIG. 31, the memory device 1200 further includes dummy gate structures 3100 and 3120, when compared to the embodiment shown in FIG. 30 that is made based on the layout 900 of FIG. 9. The dummy gate structures 3100 and 3120 can be formed using the features 1002 and 1004 (FIG. 10), respectively, at operation 1802 of FIG. 18. For example in FIGS. 19A-C, the dummy gate structures may be formed concurrently with the dummy gate structures 1902 and 1912 that will be replaced by respective active gate structures at operations 1816 and 1818. Thus, each of the dummy gate structures 3100 and 3120 includes the similar configuration as the dummy gate structures 1902 and 1912 except that the dummy gate structures 3100 and 3120 are formed over the isolation structures 1630 (e.g., not to overlay any active region).

For example, the dummy gate structure 3100, formed over the isolation structure 1630 opposite the active region 1603B from the active region 1603A, includes a dummy gate dielectric 3102 and a dummy gate 3104, with a spacer 3106 extending along 3100's sidewalls; and the dummy gate structure 3120, formed over the isolation structure 1630 between the active regions 1603A-B, includes a dummy gate dielectric 3122 and a dummy gate 3124, with a spacer 3126 extending along 3120's sidewalls. However, the dummy gate structures 3100 and 3120 will not be replaced by active gate structures at operations 1816 and 1818, for example, by masking the dummy gate structure 3100 and 3120 at operations 1816 and 1818. Upon the formation of the active gate structures 2702, 2712, and 3006, both of the active gate structures, 2702, 2712, and 3006, and the dummy gate structures, 3100 and 3120, can be recessed so as to overlaid by respective dielectric hard masks. For example, the dummy gate structures 3100 and 3120 are overlaid dielectric hard masks 3108 and 3128, respectively.

Figure 32:
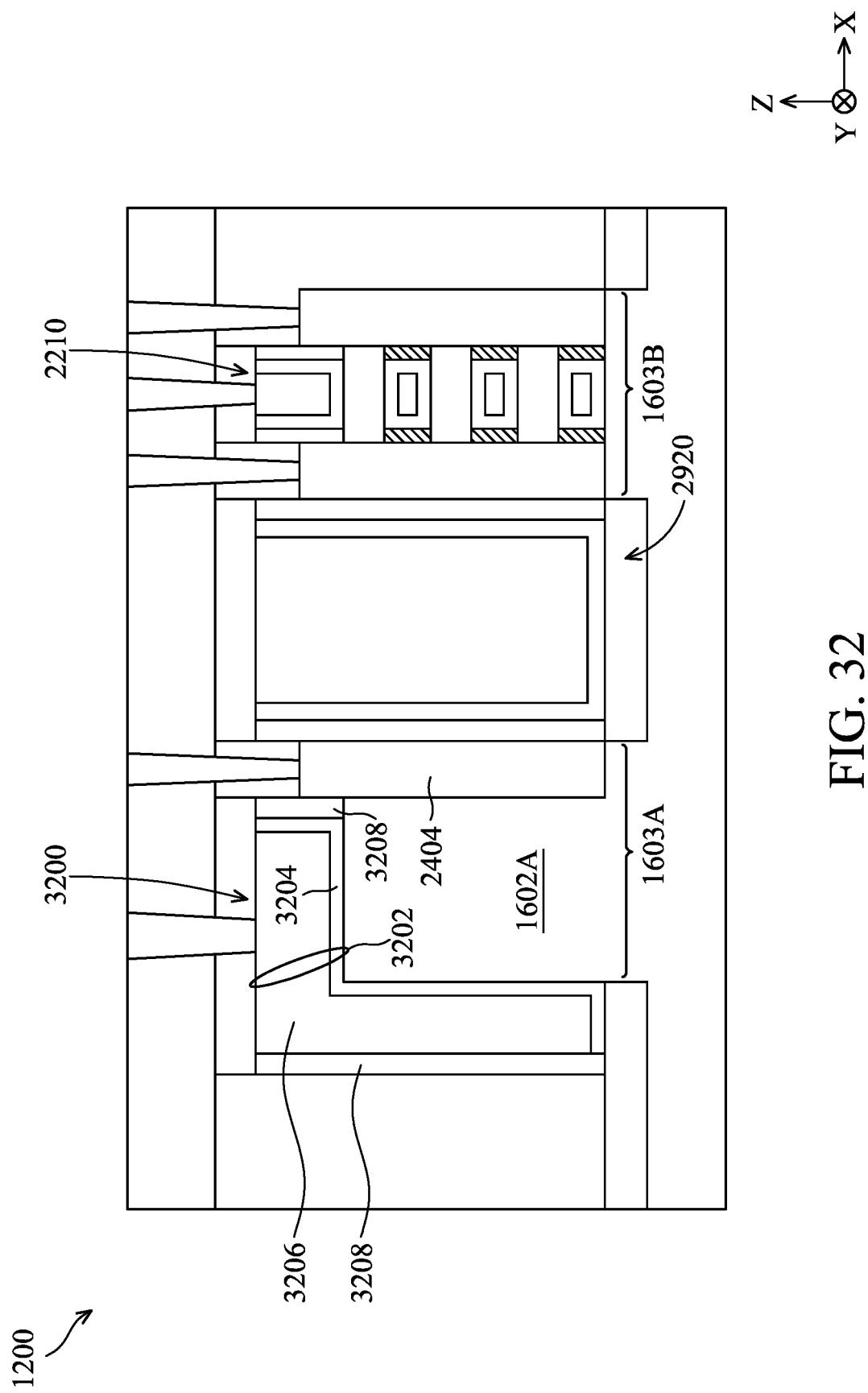
FIG. 32 illustrates a cross-sectional view of yet another embodiments of the memory device, made by the method of FIG. 18, in accordance with some embodiments.

FIG. 32 illustrates a cross-sectional view of another embodiment of the memory device 1200, which can be made based on the layout 800 of FIG. 8. Referring again to FIG. 8, the layout 800 includes the active feature 802A partially overlaid by the gate feature 504 (with respect to the layouts 500-700 of FIGS. 5-7), which results in forming a non-GAA transistor having only one source/drain structure (a MOS capacitor). For example in FIGS. 19A-C, after forming the active structure 1602A using the active feature 802A at operation 1110 of FIG. 11 (or operation 1712 of FIG. 17) and then forming the dummy gate structure 1902 using the gate feature 504 at operation 1802 of FIG. 18, the dummy gate structure 1902 can not only straddle the active structure 1602A but also extend along one of the sidewalls of the active structure 1602A along the X direction. The rest of the operations of the method 1800 of FIG. 18 can be used to form the memory device 1200, which includes one non-GAA transistor, formed as a MOS capacitor, and one GAA transistor.

As shown in FIG. 32, the memory device 1200 includes a non-GAA transistor 3200, formed as a MOS capacitor. The non-GAA transistor 3200 includes an active gate structure 3202, which replaces the dummy gate structure 1902 formed by the gate feature 504 as described above. The active gate structure 3202, including a gate dielectric 3204 and a gate metal 3206, not only straddles the active structure 1602A but also extend along one of the sidewalls of the active structure 1602A along the X direction. Respective sidewalls of the active gate structure 3202 (along the X direction) are also overlaid by a gate spacer 3208. As such, the non-GAA transistor 3200 may only include the source/drain structure 2404 formed along one of the sidewalls of the active structure 1602A (along the X direction) that is not overlaid by the active gate structure 3202.

In one aspect of the present disclosure, a memory device is disclosed. The memory device includes a first transistor formed in a first region of a substrate. The first transistor includes a structure protruding from the substrate, and a first source/drain (S/D) structure coupled to a first end of the protruding structure. The memory device includes a second transistor formed in a second region of the substrate. The second transistor includes a number of first semiconductor layers that are vertically spaced apart from one another, a second S/D structure coupled to a first end of the first semiconductor layers; and a third S/D structure coupled to a second end of the first semiconductor layers. The first region and the second region are laterally separated from each other by an isolation structure.

In another aspect of the present disclosure, a one-time-programmable (OTP) memory device is disclosed. The OTP memory device includes a programming transistor formed in a first region of a substrate. The OTP memory device includes a first reading transistor electrically coupled to the programming transistor in series and formed in a second region of the substrate. The first region is laterally separated from the second region by an isolation structure. The programming transistor includes a first gate structure straddling a structure protruding from the substrate, and the first reading transistor includes a second gate structure wrapping around each of a plurality of first nanostructures that are vertically spaced apart from one another.

In yet another aspect of the present disclosure, a method for fabricating a memory device is disclosed. The method includes defining a first active region and a second active region over a substrate. The first and second active regions are laterally spaced apart from each other by an isolation structure. The method includes forming a first transistor in the first active region. The first transistor includes a first channel formed of a structure protruding from the substrate, a first active gate structure straddling over the first channel, and at least a first source/drain structure coupled to one end of the first channel. The method includes forming a second transistor in the second active region. The second transistor includes a second channel collectively formed of one or more semiconductor layers disposed over the substrate, a second active gate structure wrapping around the second channel, a second source/drain structure coupled to one end of the second channel, and a third source/drain structure coupled to the other end of the second channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a first transistor formed in a first region of a substrate, the first transistor comprising:
        a structure protruding from the substrate;
        a first gate structure overlaying the protruding structure; and
        a first source/drain (S/D) structure coupled to a first end of the protruding structure; and
    a second transistor formed in a second region of the substrate, the second transistor comprising:
        a plurality of first semiconductor layers that are vertically spaced apart from one another;
        a second gate structure overlaying the plurality of first semiconductor layers, wherein the second gate structure and the first gate structure are in parallel with each other;
        a second S/D structure coupled to a first end of the plurality of first semiconductor layers; and
        a third S/D structure coupled to a second end of the plurality of first semiconductor layers,
    wherein the first region and the second region are laterally separated from each other by an isolation structure.

2. The memory device of claim 1, wherein the first transistor is configured as a programming transistor of an anti-fuse memory cell, and the second transistor is configured as a reading transistor of the anti-fuse memory cell.

3. The memory device of claim 1, wherein the first transistor is electrically coupled to the second transistor in series via an interconnecting structure that is disposed above the substrate and connects the first S/D structure to at least one of the second S/D structure or the third S/D structure.

4. The memory device of claim 1, wherein the first gate structure straddles a central portion of the protruding structure, and the second gate structure includes a plurality of all-around gate stacks operatively associated with the plurality of first semiconductor layers.

5. The memory device of claim 4, wherein the first transistor includes a fourth S/D structure coupled to a second end of the protruding structure, and wherein the fourth S/D structure is laterally disposed farther away from the isolation structure than the first S/D structure.

6. The memory device of claim 1, wherein the first transistor includes a fin-based transistor, and the second transistor includes a gate-all-around transistor.

7. The memory device of claim 1, further comprising at least one dummy gate structure disposed between the first region and the second region.

8. The memory device of claim 1, further comprising a third transistor formed in the second region of the substrate, the third transistor comprising:
    a plurality of second semiconductor layers that are vertically spaced apart from one another, the third S/D structure coupled to a first end of the plurality of second semiconductor layers; and
    a fifth S/D structure electrically coupled to a second end of the plurality of second semiconductor layers.

9. The memory device of claim 8, wherein the first transistor is configured as a programming transistor of an anti-fuse memory cell, the second transistor is configured as a first reading transistor of the anti-fuse memory cell, and the third transistor is configured as a second reading transistor of the anti-fuse memory cell.

10. The memory device of claim 1, wherein the first S/D structure has a first vertical height, and the second S/D structure and third S/D structure have a second vertical height, the second vertical height being greater than the first vertical height.

11. A semiconductor device, comprising:
    a substrate including a first region and a second region laterally separated from each other by an isolation structure;
    the first region comprising:
        a structure protruding from the substrate;

a first gate structure overlaying the protruding structure; and a first source/drain (S/D) structure connected to a first end of the protruding structure; and the second region comprising:
- a plurality of first semiconductor layers that are vertically spaced apart from one another;
- a second gate structure overlaying the plurality of first semiconductor layers, wherein the second gate structure is laterally spaced apart from the first gate structure;
- a second S/D structure connected to a first end of the plurality of first semiconductor layers; and
- a third S/D structure connected to a second end of the plurality of first semiconductor layers, wherein the first, second, and third S/D structures have a same conductive type.

12. The semiconductor device of claim 11, further comprising an interconnecting structure connecting the first S/D structure to at least one of the second S/D structure or the third S/D structure.

13. The semiconductor device of claim 11, wherein the first gate structure straddles a central portion of the protruding structure, and the second gate structure includes a plurality of all-around gate stacks wrapping around a corresponding one of the plurality of first semiconductor layers.

14. The semiconductor device of claim 11, further comprising a fourth S/D structure connected to a second, opposite end of the protruding structure, and wherein the first S/D structure is laterally disposed between the first gate structure and the second gate structure.

15. The semiconductor device of claim 11, further comprising at least one dummy gate structure laterally disposed between the first gate structure and the second gate structure.

16. The semiconductor device of claim 11, wherein the first S/D structure has a first vertical height, and the second S/D structure and third S/D structure have a second vertical height, the second vertical height being greater than the first vertical height.

17. The semiconductor device of claim 11, further comprising:
- a plurality of second semiconductor layers that are vertically spaced apart from one another, the third S/D structure connected to a first end of the plurality of second semiconductor layers; and
- a fifth S/D structure connected to a second end of the plurality of second semiconductor layers.

18. A semiconductor device, comprising:
a substrate including a first region and a second region laterally separated from each other by an isolation structure;

the first region comprising:
- a structure protruding from the substrate;
- a first gate structure overlaying the protruding structure; and
- a first source/drain (S/D) structure connected to a first end of the protruding structure; and the second region comprising:
- a plurality of first semiconductor layers that are vertically spaced apart from one another;
- a second gate structure overlaying the plurality of first semiconductor layers, wherein the second gate structure is laterally spaced apart from the first gate structure;
- a second S/D structure connected to a first end of the plurality of first semiconductor layers; and
- a third S/D structure connected to a second end of the plurality of first semiconductor layers, wherein the first to third S/D structures have a same conductive type;

wherein the semiconductor device further comprises an interconnecting structure connecting the first S/D structure to at least one of the second S/D structure or the third S/D structure.

19. The semiconductor device of claim 18, further comprising a fourth S/D structure connected to a second, opposite end of the protruding structure, and wherein the first S/D structure is laterally disposed between the first gate structure and the second gate structure.

20. The semiconductor device of claim 18, further comprising:
- a plurality of second semiconductor layers that are vertically spaced apart from one another, the third S/D structure connected to a first end of the plurality of second semiconductor layers; and
- a fifth S/D structure connected to a second end of the plurality of second semiconductor layers.

* * * * *